US012052879B2

(12) United States Patent
Yoshizumi et al.

(10) Patent No.: US 12,052,879 B2
(45) Date of Patent: Jul. 30, 2024

(54) DISPLAY DEVICE INCLUDING LIGHT-EMITTING AND LIGHT-RECEIVING ELEMENT

(71) Applicant: Semiconductor Energy Laboratory Co., Ltd., Atsugi (JP)

(72) Inventors: Kensuke Yoshizumi, Atsugi (JP); Susumu Kawashima, Atsugi (JP); Koji Kusunoki, Isehara (JP); Kazunori Watanabe, Machida (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/919,554

(22) PCT Filed: Apr. 27, 2021

(86) PCT No.: PCT/IB2021/053432
§ 371 (c)(1),
(2) Date: Oct. 18, 2022

(87) PCT Pub. No.: WO2021/220141
PCT Pub. Date: Nov. 4, 2021

(65) Prior Publication Data
US 2023/0232645 A1     Jul. 20, 2023

(30) Foreign Application Priority Data

May 1, 2020    (JP) .................. 2020-080939

(51) Int. Cl.
*H10K 39/34*    (2023.01)
*G06F 3/041*    (2006.01)
(Continued)

(52) U.S. Cl.
CPC .......... *H10K 39/34* (2023.02); *G09G 3/3233* (2013.01); *H10K 59/131* (2023.02);
(Continued)

(58) Field of Classification Search
None
See application file for complete search history.

(56) References Cited

U.S. PATENT DOCUMENTS

| | | | |
|---|---|---|---|
| 6,559,433 | B1 | 5/2003 | Ozawa |
| 6,852,965 | B2 | 2/2005 | Ozawa |

(Continued)

FOREIGN PATENT DOCUMENTS

| | | | |
|---|---|---|---|
| CN | 108109582 | A | 6/2018 |
| EP | 0942583 | A | 9/1999 |

(Continued)

OTHER PUBLICATIONS

International Search Report (Application No. PCT/IB2021/053432) Dated Jul. 13, 2021.

(Continued)

*Primary Examiner* — Amare Mengistu
*Assistant Examiner* — Sarvesh J Nadkarni
(74) *Attorney, Agent, or Firm* — Eric J. Robinson; Robinson Intellectual Property Law Office, P.C.

(57) ABSTRACT

A display device with an imaging function is provided. A high-resolution imaging device or display device is provided. The display device includes first to third switches, first and second transistors, a capacitor, and first and second wirings, and a light-emitting and light-receiving element. One electrode of the first switch is electrically connected to the first wiring, and the other electrode is electrically connected to a gate of the first transistor and one electrode of the capacitor. One electrode of the second switch is electrically connected to one of a source and a drain of the first transistor, one electrode of the light-emitting and light-receiving element, and the other electrode of the capacitor, and the other electrode of the second switch is electrically connected to a gate of the second transistor and one elec- (Continued)

trode of the third switch. The other electrode of the third switch is electrically connected to the second wiring. The light-emitting and light-receiving element has a function of emitting light of a first color and a function of receiving light of a second color.

13 Claims, 32 Drawing Sheets

(51) Int. Cl.
*G06F 3/042* (2006.01)
*G06V 40/13* (2022.01)
*G09G 3/3233* (2016.01)
*H10K 59/131* (2023.01)
*H10K 59/35* (2023.01)

(52) U.S. Cl.
CPC ......... *H10K 59/353* (2023.02); *G06F 3/0412* (2013.01); *G06F 3/0421* (2013.01); *G06V 40/1318* (2022.01); *G09G 2300/0465* (2013.01); *G09G 2300/0819* (2013.01); *G09G 2300/0852* (2013.01); *G09G 2300/0861* (2013.01); *G09G 2354/00* (2013.01); *G09G 2360/14* (2013.01)

(56) References Cited

U.S. PATENT DOCUMENTS

| | | | |
|---|---|---|---|
| 7,595,775 | B2 | 9/2009 | Osame et al. |
| 7,969,390 | B2 | 6/2011 | Yoshida |
| 8,519,628 | B2 | 8/2013 | Fukumoto et al. |
| 8,633,872 | B2 | 1/2014 | Osame |
| 8,988,400 | B2 | 3/2015 | Shishido |
| 9,088,006 | B2 | 7/2015 | Yamazaki et al. |
| 9,666,655 | B2 | 5/2017 | Miyake |
| 10,007,161 | B2 | 6/2018 | Miyake |
| 10,483,293 | B2 | 11/2019 | Miyake |
| 10,490,130 | B2 | 11/2019 | Okamoto |
| 10,585,506 | B2* | 3/2020 | Shima ................ H01L 27/1225 |
| 11,217,173 | B2 | 1/2022 | Okamoto |
| 11,263,937 | B2 | 3/2022 | Wang et al. |
| 2003/0178551 | A1 | 9/2003 | Ozawa |
| 2005/0179626 | A1* | 8/2005 | Yuki ..................... G09G 3/3233 |
| | | | 345/76 |
| 2005/0264227 | A1 | 12/2005 | Tateuchi |
| 2014/0055042 | A1 | 2/2014 | Tateuchi |
| 2015/0221706 | A1* | 8/2015 | Udaka ................... H10K 39/32 |
| | | | 257/40 |
| 2018/0151656 | A1 | 5/2018 | Choo et al. |
| 2018/0233089 | A1 | 8/2018 | Okamoto |
| 2020/0098315 | A1* | 3/2020 | Lim ....................... G06F 3/0412 |
| 2020/0185429 | A1 | 6/2020 | Kimura |
| 2021/0358419 | A1 | 11/2021 | Inoue et al. |
| 2022/0336570 | A1 | 10/2022 | Nakagawa et al. |
| 2023/0075463 | A1* | 3/2023 | Lee ....................... G09G 3/3233 |

FOREIGN PATENT DOCUMENTS

| | | |
|---|---|---|
| EP | 1351484 A | 10/2003 |
| JP | 11-075115 A | 3/1999 |
| JP | 2005-148285 A | 6/2005 |
| JP | 2005-338428 A | 12/2005 |
| JP | 2008-262569 A | 10/2008 |
| JP | 2014-197522 A | 10/2014 |
| KR | 2006-0002020 A | 1/2006 |
| KR | 2018-0059634 A | 6/2018 |
| TW | 417076 | 1/2001 |
| WO | WO-1999/012339 | 3/1999 |
| WO | WO-2021/130581 | 7/2021 |
| WO | WO-2021/229350 | 11/2021 |

OTHER PUBLICATIONS

Written Opinion (Application No. PCT/IB2021/053432) Dated Jul. 13, 2021.

* cited by examiner

Data writing period

Holding and light-emitting period

Reset period

Light exposure period

Transfer period

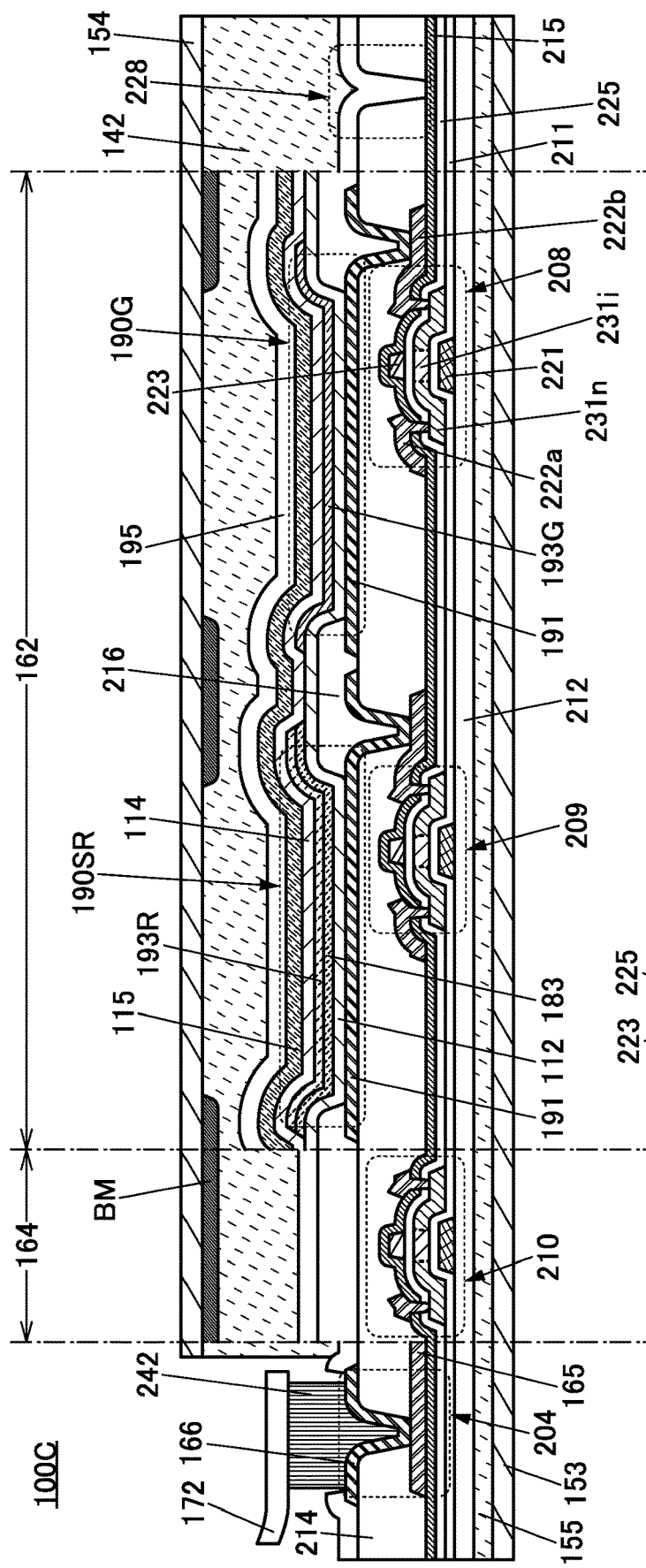
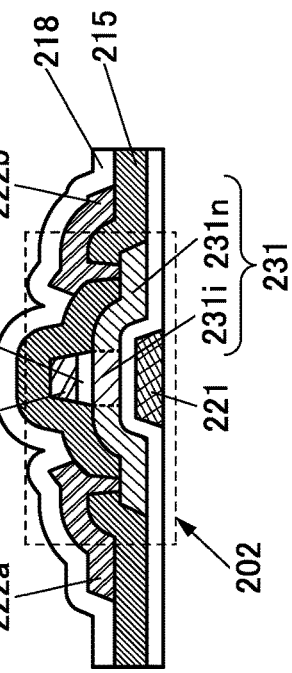
FIG. 29A
FIG. 29B

DISPLAY DEVICE INCLUDING LIGHT-EMITTING AND LIGHT-RECEIVING ELEMENT

TECHNICAL FIELD

One embodiment of the present invention relates to a display device. One embodiment of the present invention relates to a display device with an imaging function.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, display devices have been required to have higher resolution in order to display high-definition images. In addition, display devices used in information terminal devices such as smartphones, tablet terminals, and laptop PCs (personal computers) have been required to have lower power consumption as well as higher resolution. Furthermore, display devices have been required to have a variety of functions such as a touch panel function and a function of capturing images of fingerprints for authentication in addition to a function of displaying images.

Light-emitting apparatuses including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current constant voltage source, and have been used in display devices. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device with an imaging function. An object of one embodiment of the present invention is to provide an imaging device or a display device that includes a high-resolution display portion or imaging portion. An object of one embodiment of the present invention is to provide an imaging device or a display device that is capable of forming a high-resolution image by imaging. An object of one embodiment of the present invention is to provide an imaging device or a display device that is capable of imaging with high sensitivity. An object of one embodiment of the present invention is to provide a display device capable of obtaining biological information such as fingerprints. An object of one embodiment of the present invention is to provide a display device that functions as a touch panel.

An object of one embodiment of the present invention is to reduce the number of components of an electronic device. An object of one embodiment of the present invention is to provide a display device, an imaging device, an electronic device, or the like that has a novel structure. An object of one embodiment of the present invention is to reduce at least one of problems of the conventional technique.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display device including first to third switches, a first transistor, a second transistor, a capacitor, a first wiring, a second wiring and a light-emitting and light-receiving element. One electrode of the first switch is electrically connected to the first wiring, and the other electrode of the first switch is electrically connected to a gate of the first transistor and one electrode of the capacitor. One electrode of the second switch is electrically connected to one of a source and a drain of the first transistor, one electrode of the light-emitting and light-receiving element, and the other electrode of the capacitor, and the other electrode of the second switch is electrically connected to a gate of the second transistor and one electrode of the third switch. The other electrode of the third switch is electrically connected to the second wiring. The light-emitting and light-receiving element has a function of emitting light of a first color and a function of receiving light of a second color.

In the above, in a first period, it is preferable that the first switch, the second switch, and the third switch be in a conduction state, a data potential be supplied to the first wiring, and a first potential be supplied to the second wiring. In addition, in a second period, it is preferable that the second switch and the third switch be in a conduction state, and a second potential be supplied to the second wiring. Moreover, it is preferable that the second potential be lower than the first potential.

In addition, in the above, a fourth switch is preferably further included. In this case, one electrode of the fourth switch is preferably electrically connected to the one electrode of the second switch, and the other electrode of the fourth switch is preferably electrically connected to the one electrode of the light-emitting and light-receiving element. Alternatively, one electrode of the fourth switch is preferably electrically connected to the one of the source and the drain of the first transistor, and the other electrode of the fourth switch is preferably electrically connected to the one electrode of the light-emitting and light-receiving element.

Another embodiment of the present invention is a display device including first to sixth transistors, a capacitor, a light-emitting and light-receiving element, a first wiring, and a second wiring. One of a source and a drain of the first transistor is electrically connected to one electrode of the light-emitting and light-receiving element. One of a source and a drain of the third transistor is electrically connected to the first wiring, and the other of the source and the drain of the third transistor is electrically connected to a gate of the first transistor. One of a source and a drain of the fourth transistor is electrically connected to a gate of the second transistor, and the other of the source and the drain of the fourth transistor is electrically connected to the second wiring. One of a source and a drain of the fifth transistor is electrically connected to one of a source and a drain of the second transistor. One of a source and a drain of the sixth transistor is electrically connected to the one electrode of the light-emitting and light-receiving element, and the other of the source and the drain of the sixth transistor is electrically connected to the gate of the second transistor. One electrode of the capacitor is electrically connected to the gate of the first transistor, and the other electrode of the capacitor is electrically connected to the one of the source and the drain of the first transistor. The light-emitting and light-receiving element has a function of emitting light of a first color and a function of receiving light of a second color.

Furthermore, in the above, a seventh transistor is preferably further included. In this case, the seventh transistor preferably has a function of controlling conduction between the one of the source and the drain of the first transistor and the one electrode of the light-emitting and light-receiving element.

Another embodiment of the present invention is a display device including first to fifth transistors, an eighth transistor, a capacitor, a light-emitting and light-receiving element, a first wiring, and a second wiring. One of a source and a drain of the first transistor is electrically connected to one of a source and a drain of the eighth transistor and a gate of the second transistor. One of a source and a drain of the third transistor is electrically connected to the first wiring, and the other of the source and the drain of the third transistor is electrically connected to a gate of the first transistor. One of a source and a drain of the fourth transistor is electrically connected to the gate of the second transistor, and the other of the source and the drain of the fourth transistor is electrically connected to the second wiring. One of a source and a drain of the fifth transistor is electrically connected to one of a source and a drain of the second transistor. The other of the source and the drain of the eighth transistor is electrically connected to one electrode of the light-emitting and light-receiving element. One electrode of the capacitor is electrically connected to the gate of the first transistor, and the other electrode of the capacitor is electrically connected to the one of the source and the drain of the first transistor. Moreover, the light-emitting and light-receiving element has a function of emitting light of a first color and a function of receiving light of a second color.

Furthermore, it is preferable that in any of the above embodiments, a third wiring be further included. In this case, it is preferable that the other of the source and the drain of the fifth transistor be electrically connected to the third wiring.

Alternatively, in any of the above embodiments, it is preferable that the other of the source and the drain of the fifth transistor be electrically connected to the first wiring.

In any of the above embodiments, it is preferable that in a first period, a data potential be supplied to the first wiring, and a first potential be supplied to the second wiring. In a second period, it is preferable that a second potential be supplied to the second wiring. In this case, it is preferable that the second potential be lower than the first potential.

In addition, in any of the above embodiments, a light-emitting element is preferably further included. In this case, the light-emitting element preferably has a function of emitting light of the second color. Moreover, the light-emitting and light-receiving element and the light-emitting element are preferably provided on the same plane.

In the above embodiment, it is preferable that the light-emitting and light-receiving element include a first pixel electrode, a first light-emitting layer, an active layer, and a first electrode, and the light-emitting element include a second pixel electrode, a second light-emitting layer, and the first electrode. It is preferable that the first pixel electrode and the second pixel electrode be formed by processing the same conductive film.

Another embodiment of the present invention is a display module including any of the above-described display devices, and a connector or an integrated circuit.

Another embodiment of the present invention is an electronic device including the above-described display module and at least one of an antenna, a battery, a housing, a camera, a speaker, a microphone, a touch sensor, and an operation button.

Effect of the Invention

According to one embodiment of the present invention, a display device with an imaging function can be provided. An imaging device or a display device that includes a high-resolution display portion or imaging portion can be provided. An imaging device or a display device that is capable of forming a high-resolution image by imaging can be provided. An imaging device or a display device that is capable of imaging with high sensitivity can be provided. A display device that is capable of obtaining biological information such as fingerprints can be provided. A display device that functions as a touch panel can be provided.

According to one embodiment of the present invention, the number of components of an electronic device can be reduced. A display device, an imaging device, an electronic device, or the like that has a novel structure can be provided. Alternatively, at least one of problems of the conventional technique can at least be reduced.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 29A is a cross-sectional view showing an example of a display device. FIG. 29B is a cross-sectional view showing an example of a transistor.

MODE FOR CARRYING OUT THE INVENTION

Figure 1:
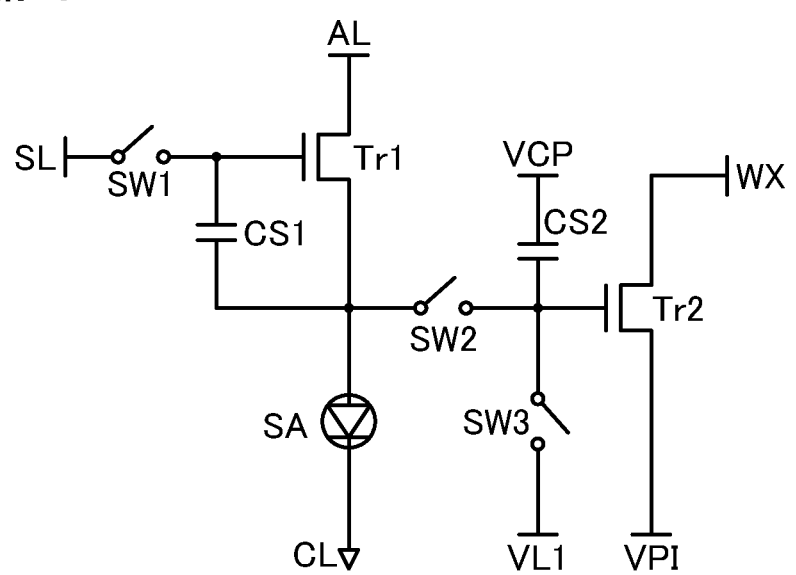
FIG. 1 is a circuit diagram showing an example of a pixel.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. A transistor in this specification includes, in its category, an IGFET (Insulated Gate Field Effect Transistor) and a thin film transistor (TFT).

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, or other elements with a variety of functions as well as an electrode and a wiring.

Note that in this specification and the like, a node is an element (e.g., a wiring) that enables electrical connection between elements included in a circuit. Thus, a "node to which A is connected" is a wiring that is electrically connected to A and can be regarded as having the same potential as A. Note that even when one or more elements which enable electrical connection (e.g., switches, transistors, capacitors, inductors, resistors, or diodes) are inserted in a portion of the wire, the wire can be regarded as the "node to which A is connected" as long as it can be regarded as having the same potential as A.

Note that in this specification, an EL layer means a layer containing at least a light-emitting substance (also referred to as a light-emitting layer) or a stacked body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor that senses the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector, an IC, and the like are mounted is referred to as a touch panel module, a display module, or simply a touch panel or the like in some cases.

Embodiment 1

Described in this embodiment are structure examples of a display device of one embodiment of the present invention and examples of a driving method thereof.

One embodiment of the present invention is a display device including a plurality of pixels arranged in a matrix. The pixel includes one or more subpixels. The subpixel includes one or more light-emitting and light-receiving elements.

A light-emitting and light-receiving element (a light-emitting and light-receiving device) is an element having a function of a light-emitting element (also referred to as a light-emitting device) that emits light of a first color, and a function of a photoelectric conversion element (also referred to as a photoelectric conversion device) that receives light of a second color. The light-emitting and light-receiving element can also be referred to as a multifunctional element, a multifunctional diode, a light-emitting photodiode, a bidirectional photodiode, or the like.

The plurality of subpixels including light-emitting and light-receiving elements are arranged in a matrix, whereby the display device can have a function of displaying images and a function of capturing images. Thus, the display device can also be referred to as a complex device or a multifunctional device.

Structure Example 1

Structure Example 1-1

FIG. 1 illustrates part of a pixel circuit that can be used for the subpixel including a light-emitting and light-receiving element. The pixel circuit includes a switch SW1, a switch SW2, a switch SW3, a transistor Tr1, a transistor Tr2, and a light-emitting and light-receiving element SA. Moreover, the pixel circuit preferably includes a capacitor CS1 and a capacitor CS2 as capacitors for holding electric charge. The pixel circuit is connected to a wiring SL, a wiring VL1, a wiring AL, a wiring CL, a wiring VCP, a wiring VPI, and a wiring WX.

The switch SW1, the switch SW2, and the switch SW3 are each an element that has two terminals (electrodes) and can control a conduction or non-conduction between the terminals.

One of the terminals of the switch SW1 is electrically connected to the wiring SL, and the other terminal of the switch SW1 is electrically connected to a gate of the transistor Tr1 and one electrode of the capacitor CS1. One of a source and a drain of the transistor Tr1 is electrically connected to the wiring AL, and the other of the source and the drain of the transistor Tr1 is electrically connected to one of the terminals of the switch SW2, one electrode of the light-emitting and light-receiving element SA, and the other electrode of the capacitor CS1. The other terminal of the switch SW2 is electrically connected to a gate of the transistor Tr2, one of the terminals of the switch SW3, and one electrode of the capacitor CS2. The other terminal of the switch SW3 is electrically connected to the wiring VL1. The other electrode of the capacitor CS2 is electrically connected to the wiring VCP. One of a source and a drain of the transistor Tr2 is electrically connected to the wiring WX, and the other of the source and the drain of the transistor Tr2 is electrically connected to the wiring VPI. The other electrode of the light-emitting and light-receiving element SA is electrically connected to the wiring CL.

A constant potential is preferably supplied to the wiring VCP and the wiring VPI. As the constant potential, a potential VDD, a potential VSS, a ground potential, a reference potential, a common potential, or the like can be used.

In FIG. 1, the anode of the light-emitting and light-receiving element SA is positioned on the transistor Tr1 side. In this case, a potential supplied to the wiring CL can be lower than a potential supplied to the wiring AL. Note that the cathode of the light-emitting and light-receiving element SA may be positioned on the transistor Tr1 side; in that case, the wiring CL can be supplied with a potential higher than a potential supplied to the wiring AL.

Although an example in which n-channel transistors are used as the transistors is shown in FIG. 1 and the like, some or all of the transistors can be p-channel transistors. In that case, a variety of potentials, signals, or the like can be changed as appropriate in accordance with the type of the transistors.

The transistor Tr1 has a function of controlling current flowing through the light-emitting and light-receiving element SA. In other words, the transistor Tr1 functions as a driving transistor. The transistor Tr1 can control current flowing through the light-emitting and light-receiving element SA in accordance with a potential (data potential) supplied from the wiring SL through the switch SW1. The light-emitting and light-receiving element SA can emit light with luminance corresponding to the current.

The conduction state of the transistor Tr2 is changed in accordance with electric charge (potential) which is transferred from the light-emitting and light-receiving element SA to a node to which the gate is connected. The transistor Tr2 functions as a reading transistor. The wiring WX functions as a read line.

At least two kinds of potentials are supplied to the wiring VL1. One is a potential $V_O$, which is supplied to the source of the transistor Tr1 when a data potential is written to the gate of the transistor Tr1. The other is a potential $V_{RS}$ for resetting (initializing) the potential of a node to which the anode of the light-emitting and light-receiving element SA is connected. By supplying two kinds of potentials to one wiring VL1 in this manner, the number of wirings can be reduced and the circuit structure can be simplified. Accordingly, the area occupied by the pixel can be reduced, achieving a display device with high resolution. Thus, not only an image with high display quality can be displayed, but also a high-resolution image can be captured.

A method for operating the pixel circuit illustrated as an example in FIG. 1 will be described below.

First, an example of an operation method in the case where the light-emitting and light-receiving element SA is used as a light-emitting element is described with reference to FIG. 2A and FIG. 2B.

Figure 2A:
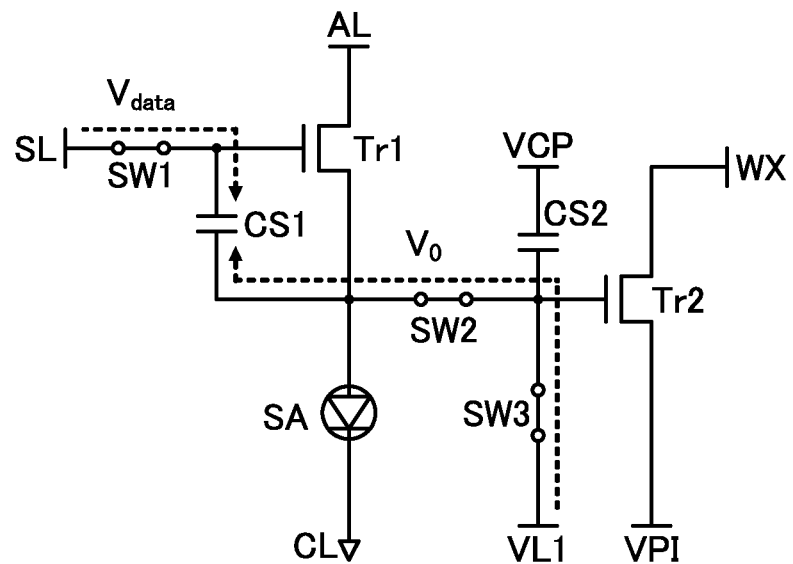
FIG. 2A and FIG. 2B are diagrams showing an example of a method for operating a pixel circuit.

FIG. 2A schematically illustrates an operation in a period during which a data potential $V_{data}$ is written to the gate of the transistor Tr1 (a data writing period). In the data writing period, the switch SW1, the switch SW2, and the switch SW3 are all turned on.

In the data writing period, as indicated by one dashed arrow, the data potential $V_{data}$ is supplied from the wiring SL to the gate of the transistor Tr1 through the switch SW1. As indicated by the other dashed arrow, the potential $V_O$ is supplied from the wiring VL1 to the other of the source and the drain of the transistor Tr1 through the switch SW2 and the switch SW3. At this time, a potential difference between the data potential $V_{data}$ and the potential $V_0$ is charged to the capacitor CS1.

Figure 2B:
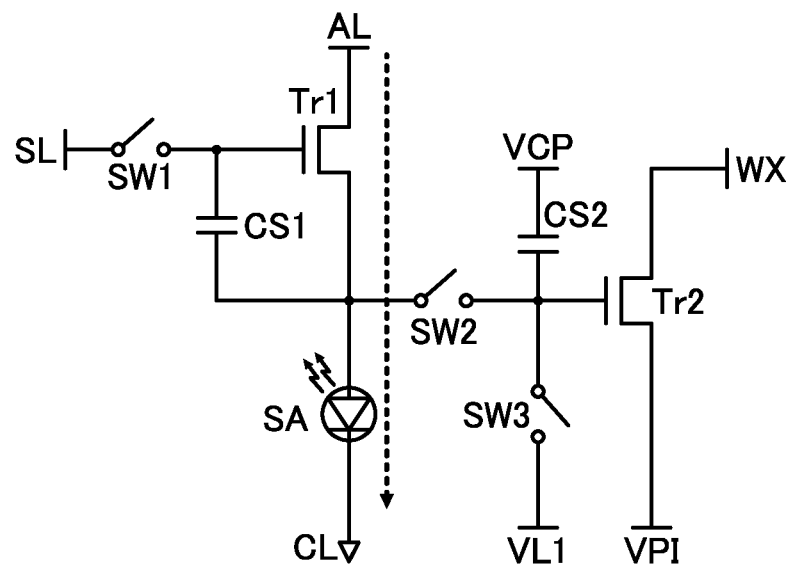

FIG. 2B schematically illustrates an operation in a period during which the gate potential of the transistor Tr1 is held and the light-emitting and light-receiving element SA emits light in accordance with the current flowing through the transistor Tr1 (a holding and light-emitting period). In the holding and light-emitting period, the switch SW1, the switch SW2, and the switch SW3 are all turned off. Accordingly, almost all of the current flowing through the transistor Tr1 flows into the light-emitting and light-receiving element SA. In FIG. 2B, the path of current is indicated by a dashed arrow.

Next, an example of an operation method in the case where the light-emitting and light-receiving element SA is used as a light-receiving element is described with reference to FIG. 3A to FIG. 3C.

Figure 3A:
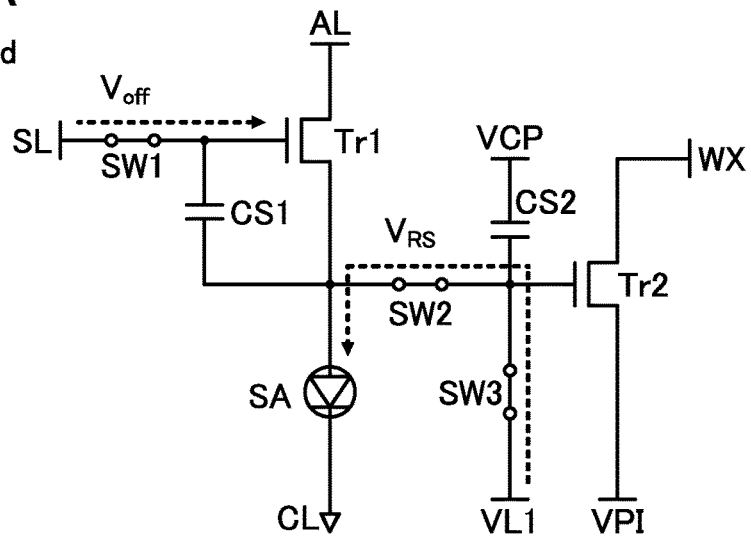
FIG. 3A to FIG. 3C are diagrams showing an example of a method for operating a pixel circuit.

FIG. 3A schematically illustrates an operation in a period during which the potential of the anode of the light-emitting and light-receiving element SA is initialized (a reset period). In the reset period, the switch SW1, the switch SW2, and the switch SW3 are all turned on.

In the reset period, as indicated by one dashed arrow, the potential $V_{RS}$ is supplied from the wiring VL1 to the anode of the light-emitting and light-receiving element SA through the switch SW3 and the switch SW2. The potential $V_{RS}$ is at least lower than a potential supplied to the wiring CL. The potential $V_{RS}$ is preferably set lower than the potential $V_0$.

Note that in the case where the cathode of the light-emitting and light-receiving element SA is connected to the transistor Tr1 side, the potential $V_{RS}$ may be higher than a potential supplied to the wiring CL (a potential supplied to the anode of the light-emitting and light-receiving element SA). The potential $V_{RS}$ can be higher than the potential $V_0$.

In the reset period, a potential $V_{off}$ is supplied from the wiring SL to the gate of the transistor Tr1 through the switch SW1. The potential $V_{off}$ brings the transistor Tr1 into a non-conduction state. This prevents the potential of the anode of the light-emitting and light-receiving element SA from unintentionally changing due to the current flowing from the wiring AL to the light-emitting and light-receiving element SA through the transistor Tr1, during the subsequent period. For example, the potential $V_{off}$ can be lower than a potential that is the sum of the potential $V_{RS}$ and the threshold voltage of the transistor Tr1. It is particularly preferable that the potential $V_{off}$ be lower than the potential $V_{RS}$.

Figure 3B:
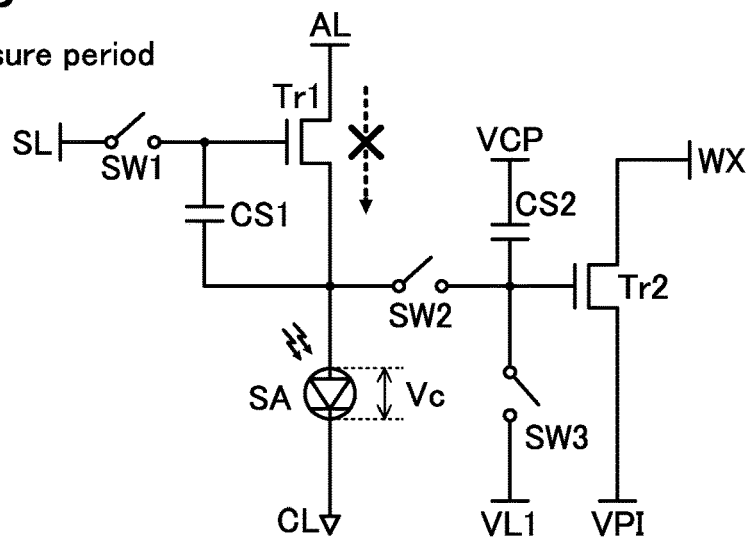

FIG. 3B schematically illustrates an operation in a period during which the light-emitting and light-receiving element SA receives light and electric charge is accumulated in the light-emitting and light-receiving element (a light exposure period). Electric charge is accumulated at both ends of the light-emitting and light-receiving element SA in the light exposure period, whereby a potential difference Vc between the anode and the cathode of the light-emitting and light-receiving element SA is changed.

In the light exposure period, all of the switch SW1, the switch SW2, and the switch SW3 are brought into a non-conduction state. At this time, the potential $V_{off}$ supplied in the reset period is held in the gate of the transistor Tr1; thus, as illustrated in FIG. 3B, current does not flow through the transistor Tr1. Consequently, the electric charge accumulated on the anode side of the light-emitting and light-receiving element SA can be prevented from flowing toward the transistor Tr1 and the transistor Tr2. As a result, imaging can be performed with high accuracy.

Figure 3C:
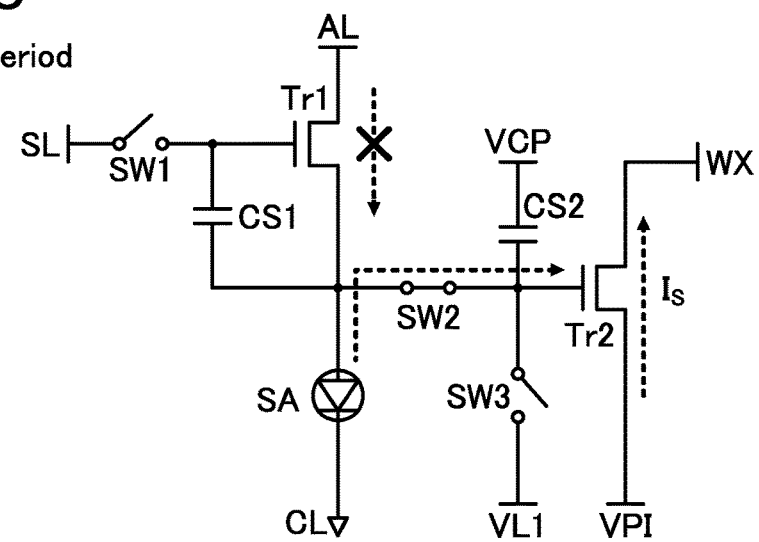

FIG. 3C schematically illustrates an operation in a period during which the electric charge accumulated in the light-emitting and light-receiving element SA is transferred to the node to which the gate of the transistor Tr2 is connected (a transfer period). In the transfer period, the switch SW2 is turned on, and the switch SW1 and the switch SW3 are turned off. Accordingly, as indicated by the dashed arrow, the electric charge accumulated in the light-emitting and light-receiving element SA is transferred through the switch SW2 to the node to which the gate of the transistor Tr2 is connected. By turning off the switch SW2 after transfer of the electric charge is completed, the potential of the gate of the transistor Tr2 is held. At this time, current Is corresponding to the gate potential of the transistor Tr2 flows from the wiring VPI to the wiring WX.

As described above, by switching potentials supplied to the wiring VL1 between the data writing period for display and the reset period for imaging, the number of wirings can be reduced, so that the pixel circuit can be simplified. Thus, a high-resolution and high-definition display device can be easily achieved. Furthermore, the reduction in the number of wirings makes it possible to reduce the power consumption of the display device.

Structure Example 1-2

Figure 4A:
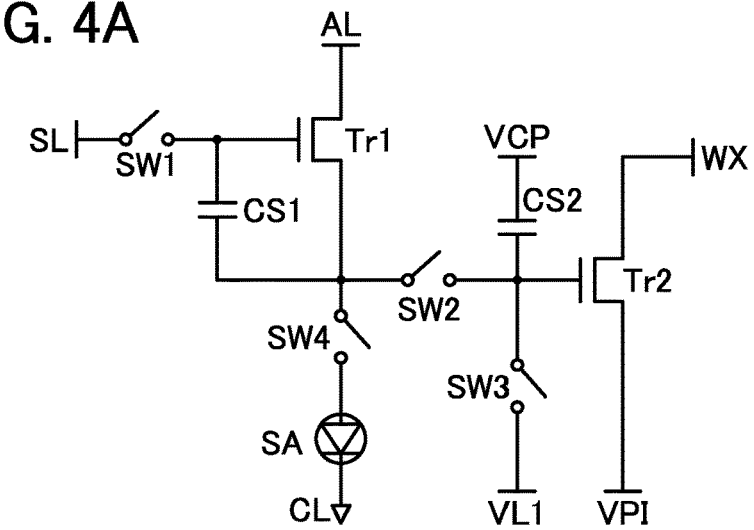
FIG. 4A to FIG. 4C are circuit diagrams each showing an example of a pixel circuit.

FIG. 4A illustrates a structure example of a pixel circuit different from that in FIG. 1. FIG. 4A is different from the above structure mainly in including a switch SW4.

The switch SW4 is provided between the light-emitting and light-receiving element SA and the transistor Tr1 and can control the conduction and non-conduction therebetween. In FIG. 4A, one terminal (electrode) of the switch SW4 is electrically connected to the other of the source and the drain of the transistor Tr1, one terminal of the switch SW2, and the other electrode of the capacitor CS1.

By turning off the switch SW4, the light-emitting and light-receiving element SA and the transistor Tr1 can be electrically insulated from each other. Therefore, current flowing to the light-emitting and light-receiving element SA through the transistor Tr1 can be interrupted regardless of the gate potential of the transistor Tr1. Thus, the potential $V_{off}$ is not necessarily supplied to the gate of the transistor Tr1 in the reset period or the like described above as an example, so that the driving method can be simplified.

Figure 4B:
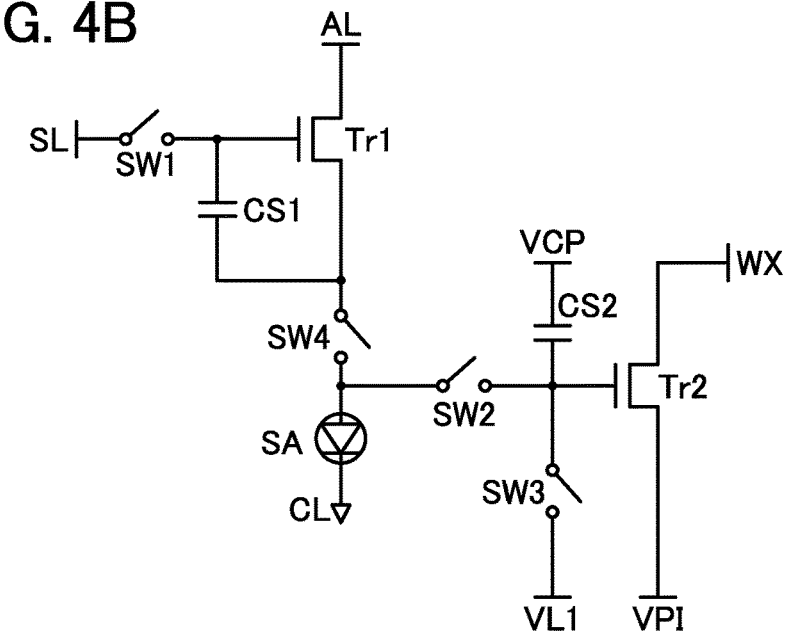

The switch SW4 may be provided in the position illustrated in FIG. 4B. Specifically, the one terminal of the switch SW2 is electrically connected between the light-emitting and light-receiving element SA and the switch SW4.

In this case, in the light exposure period and the transfer period, the data potential can be held at the gate of the transistor Tr1. Accordingly, by switching the switch SW4 from the non-conduction state to the conduction state and switching the switch SW2 from the conduction state to the non-conduction state after the transfer period ends, the light-emitting and light-receiving element SA can be made to emit light immediately without additional data writing. Thus, the data writing period is not necessary until an image is displayed after the transfer period ends, so that a period during which an image is not displayed (a non-display period) can be shortened and degradation of display quality can be prevented.

Figure 4C:
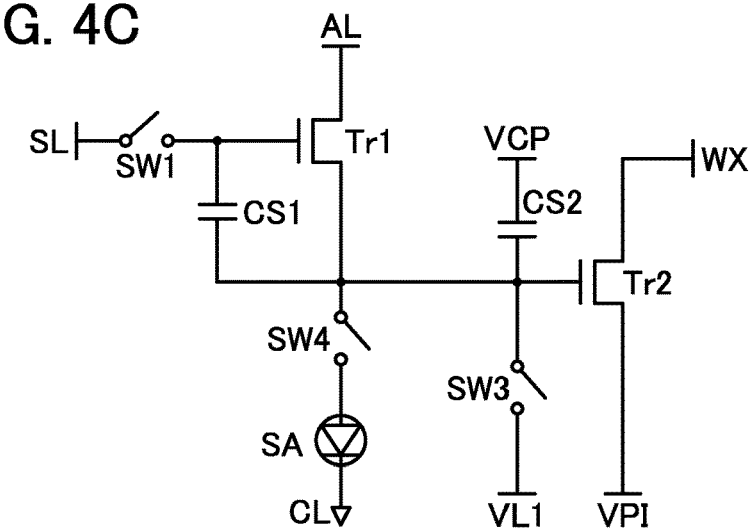

FIG. 4C illustrates an example in which the switch SW2 provided in the structure in FIG. 4A is not provided. When the switch SW4 also functions as the switch SW2, the pixel circuit can be simplified.

Structure Example 2

Structure Example 2-1 of Display Device

More specific structure examples of the display device of one embodiment of the present invention will be described below.

Figure 5:
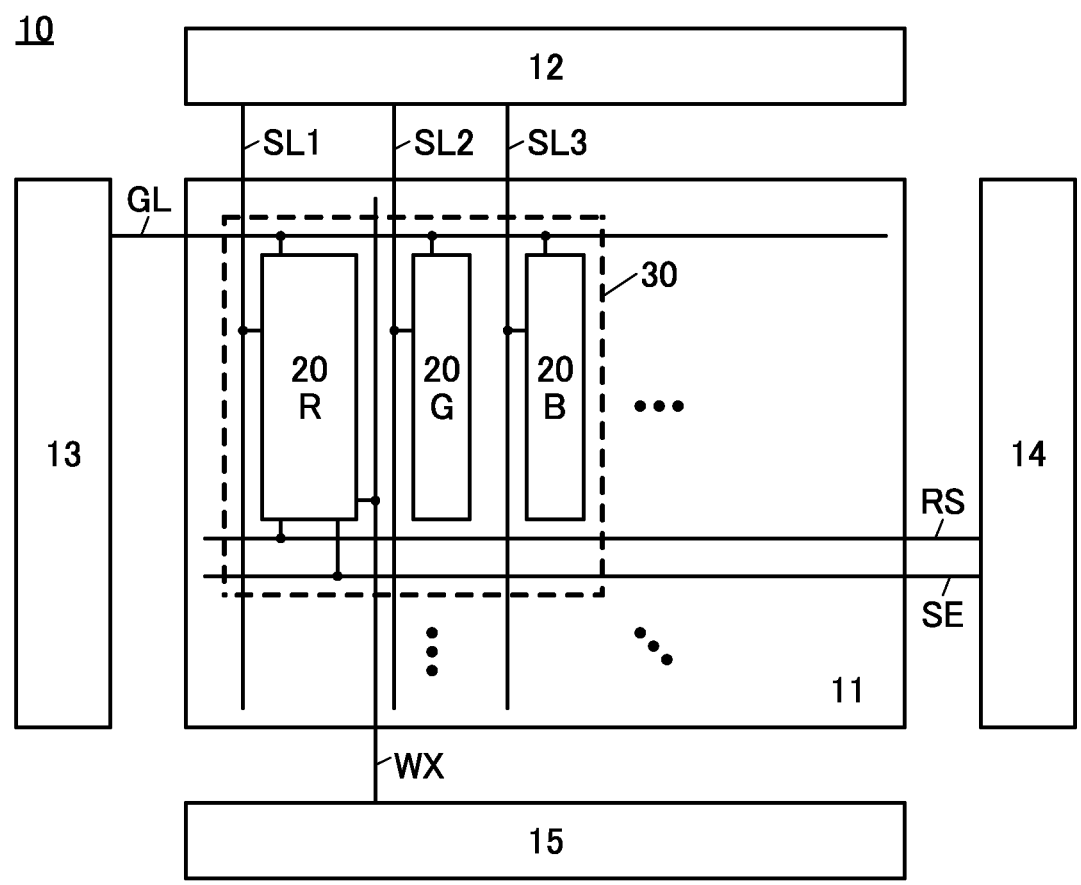
FIG. 5 is a diagram showing an example of a display device.

FIG. 5 illustrates a block diagram for describing a structure of a display device 10. The display device 10 includes a display portion 11, a driving circuit portion 12, a driving circuit portion 13, a driving circuit portion 14, a circuit portion 15, and the like.

The display portion 11 includes a plurality of pixels 30 arranged in a matrix. The pixel 30 includes a subpixel 20R, a subpixel 20G, and a subpixel 20B. The subpixel 20R includes a light-emitting and light-receiving element, and the subpixel 20G and the subpixel 20B each include a light-emitting element.

A wiring SL1, a wiring GL, a wiring RS, a wiring SE, a wiring WX, and the like are electrically connected to the subpixel 20R. A wiring SL2, the wiring GL, and the like are electrically connected to the subpixel 20G. A wiring SL3, the wiring GL, and the like are electrically connected to the subpixel 20B.

The wiring SL1, the wiring SL2, and the wiring SL3 are each electrically connected to the driving circuit portion 12. The wiring GL is electrically connected to the driving circuit portion 13. The driving circuit portion 12 functions as a source line driving circuit (also referred to as a source driver) and supplies a data signal (data potential) to the subpixels through the wiring SL1, the wiring SL2, and the wiring SL3. The driving circuit portion 13 functions as a gate line driving circuit (also referred to as a gate driver) and supplies a selection signal to the wiring GL.

The wiring RS and the wiring SE are each electrically connected to the driving circuit portion 14. The wiring WX is electrically connected to the circuit portion 15. The driving circuit portion 14 has a function of generating a signal to be supplied to the subpixel 20R and outputting the signal to the wiring SE, the wiring RS, and the like. The driving circuit portion 14 also has a function of generating and outputting a signal to be supplied to a wiring REN and a wiring TX that will be described later. Note that the driving circuit portion 13 or the driving circuit portion 12 may have a function of generating a signal to be supplied to one or both of the wiring REN and the wiring TX. The circuit portion 15 has a function of receiving a signal output from the subpixel 20R through the wiring WX and outputting the signal to the outside as imaging data. The circuit portion 15 functions as a read circuit.

Pixel Structure Example 2-1

Figure 6:
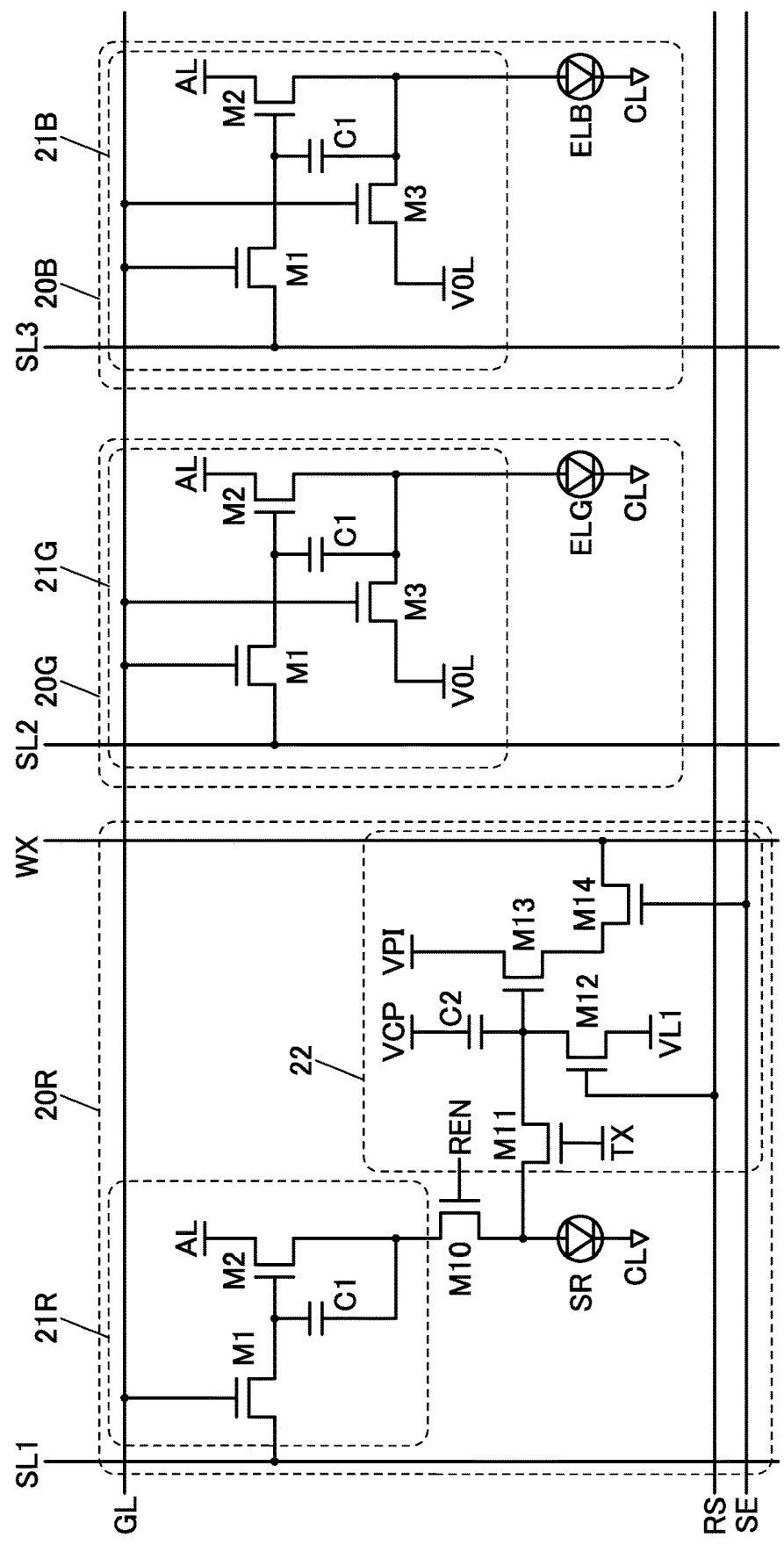
FIG. 6 is a circuit diagram showing an example of a pixel.

In FIG. 6, an example of a circuit diagram of the pixel 30 is illustrated. The pixel 30 includes the subpixel 20R, the subpixel 20G, and the subpixel 20B. The subpixel 20R includes a circuit 21R, a circuit 22, a light-emitting and light-receiving element SR, and a transistor M10. The subpixel 20G includes a circuit 21G and a light-emitting element ELG. The subpixel 20B includes a circuit 21B and a light-emitting element ELB.

The circuit 21R includes a transistor M1, a transistor M2, a capacitor C1, and the like. The circuit 22 includes a transistor M11, a transistor M12, a transistor M13, a transistor M14, a capacitor C2, and the like.

The circuit 21R functions as a circuit for controlling light emission of the light-emitting and light-receiving element SR when the light-emitting and light-receiving element SR is used as a light-emitting element. The circuit 21R has a function of controlling current flowing through the light-emitting and light-receiving element SR in accordance with the data potential supplied from the wiring SL1.

The circuit 22 functions as a sensor circuit for controlling an operation of the light-emitting and light-receiving element SR when the light-emitting and light-receiving element SR is used as a light-receiving element. The circuit 22 has a function of applying a reverse bias voltage to the light-emitting and light-receiving element SR, a function of controlling the light exposure period of the light-emitting and light-receiving element SR, a function of holding a potential based on electric charge transferred from the light-emitting and light-receiving element SR, a function of outputting a signal based on the potential to the wiring WX, and the like.

The subpixel 20R illustrated in FIG. 6 has a structure corresponding to that illustrated in FIG. 4B as an example. The transistor M2 and the transistor M13 respectively correspond to the transistor Tr1 and the transistor Tr2 in FIG. 4B. Similarly, the transistor M1, the transistor M11, the transistor M12, and the transistor M10 correspond to the switch SW1, the switch SW2, the switch SW3, and the switch SW4, respectively.

A gate of the transistor M1 is electrically connected to the wiring GL, one of a source and a drain of the transistor M1 is electrically connected to the wiring SL1, and the other thereof is electrically connected to a gate of the transistor M2 and one electrode of the capacitor C1. One of a source and a drain of the transistor M2 is electrically connected to the wiring AL, and the other thereof is electrically connected to one of a source and a drain of the transistor M10 and the other electrode of the capacitor C1. A gate of the transistor M10 is electrically connected to the wiring REN, and the other of the source and the drain of the transistor M10 is electrically connected to one electrode of the light-emitting and light-receiving element SR. The other electrode of the light-emitting and light-receiving element SR is electrically connected to the wiring CL.

A data potential is supplied to the wiring SL1. An anode potential is supplied to the wiring AL. A cathode potential is supplied to the wiring CL. In the structure illustrated in FIG. 6, the anode potential is higher than the cathode potential. A signal for controlling the conduction or non-conduction of the transistor M10 is supplied to the wiring REN.

A gate of the transistor M11 is electrically connected to the wiring TX; one of a source and a drain of the transistor M11 is electrically connected to the one electrode of the light-emitting and light-receiving element SR and the other of the source and the drain of the transistor M10; and the other of the source and the drain of the transistor M11 is electrically connected to a gate of the transistor M13, one of a source and a drain of the transistor M12, and one electrode of the capacitor C2. A gate of the transistor M12 is electrically connected to the wiring RS, and the other of the source and the drain thereof is electrically connected to the wiring VL1. The other electrode of the capacitor C2 is electrically connected to the wiring VCP. One of a source and a drain of the transistor M13 is electrically connected to the wiring VPI, and the other thereof is electrically connected to one of a source and a drain of the transistor M14. A gate of the transistor M14 is electrically connected to the wiring SE, and the other of the source and the drain of the transistor M14 is electrically connected to the wiring WX.

A signal for controlling the conduction or non-conduction of the transistor M11 is supplied to the wiring TX. The potential $V_0$ and the potential $V_{RS}$ are supplied to the wiring VL1 in different periods. A constant potential is supplied to the wiring VCP. A constant potential is supplied to the wiring VPI. In the structure illustrated in FIG. 6, a potential $V_{RS}$ supplied to the wiring VL1 is preferably lower than the cathode potential supplied to the wiring CL.

The transistor M14 functions as a selection transistor for reading. The conduction or non-conduction of the transistor M14 is controlled by a signal supplied to the wiring SE. When the transistor M14 is turned on, electrical continuity is established between the transistor M13 and the wiring WX, so that current (or voltage) corresponding to the gate potential of the transistor M13 can be output to the wiring WX.

Here, transistors with extremely low leakage current in the non-conduction state are preferably used as the transistor M1, the transistor M10, the transistor M11, the transistor M12, and the transistor M14, which function as switches. In particular, a transistor including an oxide semiconductor for a semiconductor layer where a channel is formed can be preferably used. It is preferable to use transistors including an oxide semiconductor also as the transistor M2 and the transistor M13, in which case all the transistors can be formed through the same manufacturing steps. Note that as for the transistor M2 and the transistor M13, silicon (including amorphous silicon, polycrystalline silicon, and single crystal silicon) may be used in a semiconductor layer where a channel is formed. Without limitation to the above, transistors including silicon can be used as some or all of the transistors. Alternatively, transistors including an inorganic semiconductor other than silicon, a compound semiconductor, an organic semiconductor, or the like may be used as some or all of the transistors.

The subpixel 20G includes the circuit 21G and the light-emitting element ELG. The subpixel 20B includes the circuit 21B and the light-emitting element ELB. The circuit 21G has a structure similar to that of the circuit 21B.

The circuit 21G and the circuit 21B each include the transistor M1, the transistor M2, the transistor M3, and the capacitor C1. The circuit 21G and the circuit 21B are similar to the above circuit 21R except that the transistor M3 is included. A gate of the transistor M3 is electrically connected to the wiring GL, one of a source and a drain of the transistor M3 is electrically connected to the other electrode of the capacitor C1, the other of the source and the drain of the transistor M2, and an anode of the light-emitting element ELG or the light-emitting element ELB, and the other of the source and the drain of the transistor M3 is electrically connected to a wiring V0L.

A constant potential is supplied to the wiring V0L. For example, the same potential as the potential $V_0$ supplied to the wiring VL1 may be supplied to the wiring V0L. The wiring VL1 may be used instead of the wiring V0L.

Figure 7A:
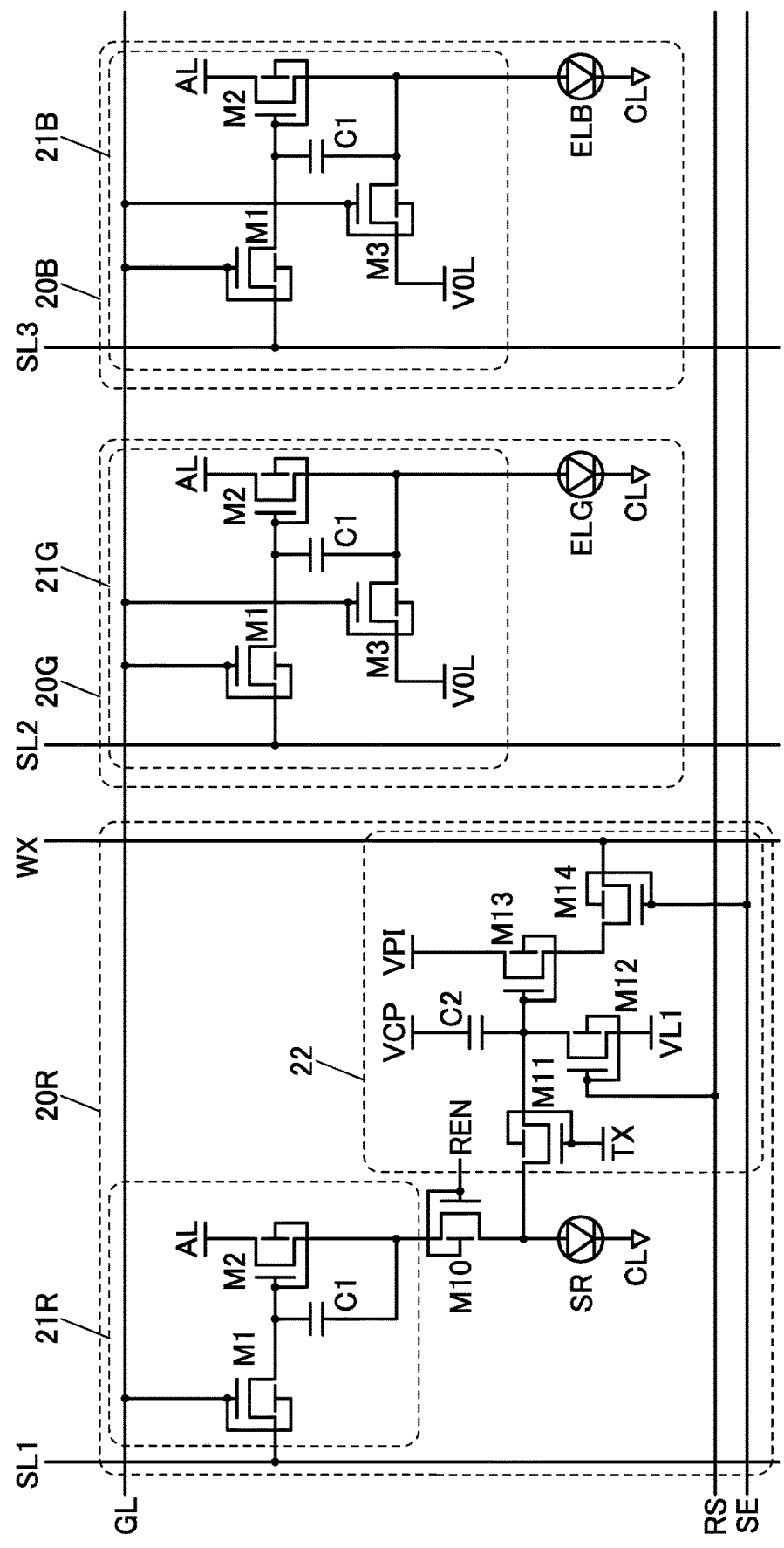
FIG. 7A is a circuit diagram showing an example of a pixel.

Here, as illustrated in FIG. 7A, each of the transistors may be a transistor including a back gate. FIG. 7A illustrates a structure in which a pair of gates are electrically connected to each other.

Figure 7B:
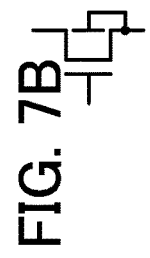
FIG. 7B is a circuit diagram of a transistor.

Note that although FIG. 7A shows the structure in which a pair of gates are electrically connected to each other in all the transistors, one embodiment of the present invention is not limited thereto. The pixel 30 may include a transistor in which one of gates is connected to another wiring. For example, when one of the pair of gates is connected to a wiring supplied with a constant potential, the stability of electrical characteristics can be improved. Alternatively, one of the pair of gates can be connected to a wiring supplied with a potential for controlling the threshold voltage of the transistor. Alternatively, as illustrated in FIG. 7B, a transistor in which one of a pair of gates is connected to one of a source and a drain may be used. In this case, the one of the gates is preferably connected to the source. The transistor illustrated in FIG. 7B can be favorably used as the transistor M2, the transistor M12, and the transistor M13 in the pixel 30, for example.

Although the example in which all the transistors include back gates is shown here, one embodiment of the present invention is not limited thereto, and a transistor that includes a back gate and a transistor that does not include a back gate may be used in combination.

Pixel Structure Example 2-2

Figure 8A:
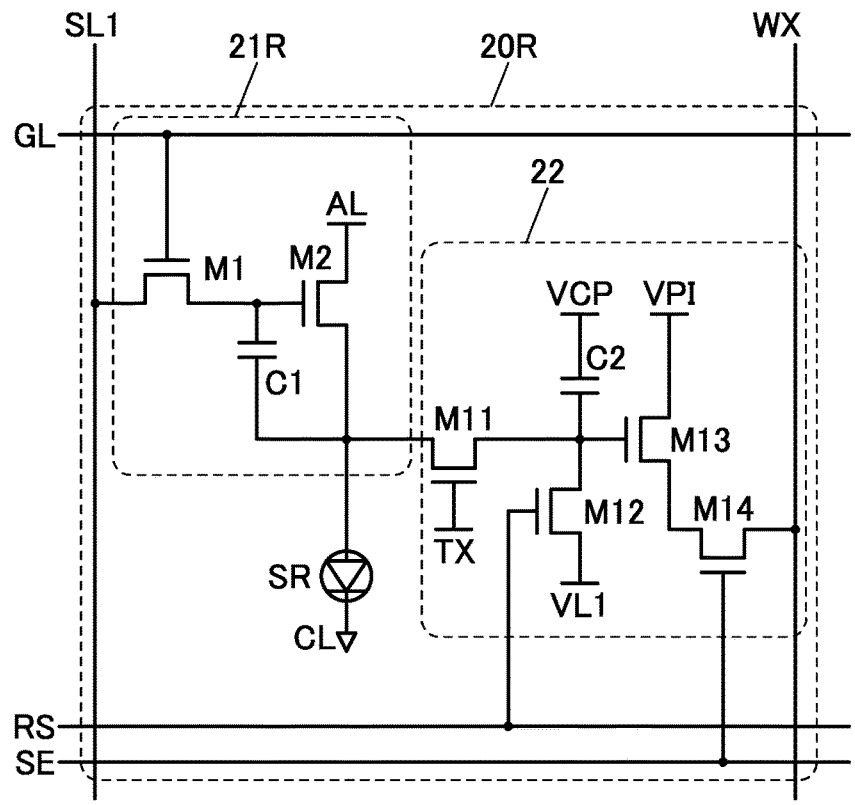
FIG. 8A and FIG. 8B are circuit diagrams each showing an example of a pixel.

FIG. 8A illustrates an example in which the transistor M10 in the above subpixel 20R illustrated as an example in FIG. 6 is omitted. The structure illustrated in FIG. 8A corresponds to the structure illustrated as an example in FIG. 1.

Figure 8B:
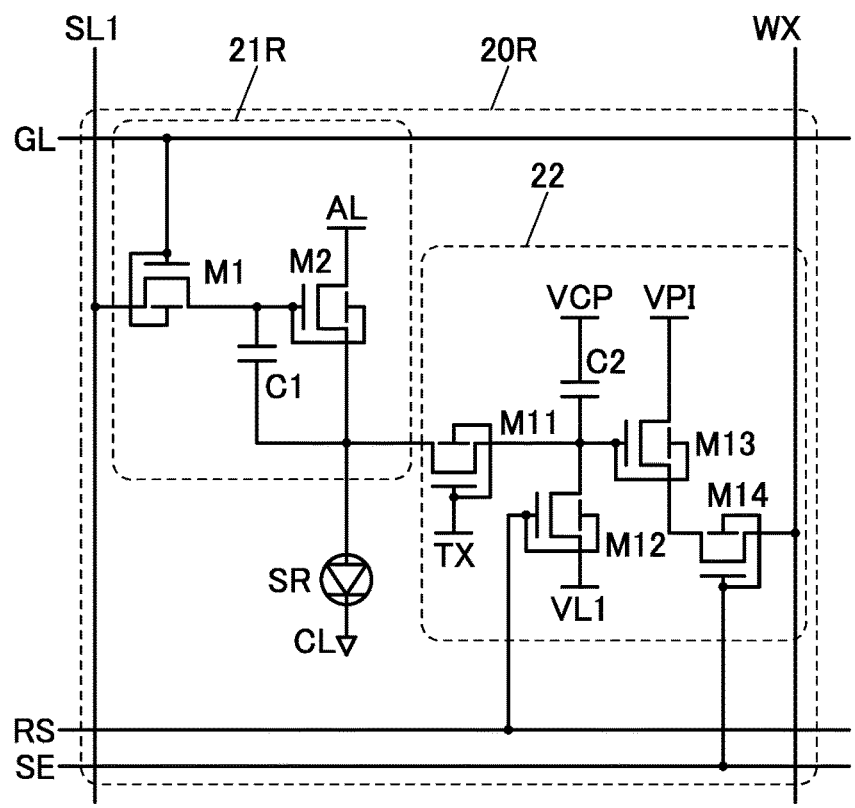

FIG. 8B illustrates an example in which a transistor including a back gate is used as each transistor in FIG. 8A. Here, transistors in each of which a pair of gates are connected are used as all the transistors. Note that, as described above, the connection method of the back gate is not limited to this. In addition, as described above, a transistor that includes a back gate and a transistor that does not include a back gate may be used in combination.

Pixel Structure Example 2-3

Figure 9A:
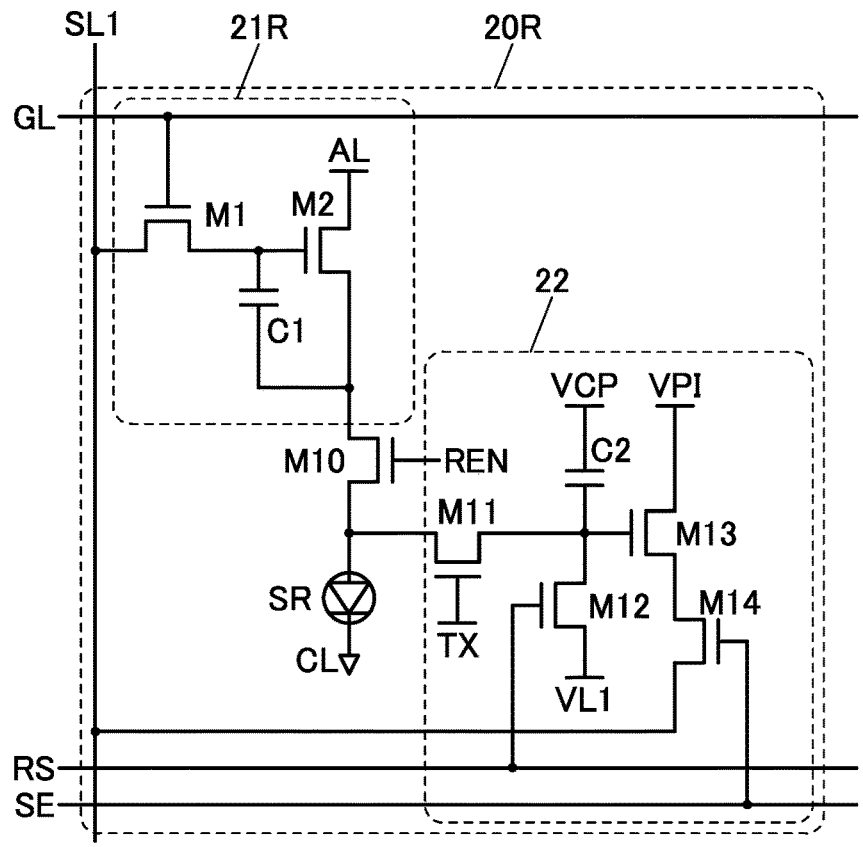
FIG. 9A and FIG. 9B are circuit diagrams each showing an example of a pixel.

FIG. 9A illustrates an example in which the wiring WX is omitted from the subpixel 20R illustrated as an example in FIG. 6 described above.

In FIG. 9A, the other of the source and the drain of the transistor M14 is electrically connected to the wiring SL1.

The wiring SL1 can serve as the wiring WX. Specifically, when the transistor M14 is turned on, current (or voltage) corresponding to the gate potential of the transistor M13 can be output to the wiring SL1. In this case, the wiring SL1 can be connected to both the driving circuit portion 12 and the circuit portion 15.

Figure 9B:
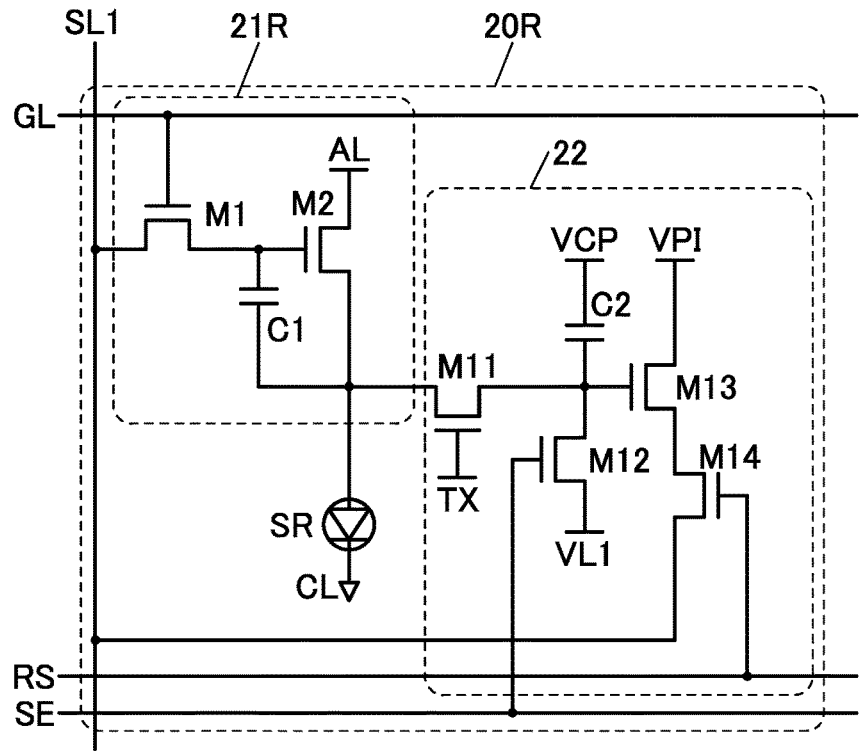

FIG. 9B illustrates an example in which the transistor M10 in FIG. 9A is omitted.

Structure Example 2-2 of Display Device

The example in which one pixel includes three subpixels is described above; an example in which one pixel includes two subpixels will be described below.

Figure 10A:
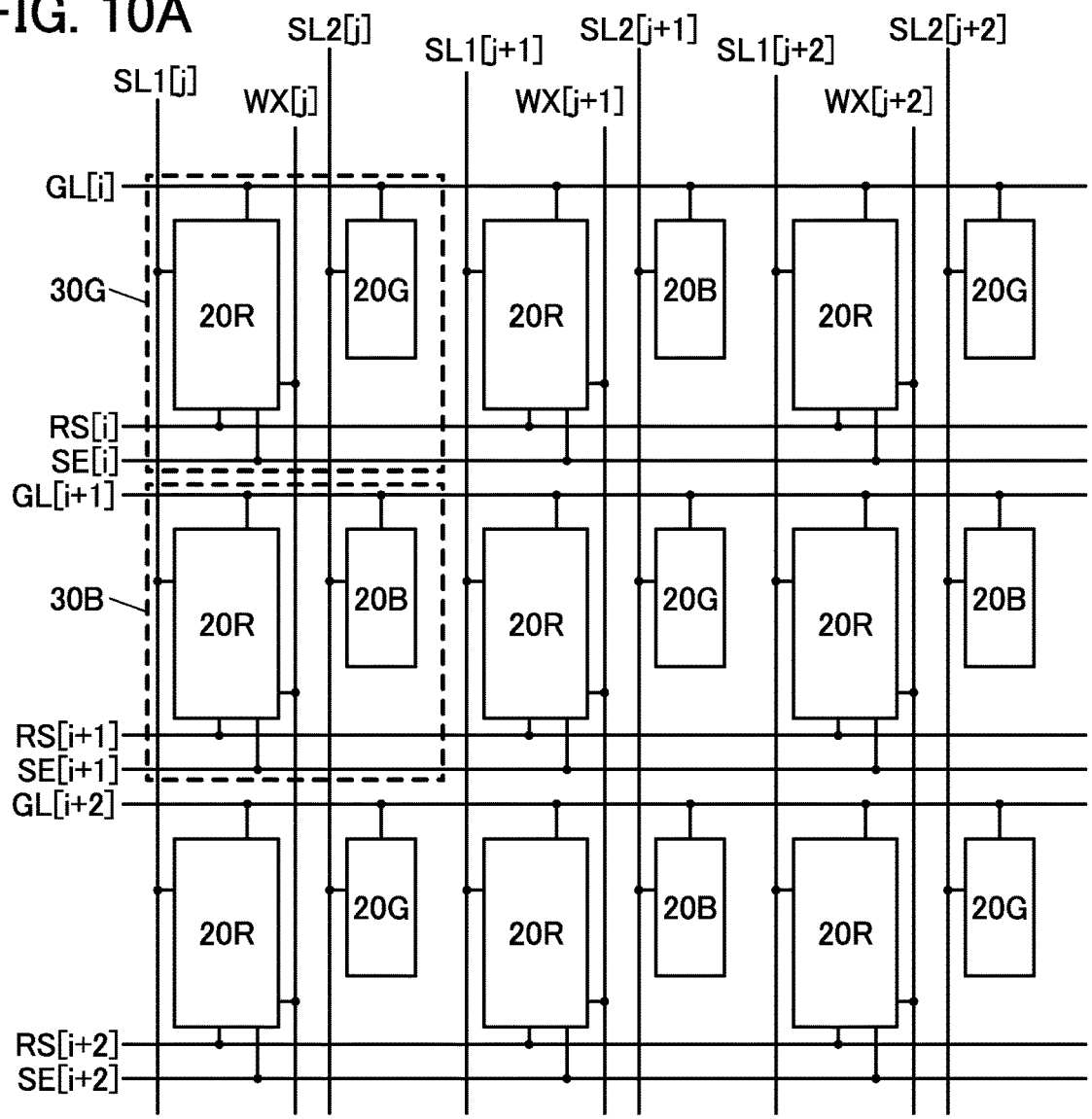
FIG. 10A and FIG. 10B are diagrams each showing an example of a display device.

FIG. 10A illustrates an example of a method for arranging 3×3 pixels. FIG. 10A illustrates pixels in an i-th row and a j-th column (i and j are each independently an integer greater than or equal to 1) to an i+2-th row and a j+2-th column.

In FIG. 10A, pixels 30G and pixels 30B are alternately arranged in the row direction and the column direction. The pixel 30G includes the subpixel 20R and the subpixel 20G. The pixel 30B includes the subpixel 20R and the subpixel 20B.

For example, to the pixel 30G positioned in the i-th row and the j-th column, a wiring GL[i], a wiring RS[i], and a wiring SE[i] that extend in the row direction and a wiring SL1[j], a wiring SL2[j], and a wiring WX[j] that extend in the column direction are connected.

Figure 10B:
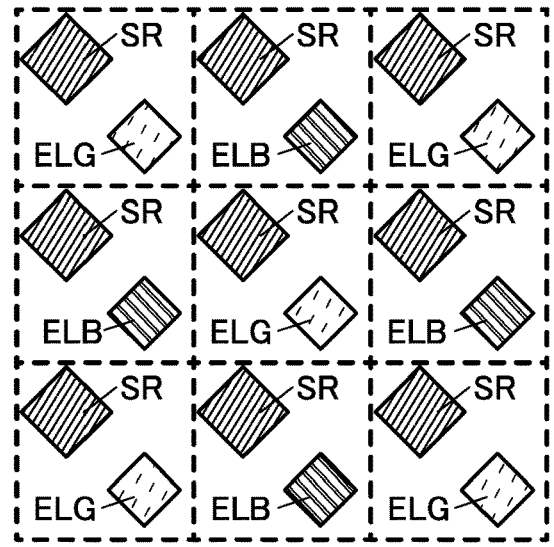

FIG. 10B illustrates an example of a method for arranging the light-emitting and light-receiving elements SR, the light-emitting elements ELG, and the light-emitting elements ELB. The light-emitting and light-receiving elements SR are arranged at regular intervals in the row direction and the column direction. The light-emitting elements ELG and the light-emitting elements ELB are alternately arranged in the row direction and the column direction. The light-emitting and light-receiving element SR, the light-emitting element ELG, and the light-emitting element ELB have a shape such that a square is tilted at approximately 45 degrees with respect to the arrangement direction. This can increase the distance between adjacent elements; hence, when the light-emitting elements and the light-emitting and light-receiving elements are separately formed, they can be manufactured with high yield.

Figure 11:
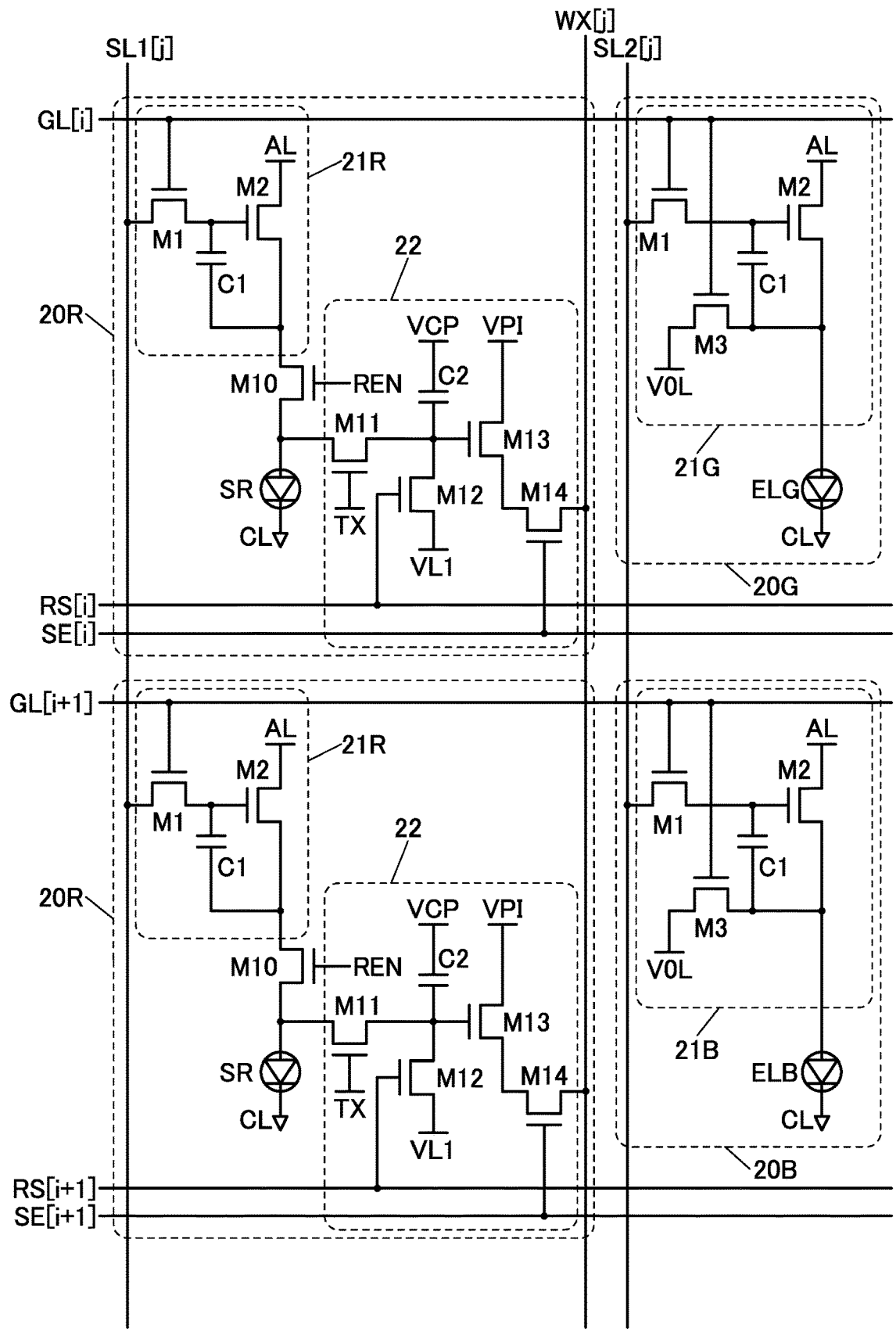
FIG. 11 is a circuit diagram showing an example of a pixel.

FIG. 11 illustrates an example of a circuit diagram of the pixel 30G in the i-th row and the j-th column and the pixel 30B in the i+1-th row and the j-th column. FIG. 6 and the like described above can be referred to for the structures of the subpixel 20R, the subpixel 20G, and the subpixel 20B.

Driving Method Example 1

An example of a driving method of the display device is described below. Here, the description will be made using the above structures illustrated in FIG. 10 and FIG. 11, in which one pixel includes two subpixels, as examples.

Note that, in the following description, the display device includes a display portion in which a plurality of pixels are arranged in a matrix of M rows and N columns (M and N are each independently an integer greater than or equal to 2).

Figure 12:
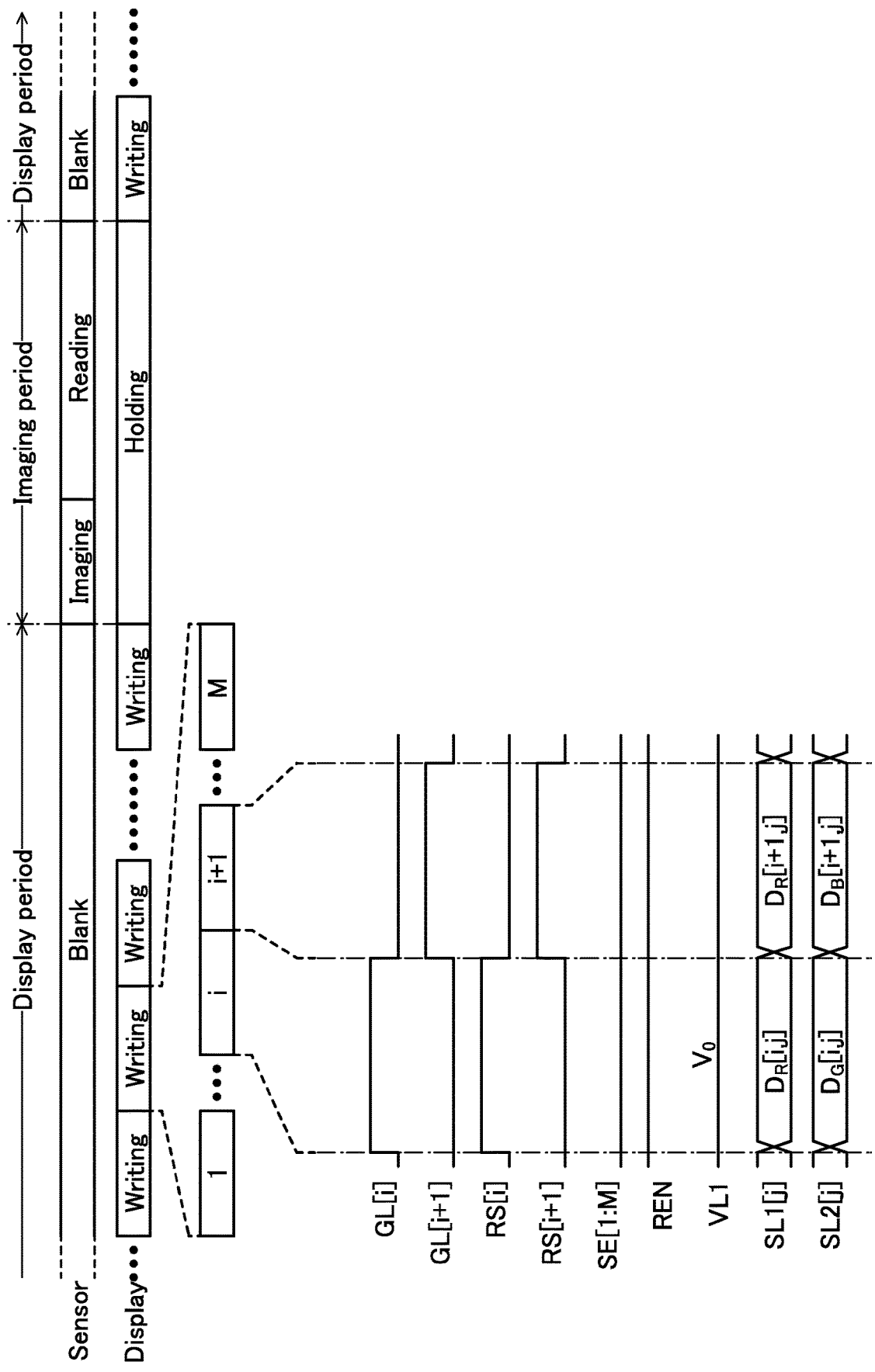
FIG. 12 is a diagram showing an example of a method for operating a display device.
Figure 13:
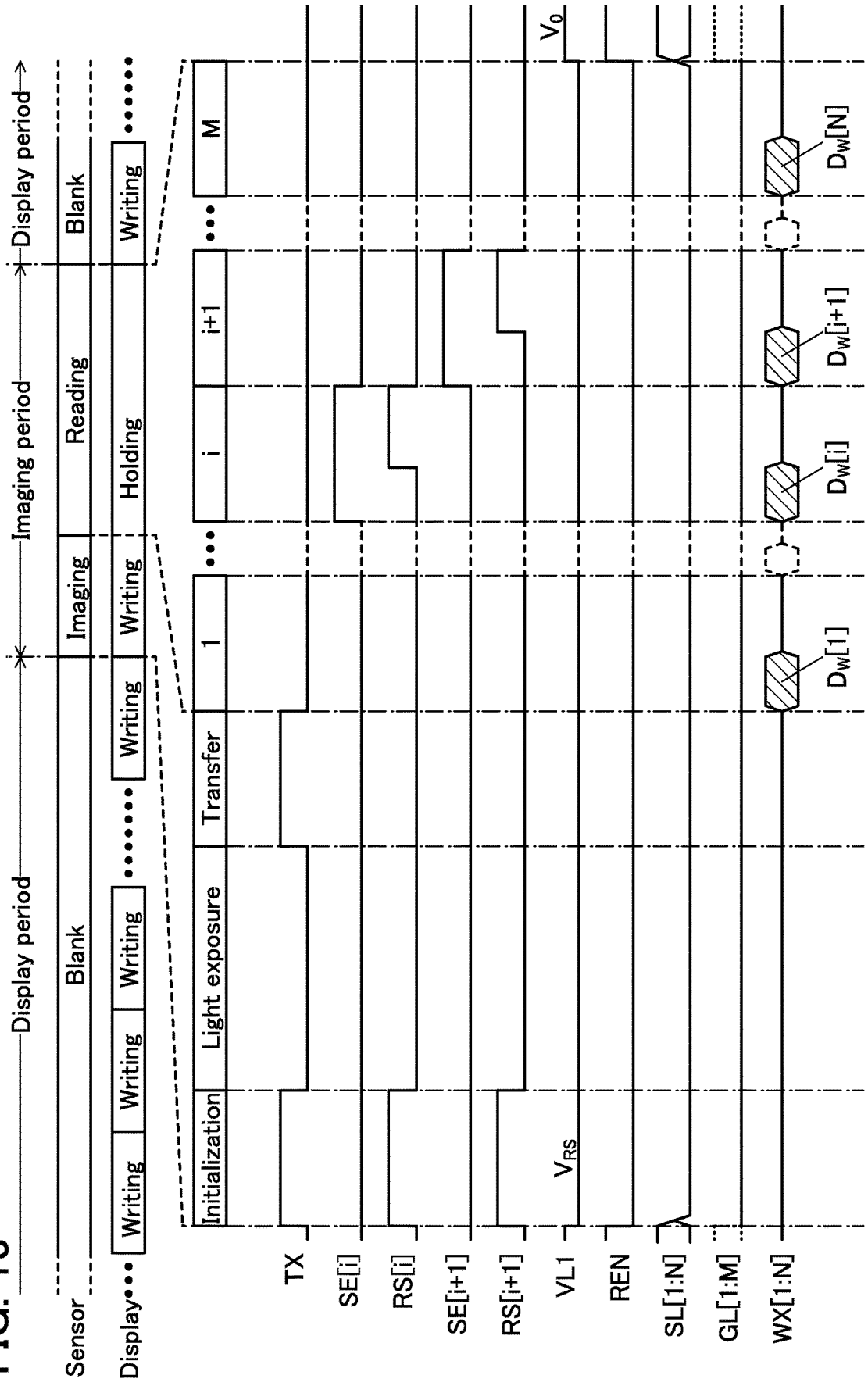
FIG. 13 is a diagram showing an example of a method for operating a display device.

FIG. 12 and FIG. 13 schematically show the operation of the display device. The operation of the display device can be roughly divided into a period during which an image is displayed using the light-emitting elements and the light-emitting and light-receiving elements (a display period) and a period during which imaging is performed using the light-emitting and light-receiving elements (also referred to as sensors) (an imaging period). The display period is a period during which image data is written to pixels and display based on the image data is performed. The imaging period is a period during which imaging with the light-emitting and light-receiving elements is performed and imaging data is read out.

First, the operation in the display period is described with reference to FIG. 12.

In the display period, an operation of writing data to pixels is performed repeatedly. In the period, no sensor operation is performed (denoted as "Blank"). Note that, an imaging operation can be performed in the display period.

Image data for one frame is written by one writing operation. As shown in FIG. 12, data is written to pixels sequentially from the first column to the M-th column by one writing operation (denoted as "Writing").

FIG. 12 shows a timing chart for the operation of writing data in the i-th row and the i+1-th row. Here, changes in the potentials of the wiring GL[i], a wiring GL[i+1], the wiring RS[i], a wiring RS[i+1], the wiring SE, the wiring REN, the wiring VL1, the wiring SL1[j], and the wiring SL2[j] are shown. Here, the wirings SE from the first row to the M-th column are collectively denoted as the wirings SE[1:M]. FIG. 10 and FIG. 11 can be referred to for connection relations between the wirings and the pixels.

In a period in which writing is performed on the i-th row, the wiring GL[i] and the wiring RS[i] are set to a high-level potential, and the other wirings GL and the other wirings RS are set to a low-level potential. Image data DR[i,j] and image data DG[i,j] are supplied to the wiring SL1[j] and the wiring SL2[j], respectively. Furthermore, the high-level potential is supplied to the wiring REN and the potential $V_O$ is supplied to the wiring VL1 in the writing period.

In a manner similar to the above, writing can be performed on each of i+1-th and subsequent rows by setting the corresponding wiring GL and wiring RS to a high-level potential and supplying image data to each of the wirings SL1 and the wirings SL2.

By performing such writing operation from the first row to the M-th row, data writing of one frame is completed. In the display period, a moving image can be displayed by repeating the above operation.

Next, the operation in the imaging period is described with reference to FIG. 13. The case of performing an imaging operation in a global shutter mode is described here. Note that without limitation to a global shutter mode, a driving method with a rolling shutter mode can also be employed.

The imaging period can be divided into a period during which imaging is performed in each pixel at a time (this period is denoted as "Imaging" and hereinafter also referred to as an imaging operation period to be distinguished from the imaging period) and a period during which imaging data is read sequentially (denoted as "Reading"). The imaging operation period can be divided into an initialization period, a light exposure period, and a transfer period. In the reading period, imaging data is read row by row from the first row to the M-th row.

FIG. 13 shows a timing chart in the imaging operation period and the reading period. Here, changes in the potentials of the wiring TX, the wiring SE[i], the wiring RS[i], the wiring SE[i+1], the wiring RS[i+1], the wiring VL1, the wiring REN, wirings SL[1:N], wirings GL[1:M], and wirings WX[1:N] are shown. Here, the wirings GL are collectively denoted as the wirings GL[1:M], and the wirings WX are collectively denoted as the wirings WX[1:M]. The wiring SL1, the wiring SL2, and the like are collectively denoted as the wirings SL[1:N].

In the initialization period, the wiring REN is set to a low-level potential. Accordingly, the transistors M10 in all the pixels are turned off. Thus, the light-emitting and light-receiving element SR and the transistor M2 can be electrically insulated from each other.

The wiring TX and all the wirings RS are set to a high-level potential and the potential $V_{RS}$ is supplied to the wiring VL1, so that the potential $V_{RS}$ is supplied from the wiring VL1 to the node to which the gate of the transistor M13 is connected and the anode of the light-emitting and light-receiving element SR through the transistor M11 and the transistor M12. Thus, reset operation of all the pixels is performed.

Then, in the light exposure period, the wiring TX and the wiring RS are set to a low-level potential. Thus, electric charge corresponding to the irradiation light is accumulated in the light-emitting and light-receiving element SR.

Next, in the transfer period, the wiring TX is set to a high-level potential. Thus, the electric charge accumulated in the light-emitting and light-receiving element SR can be transferred to the node to which the gate of the transistor M13 is connected. After that, setting the wiring TX to a low-level potential brings about a state where the potential of the node is held.

Then, imaging data is read out row by row. In the reading period, a high-level potential is sequentially supplied to the wiring SE[1] to a wiring SE[N], whereby data can be read out from all the pixels. For example, for reading in the i-th row, by setting the wiring SE[i] to a high-level potential, data Dw[i] in the i-th row is output to the wirings WX[1:N]. Specifically, data Dw[i,j] in the i-th row and the j-th column is output to one wiring WX[j].

In FIG. 13, in an operation of reading data in the i-th row, a high-level potential is supplied to the wiring SE[i], the data DW[i] is output to the wirings WX[1:N], and then a high-level potential is supplied to the wiring RS[i]. Thus, data in a state where the potential $V_{RS}$, which is a reset potential, is supplied to the gate of the transistor M13 is output to the wirings WX[1:N]. The circuit portion 15 to which the wiring WX is connected can perform correlated double sampling using these two output data, so that the influence of variations in electrical characteristics of the pixels can be reduced.

Here, during the imaging period, a low-level potential is continually supplied to the wiring REN. Accordingly, the light-emitting and light-receiving element SR and the transistor M2 are electrically insulated from each other particularly in the light exposure period and the transfer period. Consequently, noise is reduced, and imaging with high accuracy can be performed.

In the imaging period, each pixel is preferably set in a state of holding image data that is most recently written (denoted as "Holding"). Thus, when the imaging period ends and the potential of the wiring REN changes from a low-level potential to a high-level potential, an image corresponding to the held image data can be displayed immediately. When image data written to the subpixel 20G or the subpixel 20B is held in the imaging period, crosstalk noise affecting the anode of the light-emitting and light-receiving element SR in the subpixel 20R can be reduced.

The above is the description of Driving method example 1.

Structure Example 3

A structure example of a display device whose structure is different from that of the above structure example is described below.

Pixel Structure Example 3-1

Figure 14A:
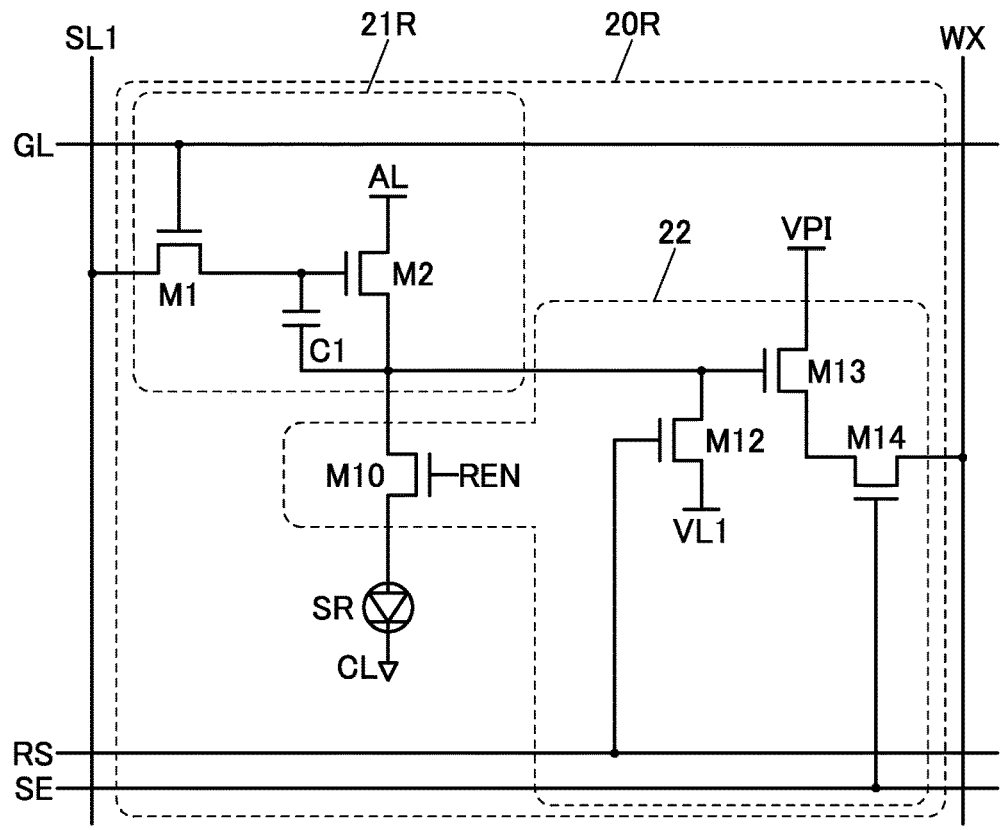
FIG. 14A and FIG. 14B are circuit diagrams each showing an example of a pixel.

In a pixel circuit illustrated in FIG. 14A, the transistor M11 and the capacitor C2 are omitted from the structure illustrated as examples in FIG. 6 and the like.

In FIG. 14A, the other of the source and the drain of the transistor M2 is electrically connected to one of the source and the drain of the transistor M10, one of the source and the drain of the transistor M12, and the gate of the transistor M13. The other of the source and the drain of the transistor M10 is electrically connected to the anode of the light-emitting and light-receiving element SR.

With such a structure, the transistor M10 can also serve as the transistor M11 in the above structure illustrated in FIG. 6 and the like. Therefore, the transistor M11 and the wiring TX can be omitted, so that the pixel structure can be simplified.

In the structure illustrated as an example in FIG. 14A, the capacitor C1 can also serve as the capacitor C2 in the structure illustrated in FIG. 6 and the like. That is, the capacitor C1 can also serve as a storage capacitor that holds the potential of a node to which the gate of the transistor M13 is connected. Thus, the capacitor C2 and the wiring VCP can be omitted, whereby the pixel structure can be simplified as compared with the structure illustrated in FIG. 6 and the like.

Here, the capacitor C1 is not connected to a wiring to which a constant potential is supplied. For this reason, in the case where the capacitor C1 is charged and discharged through any one of the pair of electrodes thereof, a constant potential is preferably supplied to the other. Specifically, it is preferable that a constant potential (e.g., the potential $V_{off}$) be supplied from the wiring SL1 through the transistor M1 or that a constant potential (e.g., the potential $V_0$ or the potential $V_{RS}$) be supplied from the wiring VL1 through the transistor M12.

Figure 14B:
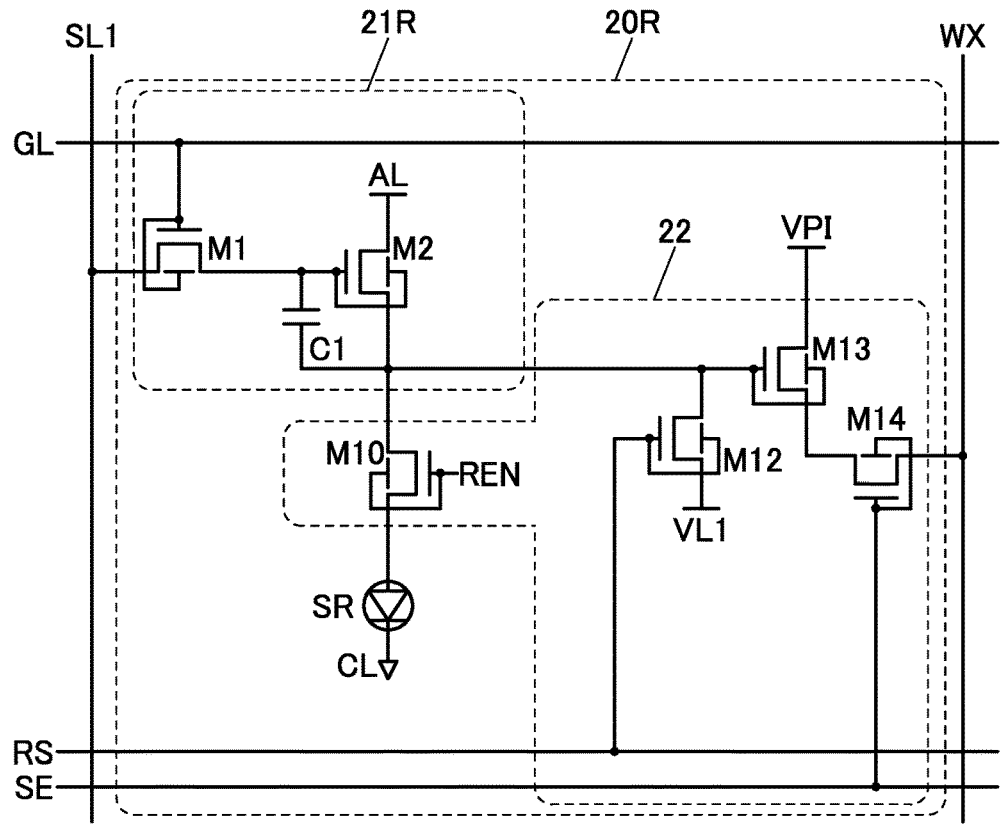

FIG. 14B illustrates an example in which a transistor including a back gate is used as each transistor in FIG. 14A. Here, transistors in each of which a pair of gates are connected are used as all the transistors. Note that, as described above, the connection method of the back gate is not limited to this. In addition, as described above, a transistor that includes a back gate and a transistor that does not include a back gate may be used in combination.

Pixel Structure Example 3-2

Figure 15:
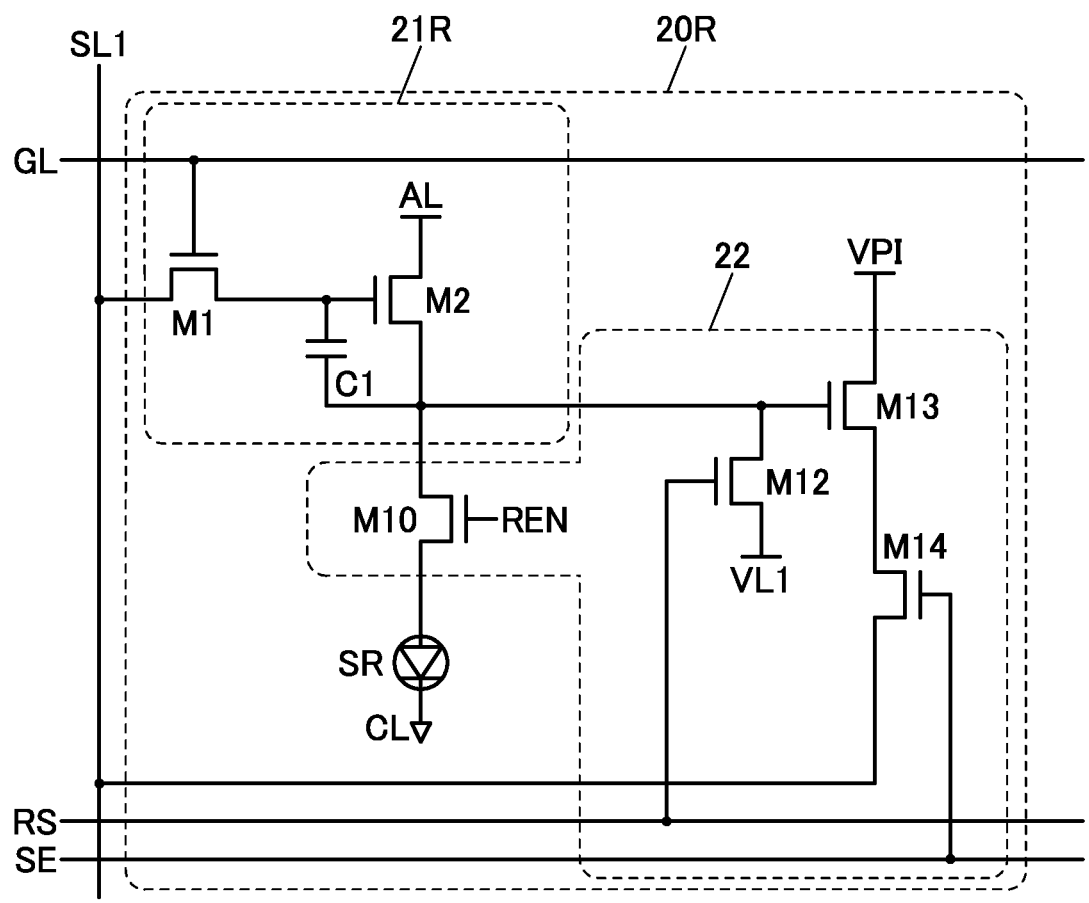
FIG. 15 is a circuit diagram showing an example of a pixel.

FIG. 15 illustrates an example of the case where the wiring WX is omitted from the structure illustrated in FIG. 14A. The other of the source and the drain of the transistor M14 is electrically connected to the wiring SL1. The wiring SL1 can also serve as the wiring WX. In that case, the pixel structure can be further simplified.

Structure Example 3 of Display Device

The pixel circuits illustrated as examples in FIG. 14A, FIG. 14B, and FIG. 15 described above can each be applied to the subpixel 20R of the display device illustrated as an example in FIG. 5, FIG. 10A, and the like.

Figure 16:
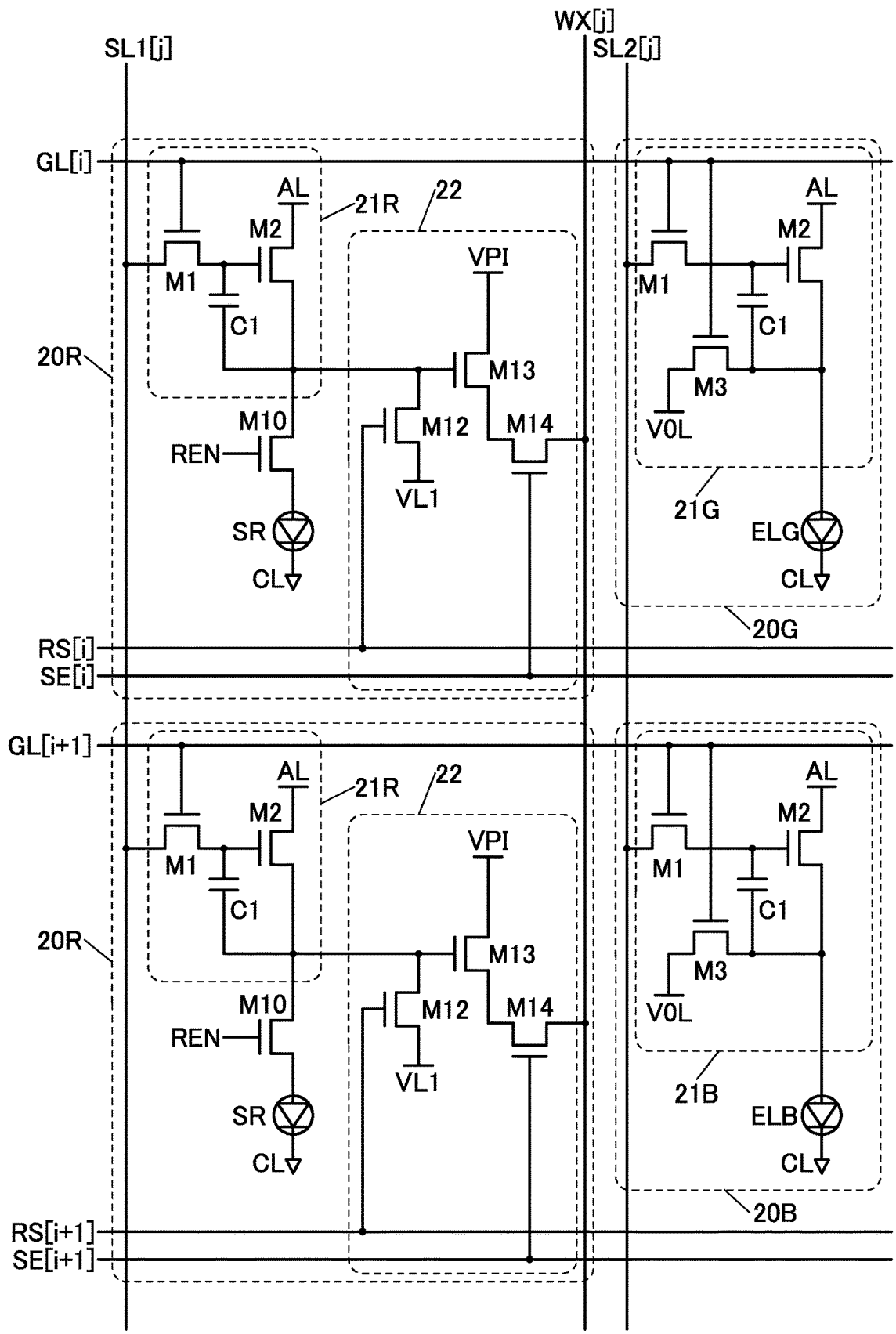
FIG. 16 is a circuit diagram showing an example of a pixel.

FIG. 16 shows an example of the case where the pixel circuit illustrated as an example in FIG. 14A is used in the display device in FIG. 10. Here, as in FIG. 11, an example of a circuit diagram of the pixel 30G in the i-th row and the j-th column and the pixel 30B in the i+1-th row and the j-th column is illustrated.

Driving Method Example 2

Another example of the driving method of the display device is described below. Here, description is made using the structure illustrated in FIG. 16 as an example.

Note that Driving method example 1 described above is referred to for portions similar to those described in Driving method example 1, and description of the portions is omitted in some cases.

A method similar to the method described as an example in Driving method example 1 with reference to FIG. 12 can be employed for the operation in the display period.

The operation in the imaging period is described below with reference to FIG. 17. The case of performing an imaging operation in a global shutter mode is described here as well.

Figure 17:
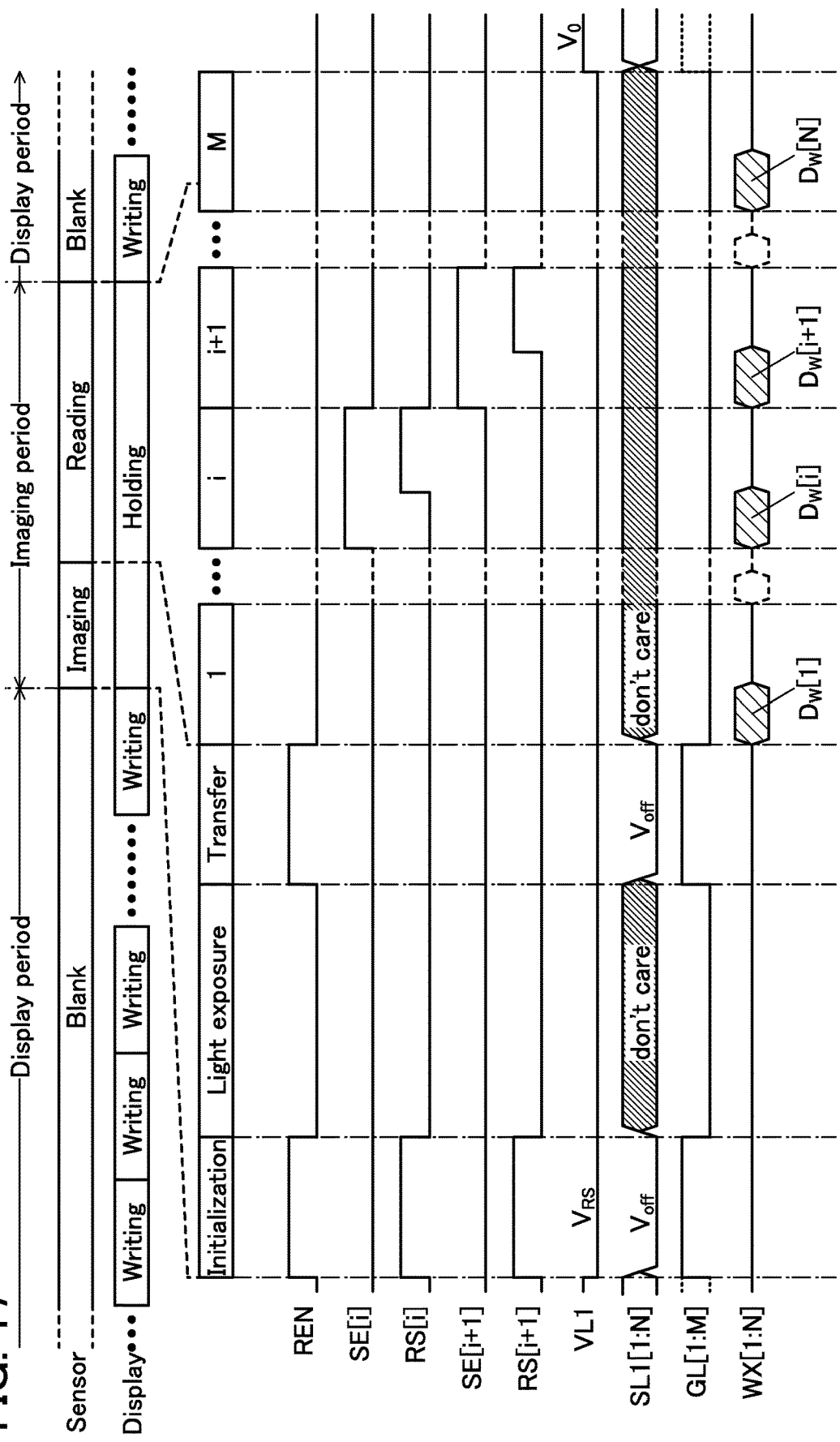
FIG. 17 is a diagram showing an example of a method for operating a display device.

FIG. 17 illustrates changes in potentials of the wiring REN, the wiring SE[i], the wiring RS[i], the wiring SE[i+1], the wiring RS[i+1], the wiring VL1, the wirings SL1[1:N], the wirings GL[1:M], and the wiring WX.

In an initialization period, the wiring REN and all the wirings RS are set to a high-level potential. Accordingly, the potential $V_{RS}$ is supplied from the wiring VL1 to the node to which the gate of the transistor M13 is connected and the anode of the light-emitting and light-receiving element SR through the transistor M12 and the transistor M10.

The wirings GL[1:M] are set to a high-level potential, and the potential $V_{off}$ is supplied to the wirings SL1[1:N]. Thus, the potential $V_{off}$ is supplied from the wiring SL1 to the gate of the transistor M2 through the transistor M1, so that the transistor M2 can be turned off.

Next, in a light exposure period, the wiring REN, the wiring RS, the wiring GL, and the like are set to a low-level potential. Thus, electric charge corresponding to light with which the light-emitting and light-receiving element SR is irradiated is accumulated.

Next, in the transfer period, the wiring REN is set to a high-level potential. Thus, the electric charge accumulated in the light-emitting and light-receiving element SR can be transferred to the node to which the gate of the transistor M13 is connected.

At this time, if the node to which the gate of the transistor M2 is connected is in a floating state, the potential of the node to which the gate of the transistor M2 is connected is increased in some cases by capacitive coupling due to the capacitor C1 when the transistor M10 is turned on after light exposure. Therefore, as shown in FIG. 17, it is preferable that the transistor M2 be surely turned off by supplying a high-level potential to the wirings GL[1:M] and supplying the potential $V_{off}$ to the wirings SL1[1:N] in the transfer period.

Then, imaging data is read out row by row. As for the operation during the reading period, as described above, a high-level potential is sequentially supplied to the wiring SE row by row, whereby data can be read out from all the pixels. Furthermore, two kinds of data may be output to the wiring WX by supplying a high-level potential to the wiring RS during the reading period of one row, and CDS may be performed in the circuit portion 15.

Here, during the light exposure period and the reading period, all the wirings GL are supplied with low-level potentials, so that the transistor M1 is in a non-conduction state. Thus, the state where the gate of the transistor M2 is supplied with the potential $V_{off}$ for turning off the transistor M2 is kept, which can prevent current from flowing to the transistor M2. Thus, imaging with less noise can be performed. Note that since the transistor M1 is in a non-conduction state at this time, there is no limitation on the potential supplied to the wiring SL1 (denoted to as don't care).

The above is the description of Driving method example 2.

At least part of the structure examples, the drawings corresponding thereto, and the like shown in this embodiment as an example can be implemented in combination with the other structure examples, the other drawings, and the like as appropriate.

At least part of this embodiment can be implemented in combination with the other embodiments described in this specification as appropriate.

Embodiment 2

In this embodiment, display devices of embodiments of the present invention will be described.

The display devices of embodiments of the present invention each include a light-emitting element and a light-emitting and light-receiving element.

The light-emitting and light-receiving element can be manufactured by combining an organic EL element which is a light-emitting element and an organic photodiode which is a light-receiving element. For example, by adding an active layer of an organic photodiode to a layered structure of an organic EL element, the light-emitting and light-receiving element can be manufactured. Furthermore, in the light-emitting and light-receiving element formed of a combination of an organic EL element and an organic photodiode, concurrently forming layers that can be shared with the organic EL element can inhibit an increase in the number of film formation steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer of the light-receiving element. In other words, the light-emitting and light-receiving element can be manufactured by only adding the active layer of the light-receiving element to the light-emitting element. When the light-emitting and light-receiving element and the light-emitting element include common layers in such a manner, the number of film formation steps and the number of masks can be reduced, thereby reducing the number of manufacturing steps and the manufacturing cost of the display device. Furthermore, the display device including the light-emitting and light-receiving element can be manufactured using an existing manufacturing apparatus and an existing manufacturing method for the display device.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element. For example, a hole-injection layer functions as a hole-injection layer in the case where the light-emitting and light-receiving element functions as a light-emitting element, and functions as a hole-transport layer in the case where the light-emitting and light-receiving element functions as a light-receiving element. Similarly, an electron-injection layer functions as an electron-injection layer in the case where the light-emitting and light-receiving element functions as a light-emitting element, and functions as an electron-transport layer in the case where the light-emitting and light-receiving element functions as a light-receiving element.

In this manner, the display device of this embodiment includes light-emitting and light-receiving elements and light-emitting elements in its display portion. Specifically, the light-emitting and light-receiving elements and the light-emitting elements are arranged in a matrix in the display portion. Accordingly, the display portion has one or both of an image-capturing function and a sensing function in addition to a function of displaying an image.

The display portion can be used as an image sensor, a touch sensor, or the like. That is, by detecting light with the display portion, for example, an image can be captured and the approach or touch of an object (e.g., a finger or a stylus)

can be detected. Furthermore, in the display device of this embodiment, the light-emitting elements can be used as a light source of the sensor. Accordingly, a light-receiving portion and a light source do not need to be provided separately from the display device; hence, the number of components of an electronic device can be reduced.

In the display device of this embodiment, when an object reflects light emitted from the light-emitting element included in the display portion, the light-emitting and light-receiving element can sense the reflected light; thus, imaging, touch (contact or approach) detection, and the like are possible even in a dark place.

The display device of this embodiment has a function of displaying an image with the use of a light-emitting element and a light-emitting and light-receiving element. That is, the light-emitting element and the light-emitting and light-receiving element function as display elements.

As the light-emitting element, an EL element such as an OLED (Organic Light Emitting Diode) or a QLED (Quantum-dot Light Emitting Diode) is preferably used. As a light-emitting substance contained in the EL element, a substance exhibiting fluorescence (a fluorescent material), a substance exhibiting phosphorescence (a phosphorescent material), an inorganic compound (such as a quantum dot material), a substance exhibiting thermally activated delayed fluorescence (a thermally activated delayed fluorescence (TADF) material), or the like can be given. Alternatively, an LED such as a micro-LED (Light Emitting Diode) can be used as the light-emitting element.

The display device of this embodiment has a function of detecting light with the use of a light-emitting and light-receiving element. The light-emitting and light-receiving element can detect light having a shorter wavelength than light emitted from the light-emitting and light-receiving element itself.

When the light-emitting and light-receiving element is used as an image sensor, the display device of this embodiment can capture an image using the light-emitting and light-receiving element. For example, the display device of this embodiment can be used as a scanner.

For example, data on a fingerprint, a palm print, or the like can be obtained with the use of the image sensor. That is, a biological authentication sensor can be incorporated in the display device of this embodiment. When the display device incorporates a biometric authentication sensor, the number of components of an electronic device can be reduced as compared to the case where a biometric authentication sensor is provided separately from the display device; thus, the size and weight of the electronic device can be reduced.

In addition, data on facial expression, eye movement, change of the pupil diameter, or the like of a user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting and light-receiving element is used as the touch sensor, the display device of this embodiment can detect the approach or contact of an object with the use of the light-emitting and light-receiving element.

The light-emitting and light-receiving element functions as a photoelectric conversion element that detects light entering the light-emitting and light-receiving element and generates electric charge. The amount of generated electric charge depends on the amount of incident light.

The light-emitting and light-receiving element can be manufactured by adding an active layer of the light-receiving element to the above-described structure of the light-emitting element.

For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of display devices.

FIG. 18A to FIG. 18D are cross-sectional views of display devices of one embodiment of the present invention.

Figure 18A:
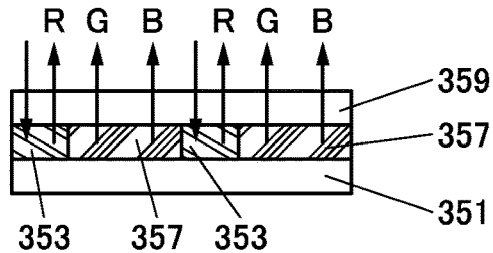
FIG. 18A to FIG. 18D are cross-sectional views each showing an example of a display device.

A display device 350A illustrated in FIG. 18A includes a layer 353 including a light-emitting and light-receiving element and a layer 357 including a light-emitting element between a substrate 351 and a substrate 359.

Figure 18B:
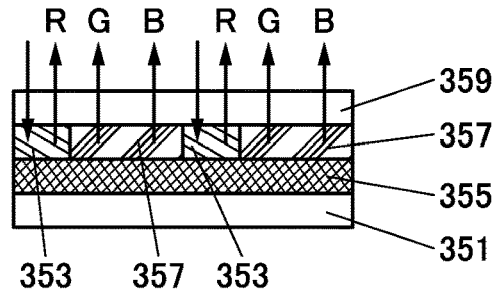

A display device 350B illustrated in FIG. 18B includes the layer 353 including a light-emitting and light-receiving element, a layer 355 including transistors, and the layer 357 including a light-emitting element between the substrate 351 and the substrate 359.

In the display device 350A and the display device 350B, green (G) light and blue (B) light are emitted from the layer 357 including a light-emitting element, and red (R) light is emitted from the layer 353 including a light-emitting and light-receiving element. In the display device of one embodiment of the present invention, the color of light emitted from the layer 353 including a light-emitting and light-receiving element is not limited to red.

The light-emitting and light-receiving element included in the layer 353 including a light-emitting and light-receiving element can detect light that enters from the outside of the display device 350A or the display device 350B. The light-emitting and light-receiving element can detect one or both of green (G) light and blue (B) light, for example.

The display device of one embodiment of the present invention includes a plurality of pixels arranged in a matrix. One pixel includes one or more subpixels. One subpixel includes one light-emitting and light-receiving element, or one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting and light-receiving element. The light-emitting and light-receiving element may be provided in all the pixels or may be provided in some of the pixels. In addition, one pixel may include a plurality of light-emitting and light-receiving elements.

The layer 355 including transistors includes a transistor electrically connected to the light-emitting and light-receiving element and a transistor electrically connected to the light-emitting element, for example. The layer 355 including transistors may further include a wiring, an electrode, a terminal, a capacitor, a resistor, or the like.

Figure 18C:
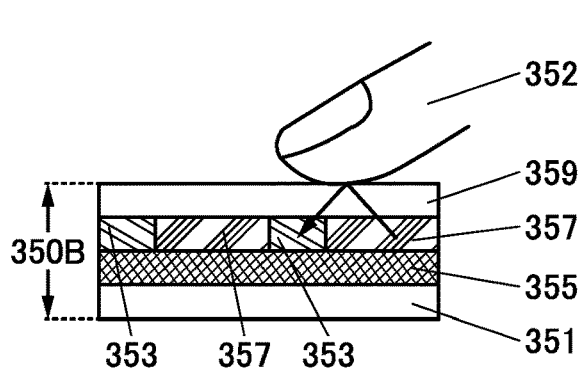
Figure 18D:
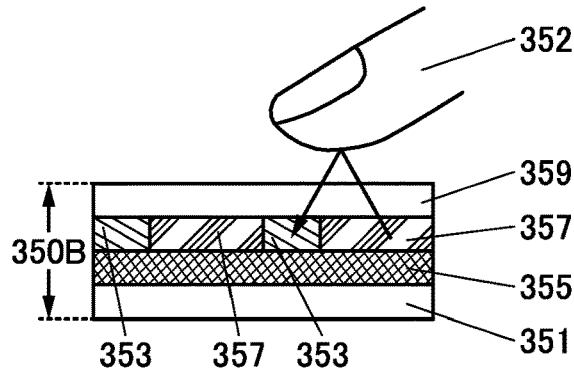

The display device of one embodiment of the present invention may have a function of detecting an object such as a finger that is touching the display device (FIG. 18C). Alternatively, the display device may have a function of detecting an object that is approaching (but is not touching) the display device (FIG. 18D). For example, after light emitted from the light-emitting element in the layer 357 including a light-emitting element is reflected by a finger 352 that touches or approaches the display device 350B as illustrated in FIG. 18C and FIG. 18D, the light-emitting and light-receiving element in the layer 353 including a light-emitting and light-receiving element senses the reflected light. Thus, the touch or approach of the finger 352 on/to the display device 350B can be detected.

[Pixel]

FIG. 18E to FIG. 18G and FIG. 19A to FIG. 19D illustrate examples of pixels. Note that the arrangement of subpixels is not limited to the illustrated order. For example, the positions of a subpixel 311B and a subpixel 311G may be reversed.

Figure 18E:
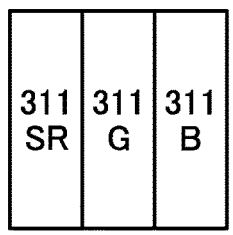
FIG. 18E to FIG. 18G are top views each showing an example of a pixel.

A pixel illustrated in FIG. 18E employs stripe arrangement and includes a subpixel 311SR that exhibits red light and has a light-receiving function, the subpixel 311G that exhibits green light, and the subpixel 311B that exhibits blue light. In a display device including a pixel composed of three subpixels of R, G, and B, a light-emitting element used in the R subpixel can be replaced with a light-emitting and light-receiving element, so that the display device can have a light-receiving function in the pixel.

Figure 18F:
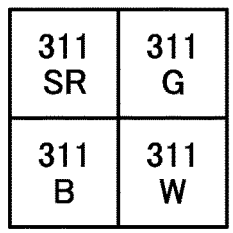

A pixel illustrated in FIG. 18F employs matrix arrangement and includes the subpixel 311SR that exhibits red light and has a light-receiving function, the subpixel 311G that exhibits green light, the subpixel 311B that exhibits blue light, and a subpixel 311W that exhibits white light. Also in a display device including a pixel composed of four subpixels of R, G, B, and W, a light-emitting element used in the R subpixel can be replaced with a light-emitting and light-receiving element, so that the display device can have a light-receiving function in the pixel.

Figure 18G:
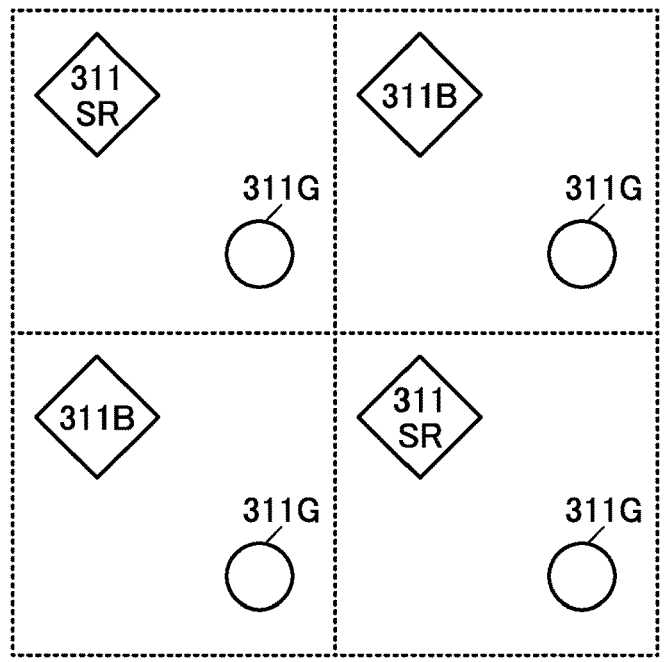

Pixels illustrated in FIG. 18G employ PenTile arrangement and each include subpixels emitting light of two colors that differ among the pixels. The upper-left pixel and the lower-right pixel in FIG. 18G each include the subpixel 311SR that exhibits red light and has a light-receiving function and the subpixel 311G that exhibits green light. The lower-left pixel and the upper-right pixel in FIG. 18G each include the subpixel 311G that exhibits green light and the subpixel 311B that exhibits blue light. Note that the shapes of the subpixels illustrated in FIG. 18G each indicate a top-surface shape of the light-emitting element or the light-emitting and light-receiving element included in the subpixel.

Figure 19A:
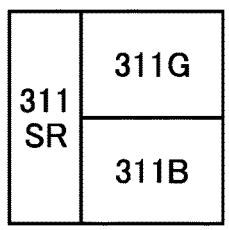
FIG. 19A to FIG. 19D are top views each showing an example of a pixel.

The pixels illustrated in FIG. 19A each include the subpixel 311SR that exhibits red light and has a light-receiving function, the subpixel 311G that exhibits green light, and the subpixel 311B that exhibits blue light. The subpixel 311SR is positioned in a column different from a column where the subpixel 311G and the subpixel 311B are positioned. The subpixel 311G and the subpixel 311B are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 19B:
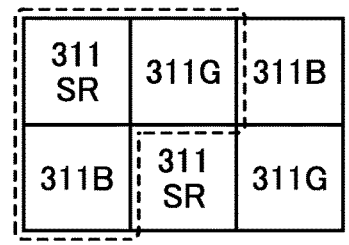

FIG. 19B shows two pixels, each of which is composed of three subpixels surrounded by dotted lines. The pixels illustrated in FIG. 19B each include the subpixel 311SR that exhibits red light and has a light-receiving function, the subpixel 311G that exhibits green light, and the subpixel 311B that exhibits blue light. In the pixel on the left in FIG. 19B, the subpixel 311G is positioned in the same row as the subpixel 311SR, and the subpixel 311B is positioned in the same column as the subpixel 311SR. In the pixel on the right in FIG. 19B, the subpixel 311G is positioned in the same row as the subpixel 311SR, and the subpixel 311B is positioned in the same column as the subpixel 311G. In every odd-numbered row and every even-numbered row of the pixel layout shown in FIG. 19B, the subpixel 311SR, the subpixel 311G, and the subpixel 311B are repeatedly arranged. In addition, subpixels of different colors are arranged in the odd-numbered row and the even-numbered row in every column.

Figure 19C:
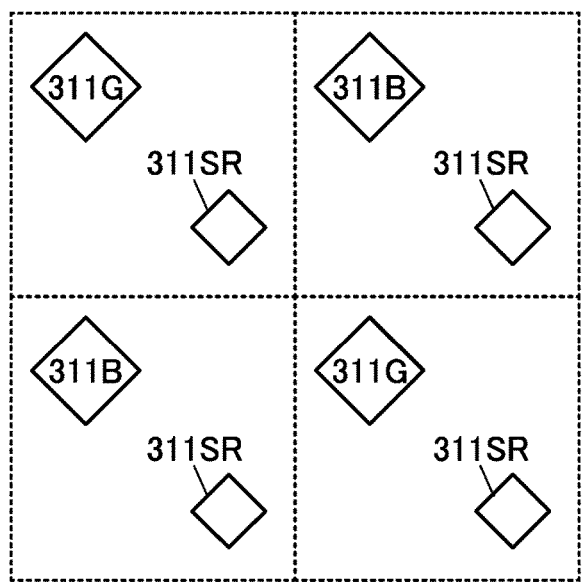

FIG. 19C is a modification example of the pixel arrangement in FIG. 18G. The upper-left pixel and the lower-right pixel in FIG. 19C each include the subpixel 311SR that exhibits red light and has a light-receiving function and the subpixel 311G that exhibits green light. The lower-left pixel and the upper-right pixel in FIG. 19C each include the subpixel 311SR that exhibits red light and has a light-receiving function and the subpixel 311B that exhibits blue light.

In FIG. 18G, the subpixel 311G that exhibits green light is provided in each pixel. In FIG. 19C, the subpixel 311SR that exhibits red light and has a light-receiving function is provided in each pixel. The structure illustrated in FIG. 19C achieves higher-resolution imaging than the structure illustrated in FIG. 18G because a subpixel having a light-receiving function is provided in each pixel. Thus, the accuracy of biometric authentication can be increased, for example.

The top-surface shape of the light-emitting elements and the light-emitting and light-receiving elements are not particularly limited and can be a circular shape, an elliptical shape, a polygonal shape, a polygonal shape with rounded corners, or the like. The top-surface shape of the light-emitting elements included in the subpixels 311G is circular in the example in FIG. 18G and square in the example in FIG. 19C. The top-surface shape of the light-emitting elements and the light-emitting and light-receiving elements may vary depending on the color thereof, or the light-emitting elements and the light-emitting and light-receiving elements of some colors or every color may have the same top-surface shape.

The aperture ratio of subpixels may vary depending on the color thereof, or may be the same among the subpixels of some colors or all colors. For example, the aperture ratio of a subpixel provided in each pixel (the subpixel 311G in FIG. 18G, and the subpixel 311SR in FIG. 19C) may be made lower than the aperture ratio of a subpixel of another color.

Figure 19D:
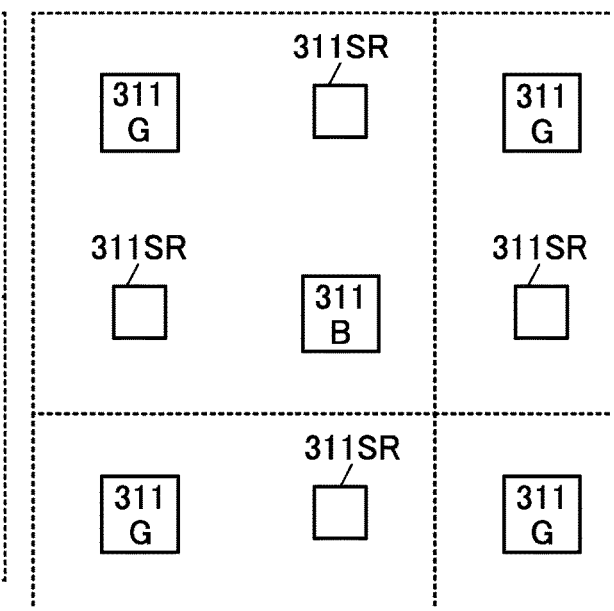

FIG. 19D shows a variation example of the pixel arrangement shown in FIG. 19C. Specifically, the structure of FIG. 19D is obtained by rotating the structure of FIG. 19C by 45°. Although one pixel is regarded as being composed of two subpixels in FIG. 19C, one pixel can be regarded as being composed of four subpixels as illustrated in FIG. 19D.

In the description with reference to FIG. 19D, one pixel is regarded as being composed of four subpixels surrounded by dotted lines. One pixel includes two subpixels 311SR, one subpixel 311G, and one subpixel 311B. The pixel including a plurality of subpixels having a light-receiving function allows high-resolution imaging. Accordingly, the accuracy of biometric authentication can be increased. For example, the resolution of imaging can be the square root of 2 times the resolution of display.

A display device that employs the structure illustrated in FIG. 19C or FIG. 19D includes p first light-emitting elements (p is an integer greater than or equal to 2), q second light-emitting elements (q is an integer greater than or equal to 2), and r light-emitting and light-receiving elements (r is an integer greater than p and greater than q). As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch detection is performed with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light.

As described above, the display device of one embodiment of the present invention can employ pixels with a variety of arrangements.

The pixel arrangement in the display device of this embodiment need not be changed when a light-receiving function is incorporated into pixels; thus, the display portion can be provided with one or both of an imaging function and a sensing function without a reduction in the aperture ratio and resolution.

[Light-Emitting and Light-Receiving Element]

FIG. 20A to FIG. 20E illustrate examples of layered structures of light-emitting and light-receiving elements.

The light-emitting and light-receiving element includes at least an active layer and a light-emitting layer between a pair of electrodes.

In addition to the active layer and the light-emitting layer, the light-emitting and light-receiving element may further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron-transport property and hole-transport property), or the like.

Figure 20A:
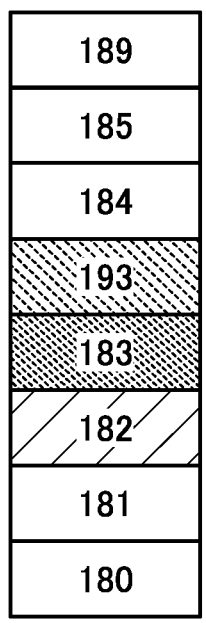
FIG. 20A to FIG. 20E are cross-sectional views each showing an example of a light-emitting and light-receiving element.
Figure 20B:
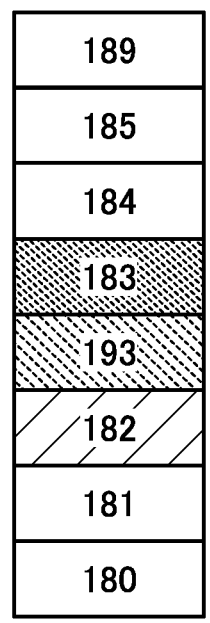
Figure 20C:
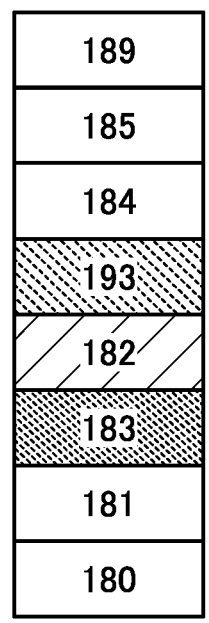

The light-emitting and light-receiving elements illustrated in FIG. 20A to FIG. 20C each include a first electrode 180, a hole-injection layer 181, a hole-transport layer 182, an active layer 183, a light-emitting layer 193, an electron-transport layer 184, an electron-injection layer 185, and a second electrode 189.

Note that each of the light-emitting and light-receiving elements illustrated in FIG. 20A to FIG. 20C can be regarded as having a structure where the active layer 183 is added to a light-emitting element. Therefore, the light-emitting and light-receiving element can be formed concurrently with the light-emitting element only by adding a step of forming the active layer 183 in the manufacturing process of the light-emitting element. The light-emitting element and the light-emitting and light-receiving element can be formed over one substrate. Thus, the display portion can be provided with one or both of an imaging function and a sensing function without a significant increase in the number of manufacturing steps.

The stacking order of the light-emitting layer 193 and the active layer 183 is not limited. FIG. 20A illustrates an example in which the active layer 183 is provided over the hole-transport layer 182 and the light-emitting layer 193 is provided over the active layer 183. FIG. 20B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 20A and FIG. 20B.

As illustrated in FIG. 20C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. FIG. 20C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, high emission efficiency can be obtained from the light-emitting and light-receiving element including the buffer layer between the active layer 183 and the light-emitting layer 193.

Figure 20D:
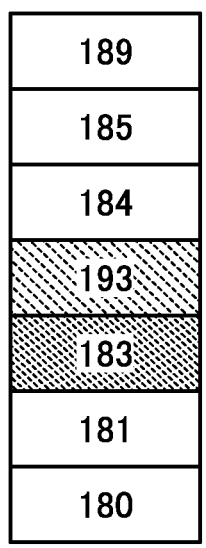

The light-emitting and light-receiving element illustrated in FIG. 20D is different from the light-emitting and light-receiving elements illustrated in FIG. 20A and FIG. 20C in not including the hole-transport layer 182. The light-emitting and light-receiving element may exclude at least one of the hole-injection layer 181, the hole-transport layer 182, the electron-transport layer 184, and the electron-injection layer 185. Furthermore, the light-emitting and light-receiving element may include another functional layer such as a hole-blocking layer or an electron-blocking layer.

Figure 20E:
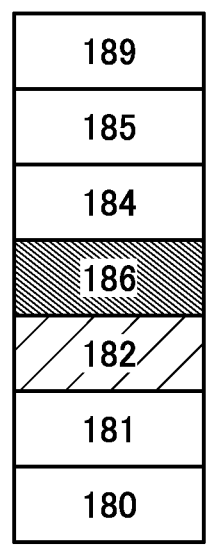

The light-emitting and light-receiving element illustrated in FIG. 20E is different from the light-emitting and light-receiving elements illustrated in FIG. 20A to FIG. 20C in including a layer 186 serving as both a light-emitting layer and an active layer instead of including the active layer 183 and the light-emitting layer 193.

As the layer 186 serving as both a light-emitting layer and an active layer, it is possible to use, for example, a layer containing three materials which are an n-type semiconductor that can be used for the active layer 183, a p-type semiconductor that can be used for the active layer 183, and a light-emitting substance that can be used for the light-emitting layer 193.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap each other and are further preferably positioned fully apart from each other.

In the light-emitting and light-receiving element, a conductive film that transmits visible light is used as the electrode through which light is extracted. A conductive film that reflects visible light is preferably used as the electrode through which light is not extracted.

When the light-emitting and light-receiving element is driven as a light-emitting element, the hole-injection layer is a layer that injects holes from the anode to the hole-transport layer. The hole-injection layer is a layer containing a material with a high hole-injection property. As the material with a high hole-injection property, it is possible to use, for example, a composite material containing a hole-transport material and an acceptor material (electron-accepting material) or an aromatic amine compound (compound having an aromatic amine skeleton).

When the light-emitting and light-receiving element is driven as a light-emitting element, the hole-transport layer serves as a layer that transports holes injected from the anode by the hole-injection layer, to the light-emitting layer. When the light-emitting and light-receiving element is driven as a light-receiving element, the hole-transport layer is a layer that transports holes generated in the active layer on the basis of incident light, to the anode. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, a material having a high hole-transport property, such as a π-electron rich heteroaromatic compound (e.g., a carbazole derivative, a thiophene derivative, and a furan derivative) or an aromatic amine compound is preferable.

When the light-emitting and light-receiving element is driven as a light-emitting element, the electron-transport layer serves as a layer that transports electrons injected from the cathode by the electron-injection layer, to the light-emitting layer. When the light-emitting and light-receiving element is driven as a light-receiving element, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

When the light-emitting and light-receiving element is driven as a light-emitting element, the electron-injection layer is a layer that injects electrons from the cathode to the electron-transport layer. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than the transient PL lifetime of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material contained in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. However, since fullerene has a spherical shape, fullerene has a high electron-accepting property even when π-electrons widely spread. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and an aromatic amine compound. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting substance, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer can be formed using either a low-molecular compound or a high-molecular compound and may contain an inorganic compound. Each of the layers can be formed by an evaporation method (including a vacuum evaporation method), a transfer method, a printing method, an inkjet method, a coating method, or the like.

Detailed structures of the light-emitting and light-receiving element and the light-emitting elements included in the display device of one embodiment of the present invention will be described below with reference to FIG. 21 to FIG. 23.

The display device of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

FIG. 21 to FIG. 23 illustrate top-emission display devices as examples.

Structure Example 1

Figure 21A:
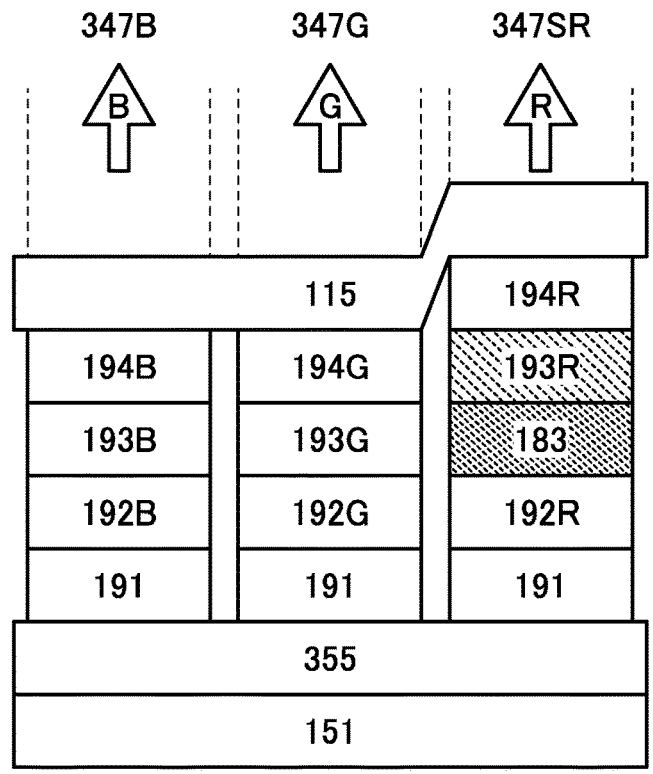
FIG. 21A and FIG. 21B are cross-sectional views each showing an example of a display device.
Figure 21B:
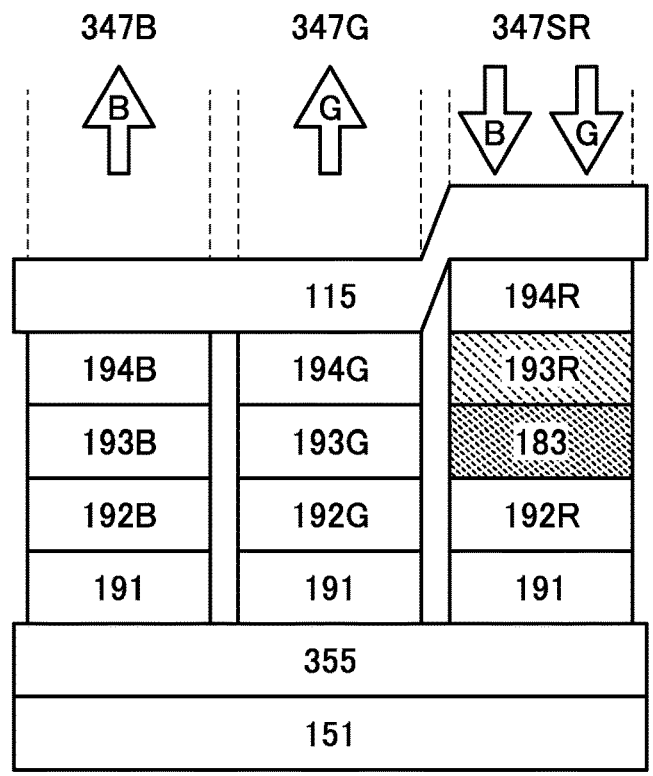

The display device illustrated in FIG. 21A and FIG. 21B includes a light-emitting element 347B that emits blue (B) light, a light-emitting element 347G that emits green (G) light, and a light-emitting and light-receiving element 347SR that emits red (R) light and has a light-receiving function over a substrate 151 with the layer 355 including transistors therebetween.

FIG. 21A shows the case where the light-emitting and light-receiving element 347SR functions as a light-emitting element. FIG. 21A illustrates an example in which the light-emitting element 347B emits blue light, the light-emitting element 347G emits green light, and the light-emitting and light-receiving element 347SR emits red light.

FIG. 21B shows the case where the light-emitting and light-receiving element 347SR functions as a light-receiving element. FIG. 21B illustrates an example in which the light-emitting and light-receiving element 347SR detects blue light emitted by the light-emitting element 347B and green light emitted by the light-emitting element 347G.

The light-emitting element 347B, the light-emitting element 347G, and the light-emitting and light-receiving element 347SR each include a pixel electrode 191 and a common electrode 115. In this embodiment, the case where the pixel electrode 191 functions as an anode and the common electrode 115 functions as a cathode is described as an example.

In the description in this embodiment, also in the light-emitting and light-receiving element 347SR, the pixel electrode 191 functions as an anode and the common electrode 115 functions as a cathode as in the light-emitting elements. In other words, when the light-emitting and light-receiving element 347SR is driven by application of reverse bias between the pixel electrode 191 and the common electrode 115, light incident on the light-emitting and light-receiving element 347SR can be detected and electric charge can be generated and extracted as current.

The common electrode 115 is shared by the light-emitting element 347B, the light-emitting element 347G, and the light-emitting and light-receiving element 347SR.

The material, thickness, and the like of the pair of electrodes can be the same in the light-emitting element 347B, the light-emitting element 347G, and the light-emitting and light-receiving element 347SR. Accordingly, the manufacturing cost of the display device can be reduced, and the manufacturing process can be simplified.

The structure of the display device illustrated in FIG. 21A and FIG. 21B will be specifically described.

The light-emitting element 347B includes a buffer layer 192B, a light-emitting layer 193B, and a buffer layer 194B in this order over the pixel electrode 191. The light-emitting layer 193B contains a light-emitting substance that emits blue light. The light-emitting element 347B has a function of emitting blue light.

The light-emitting element 347G includes a buffer layer 192G, a light-emitting layer 193G, and a buffer layer 194G in this order over the pixel electrode 191. The light-emitting layer 193G contains a light-emitting substance that emits green light. The light-emitting element 347G has a function of emitting green light.

The light-emitting and light-receiving element 347SR includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting and light-receiving element 347SR has a function of emitting red light. The light-emitting and light-receiving element 347SR has a function of detecting light emitted from at least one of the light-emitting element 347G and the light-emitting element 347B and preferably has a function of detecting light emitted from both of them.

The active layer 183 preferably contains an organic compound that does not easily absorb red light and absorbs light having a shorter wavelength than red light. Thus, the light-emitting and light-receiving element 347SR can have a function of efficiently emitting red light and a function of accurately detecting light having a shorter wavelength than red light.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a layered structure.

In the display device illustrated in FIG. 21A and FIG. 21B, the buffer layer, the active layer, and the light-emitting layer are formed in each element individually.

The buffer layers 192R, 192G, and 192B can each include one or both of a hole-injection layer and a hole-transport layer. Furthermore, the buffer layers 192R, 192G, and 192B may each include an electron-blocking layer. The buffer layers 194B, 194G, and 194R can each include one or both of an electron-injection layer and an electron-transport layer. Furthermore, the buffer layers 194R, 194G, and 194B may each include a hole-blocking layer. Note that the above description of the layers included in the light-emitting and light-receiving element can be referred to for materials and the like of the layers included in the light-emitting elements.

Structure Example 2

Figure 22A:
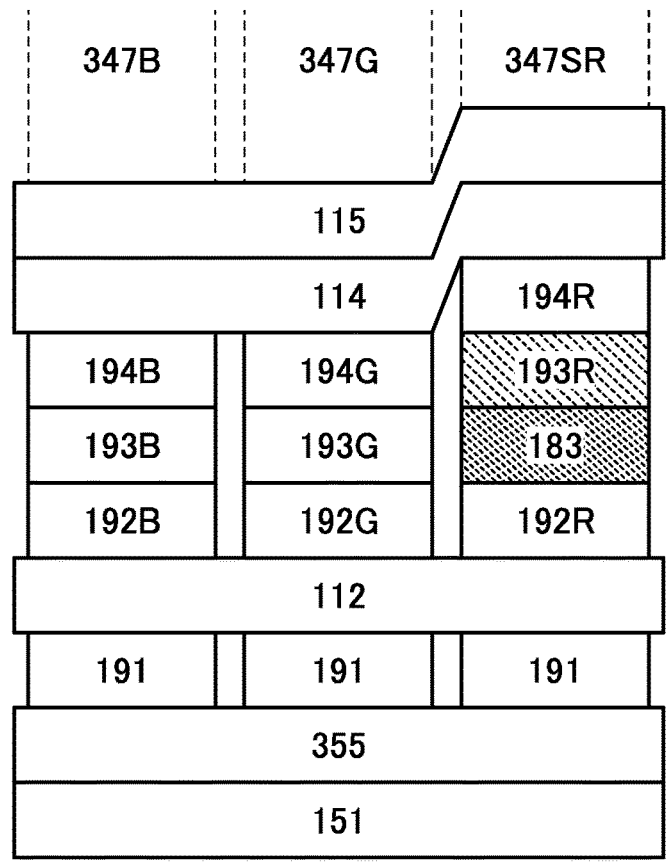
FIG. 22A and FIG. 22B are cross-sectional views each showing an example of a display device.
Figure 22B:
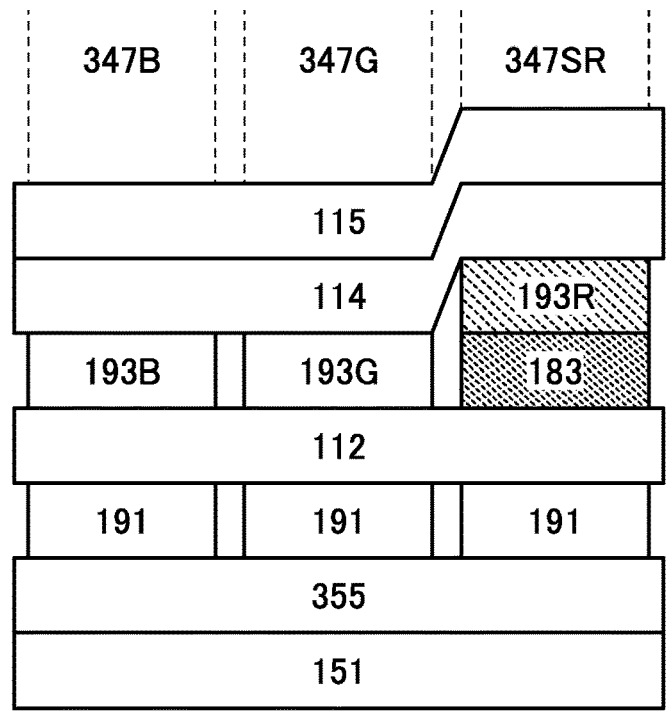

As illustrated in FIG. 22A and FIG. 22B, the light-emitting element 347B, the light-emitting element 347G, and the light-emitting and light-receiving element 347SR may include common layers between the pair of electrodes. Thus, the light-emitting and light-receiving element can be incorporated into the display device without a significant increase in the number of manufacturing steps.

The light-emitting element 347B, the light-emitting element 347G, and the light-emitting and light-receiving element 347SR illustrated in FIG. 22A include a common layer 112 and a common layer 114 in addition to the components illustrated in FIG. 21A and FIG. 21B.

The light-emitting element 347B, the light-emitting element 347G, and the light-emitting and light-receiving element 347SR illustrated in FIG. 22B are different from those illustrated in FIG. 21A and FIG. 21B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a layered structure.

Structure Example 3

Figure 23A:
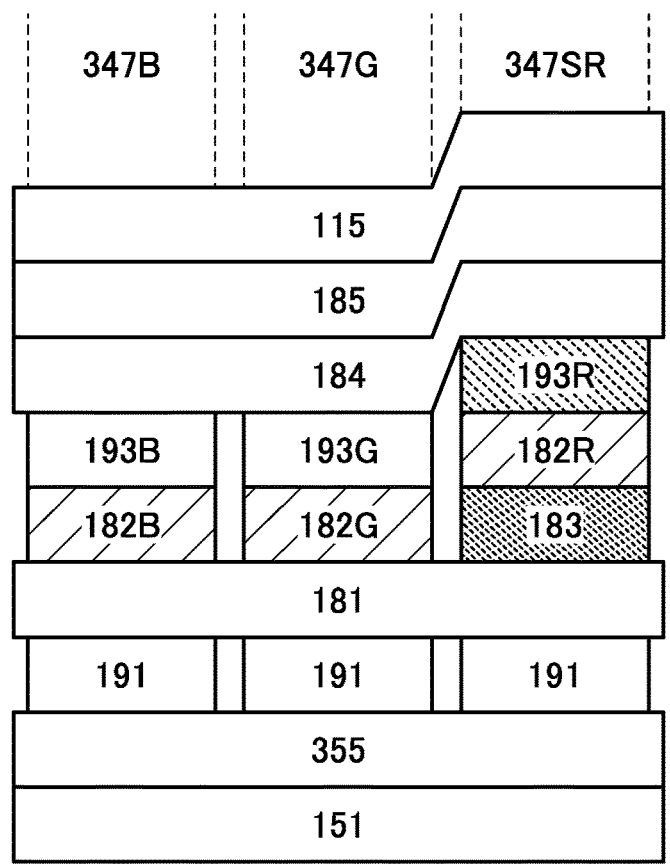
FIG. 23A and FIG. 23B are cross-sectional views each showing an example of a display device.

The display device illustrated in FIG. 23A is an example in which the light-emitting and light-receiving element 347SR employs the layered structure illustrated in FIG. 20C.

The light-emitting and light-receiving element 347SR includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting element included in the display device of this embodiment preferably employs a microcavity structure. Thus, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between both of the electrodes, whereby light emitted from the light-emitting element can be intensified.

Note that the transflective electrode can have a layered structure of a reflective electrode and an electrode having a property of transmitting visible light (also referred to as a transparent electrode). In this specification and the like, a reflective electrode functioning as part of a transflective electrode may be referred to as a pixel electrode or a common electrode, and a transparent electrode may be referred to as an optical adjustment layer; however, in some cases, a transparent electrode (optical adjustment layer) can also be regarded as having a function of a pixel electrode or a common electrode.

The transparent electrode has a light transmittance higher than or equal to 40%. For example, an electrode whose transmittance for visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting element. The reflectance of the transflective electrode for visible light and near-infrared light is greater than or equal to 10% and less than or equal to 95%, preferably greater than or equal to 30% and less than or equal to 80%. The reflectance of the reflective electrode for visible light and near-infrared light is greater than or equal to 40% and less than or equal to 100%, preferably greater than or equal to 70% and less than or equal to 100%. These electrodes preferably have a resistivity of $1 \times 10^{-2}$ Ωcm or lower.

The hole-transport layers 182B, 182G, and 182R may each have a function of an optical adjustment layer. Specifically, the thickness of the hole-transport layer 182B is preferably adjusted such that the optical distance between the pair of electrodes in the light-emitting element 347B intensifies blue light. Similarly, the thickness of the hole-transport layer 182G is preferably adjusted such that the optical distance between the pair of electrodes in the light-emitting element 347G intensifies green light. The thickness of the hole-transport layer 182R is preferably adjusted such that the optical distance between the pair of electrodes in the light-emitting and light-receiving element 347SR intensifies red light. The layer used as the optical adjustment layer is not limited to the hole-transport layer. Note that when the transflective electrode has a layered structure of a reflective electrode and a transparent electrode, the optical distance between the pair of electrodes represents the optical distance between a pair of reflective electrodes.

Structure Example 4

Figure 23B:
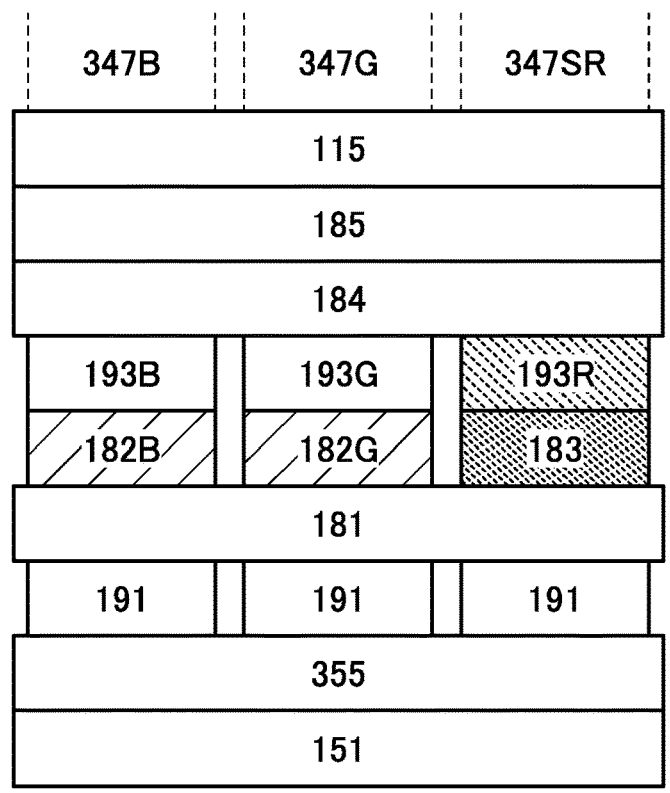

The display device illustrated in FIG. 23B is an example in which the light-emitting and light-receiving element 347SR employs the layered structure illustrated in FIG. 20D.

The light-emitting and light-receiving element 347SR includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting element 347G and the light-emitting element 347B and is not provided in the light-emitting and light-receiving element 347SR. In this manner, a layer provided in only one of the light-emitting element and the light-emitting and light-receiving element may exist in addition to the active layer and the light-emitting layer.

Detailed structures of the display device of one embodiment of the present invention will be described below with reference to FIG. 24 to FIG. 29.

[Display Device 310A]

Figure 24A:
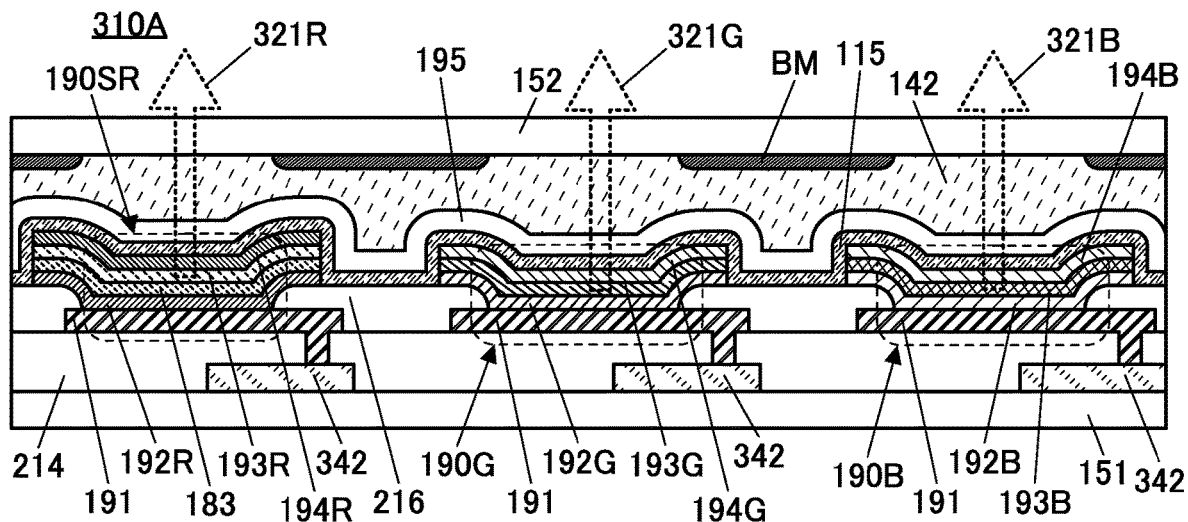
FIG. 24A and FIG. 24B are cross-sectional views each showing an example of a display device.
Figure 24B:
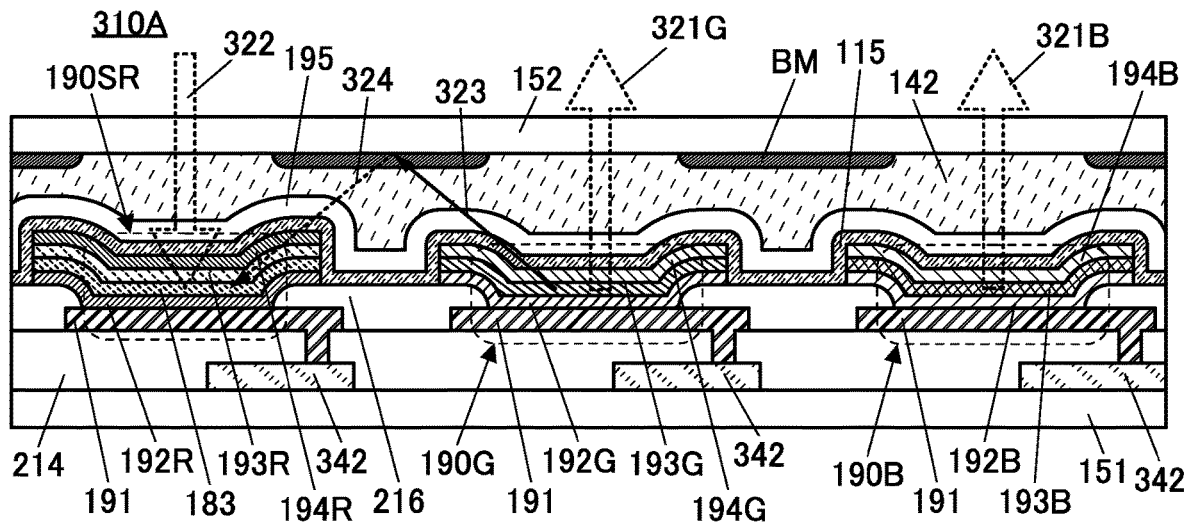

FIG. 24A and FIG. 24B are cross-sectional views of a display device 310A.

The display device 310A includes a light-emitting element 190B, a light-emitting element 190G, and a light-emitting and light-receiving element 190SR.

The light-emitting element 190B includes the pixel electrode 191, the buffer layer 192B, the light-emitting layer 193B, the buffer layer 194B, and the common electrode 115. The light-emitting element 190B has a function of emitting blue light 321B.

The light-emitting element 190G includes the pixel electrode 191, the buffer layer 192G, the light-emitting layer 193G, the buffer layer 194G, and the common electrode 115. The light-emitting element 190G has a function of emitting green light 321G.

The light-emitting and light-receiving element 190SR includes the pixel electrode 191, the buffer layer 192R, the active layer 183, the light-emitting layer 193R, the buffer layer 194R, and the common electrode 115. The light-emitting and light-receiving element 190SR has a function of emitting red light 321R and a function of detecting light 322.

FIG. 24A shows the case where the light-emitting and light-receiving element 190SR functions as a light-emitting element. FIG. 24A illustrates an example in which the light-emitting element 190B emits blue light, the light-emitting element 190G emits green light, and the light-emitting and light-receiving element 190SR emits red light.

FIG. 24B shows the case where the light-emitting and light-receiving element 190SR functions as a light-receiving element. FIG. 24B illustrates an example in which the light-emitting and light-receiving element 190SR detects blue light emitted by the light-emitting element 190B and green light emitted by the light-emitting element 190G.

The pixel electrode 191 is positioned over an insulating layer 214. An end portion of the pixel electrode 191 is covered with a partition 216. Two adjacent pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided in place of the partition 216.

The display device 310A includes the light-emitting and light-receiving element 190SR, the light-emitting element 190G, the light-emitting element 190B, a transistor 342, and the like between a pair of substrates (the substrate 151 and a substrate 152).

The light-emitting and light-receiving element 190SR has a function of detecting light. Specifically, the light-emitting and light-receiving element 190SR is a photoelectric conversion element that receives the light 322 incident from the outside of the display device 310A and converts it into an electric signal. The light 322 can also be referred to as light that is emitted from one or both of the light-emitting element 190G and the light-emitting element 190B and then reflected by an object. The light 322 may enter the light-emitting and light-receiving element 190SR through a lens.

The light-emitting element 190G and the light-emitting element 190B have a function of emitting visible light. Specifically, the light-emitting element 190G and the light-emitting element 190B are each an electroluminescent element that emits light to the substrate 152 side by voltage application between the pixel electrode 191 and the common electrode 115 (see the light 321G and the light 321B).

The buffer layer 192 (the buffer layer 192R, the buffer layer 192G, and the buffer layer 192B), the light-emitting layer 193 (the light-emitting layer 193R, the light-emitting layer 193G, and the light-emitting layer 193B), and the buffer layer 194 (the buffer layer 194R, the buffer layer 194G, and the buffer layer 194B) can also be referred to as organic layers (layers containing an organic compound) or EL layers. The pixel electrode 191 preferably has a function of reflecting visible light. The common electrode 115 has a function of transmitting visible light.

The pixel electrode 191 is electrically connected to a source or a drain of the transistor 342 through an opening provided in the insulating layer 214. The transistor 342 has a function of controlling the driving of the light-emitting element or the light-emitting and light-receiving element.

At least part of a circuit electrically connected to the light-emitting and light-receiving element 190SR is preferably formed using the same material in the same steps as a circuit electrically connected to the light-emitting element 190G and the light-emitting element 190B. In this case, the thickness of the display device can be reduced compared with the case where the two circuits are separately formed, resulting in simplification of the manufacturing process.

The light-emitting and light-receiving element 190SR, the light-emitting element 190G, and the light-emitting element 190B are preferably covered with a protective layer 195. In FIG. 24A and the like, the protective layer 195 is provided over and in contact with the common electrode 115. Providing the protective layer 195 can inhibit entry of impurities into the light-emitting and light-receiving element 190SR, the light-emitting elements of different colors, and the like, and improve the reliabilities of the light-emitting and light-receiving element 190SR and the light-emitting elements of the different colors. The protective layer 195 and the substrate 152 are bonded to each other with an adhesive layer 142.

A light-blocking layer BM is provided on a surface of the substrate 152 that faces the substrate 151. The light-blocking layer BM has openings at positions overlapping the light-emitting element 190G and the light-emitting element 190B and a position overlapping the light-emitting and light-receiving element 190SR. Note that in this specification and the like, the position overlapping the light-emitting element 190G or the light-emitting element 190B refers specifically to a position overlapping a light-emitting region of the light-emitting element 190G or the light-emitting element 190B. Similarly, the position overlapping the light-emitting and light-receiving element 190SR refers specifically to a position overlapping a light-emitting region and a light-receiving region of the light-emitting and light-receiving element 190SR.

As illustrated in FIG. 24B, the light-emitting and light-receiving element 190SR is capable of detecting light that is emitted from the light-emitting element 190G or the light-emitting element 190B and then reflected by an object. However, in some cases, light emitted from the light-emitting element 190G or the light-emitting element 190B is reflected inside the display device 310A and enters the light-emitting and light-receiving element 190SR without via an object. The light-blocking layer BM can reduce the influence of such stray light. For example, in the case where the light-blocking layer BM is not provided, light 323 emitted from the light-emitting element 190G is reflected by the substrate 152 and reflected light 324 enters the light-emitting and light-receiving element 190SR in some cases. Providing the light-blocking layer BM can inhibit the reflected light 324 from entering the light-emitting and light-receiving element 190SR. Consequently, noise can be reduced, and the sensitivity of a sensor using the light-emitting and light-receiving element 190SR can be increased.

For the light-blocking layer BM, a material that blocks light emitted from the light-emitting elements can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a layered structure of a red color filter, a green color filter, and a blue color filter.

[Display Device 310B]

Figure 25A:
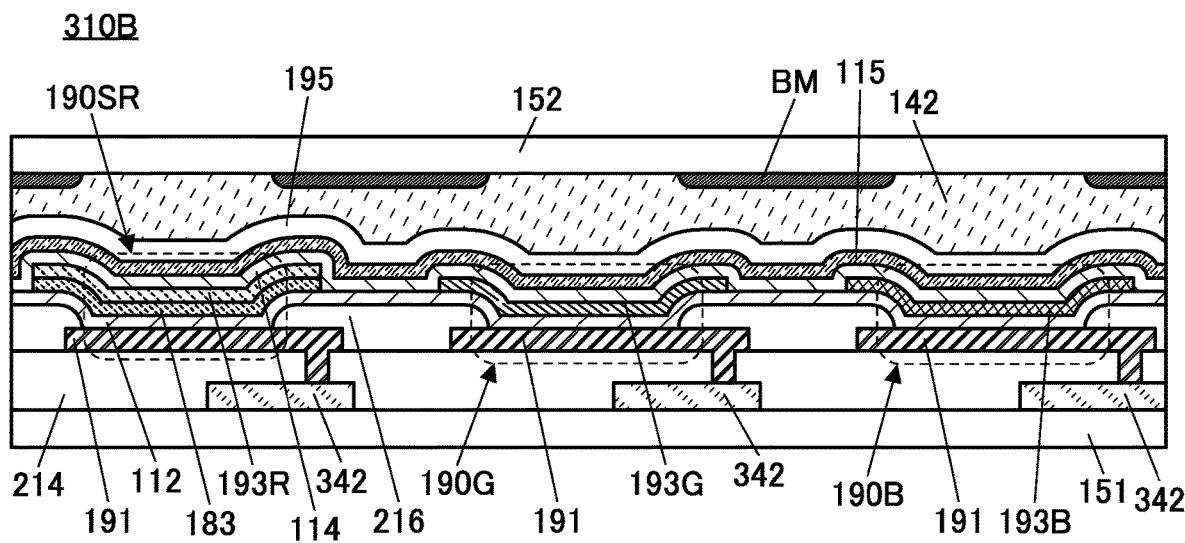
FIG. 25A and FIG. 25B are cross-sectional views each showing an example of a display device.

A display device 310B illustrated in FIG. 25A is different from the display device 310A in that each of the light-emitting element 190G, the light-emitting element 190B, and the light-emitting and light-receiving element 190SR does not include the buffer layer 192 and the buffer layer 194 and includes the common layer 112 and the common layer 114. Note that in the following description of the display device, components similar to those of the above-mentioned display device are not described in some cases.

Note that the layered structure of the light-emitting element 190B, the light-emitting element 190G, and the light-emitting and light-receiving element 190SR is not limited to the structures in the display devices 310A and 310B. For example, any of the layered structures illustrated in FIG. 20 to FIG. 23 can be appropriately used for each element.

[Display Device 310C]

Figure 25B:
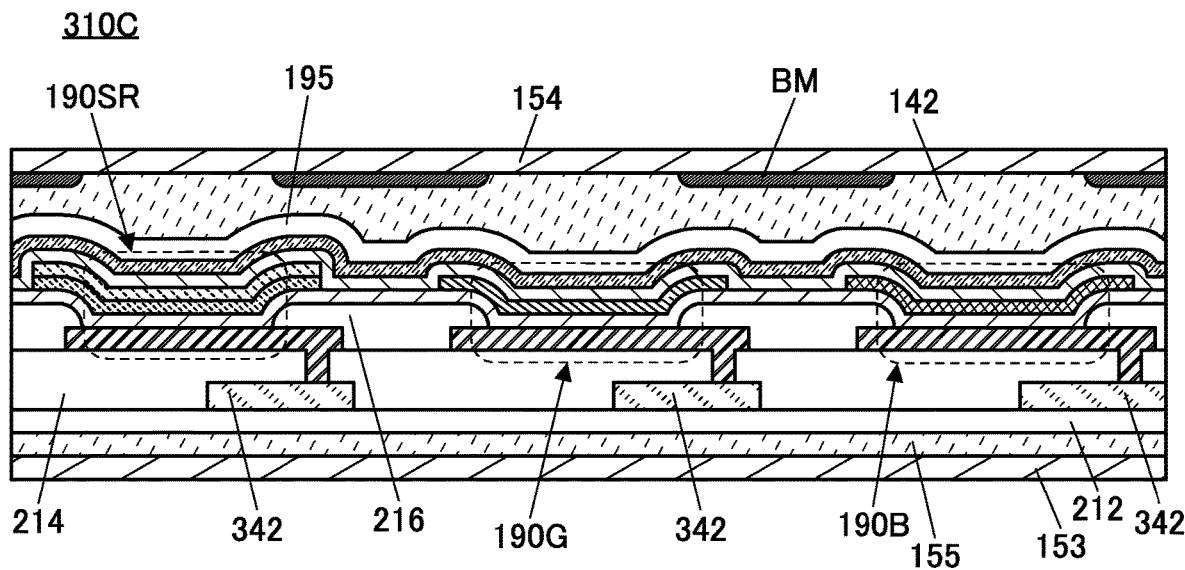

A display device 310C in FIG. 25B is different from the display device 310B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 310C has a structure obtained in the following manner: the insulating layer 212, the transistor 342, the light-emitting and light-receiving element 190SR, the light-emitting element 190G, the light-emitting element 190B, and the like are formed over a formation substrate and then transferred onto the substrate 153. The substrate 153 and the substrate 154 preferably have flexibility. Accordingly, the flexibility of the display device 310C can be increased. For example, a resin is preferably used for the substrate 153 and the substrate 154.

For the substrate 153 and the substrate 154, it is possible to use, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

Detailed structures of the display device of one embodiment of the present invention will be described below with reference to FIG. 26 to FIG. 29.

[Display Device 100A]

Figure 26:
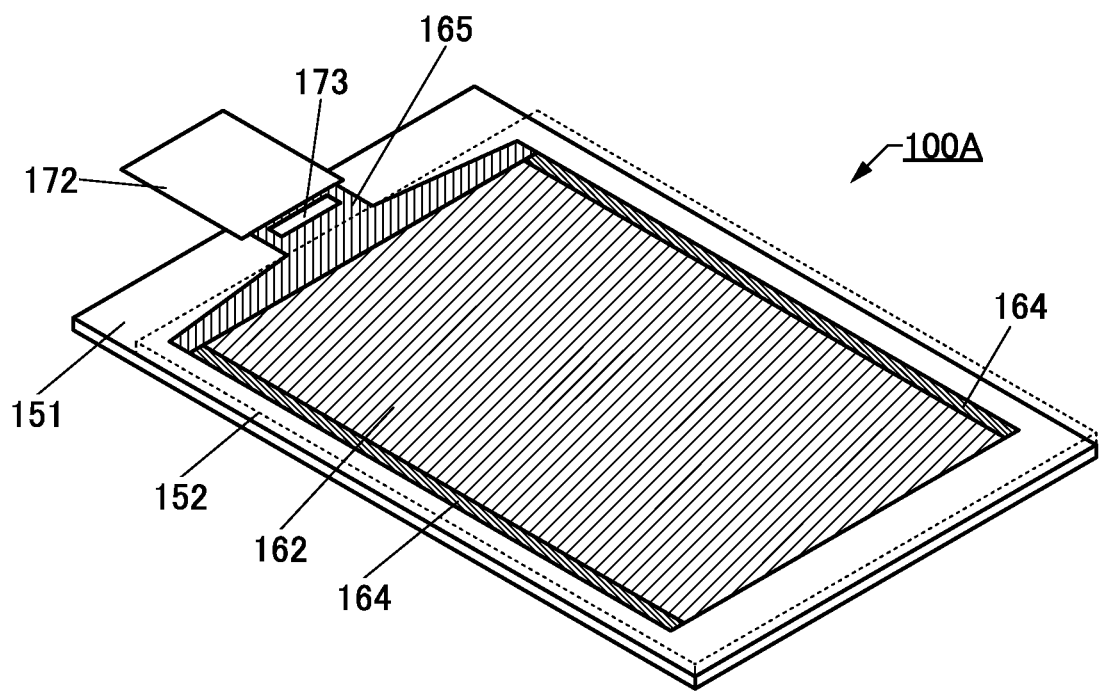
FIG. 26 is a perspective view showing an example of a display device.
Figure 27:
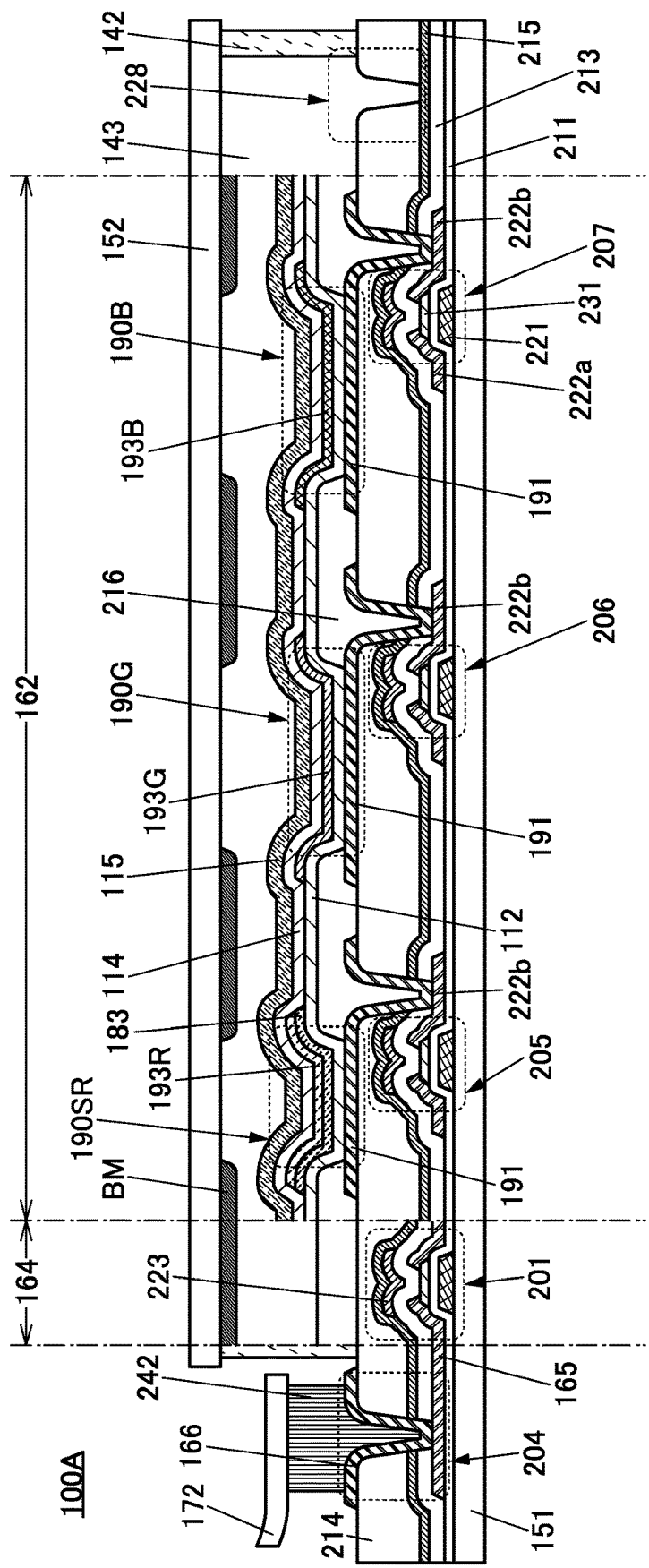
FIG. 27 is a cross-sectional view showing an example of a display device.
Figure 28:
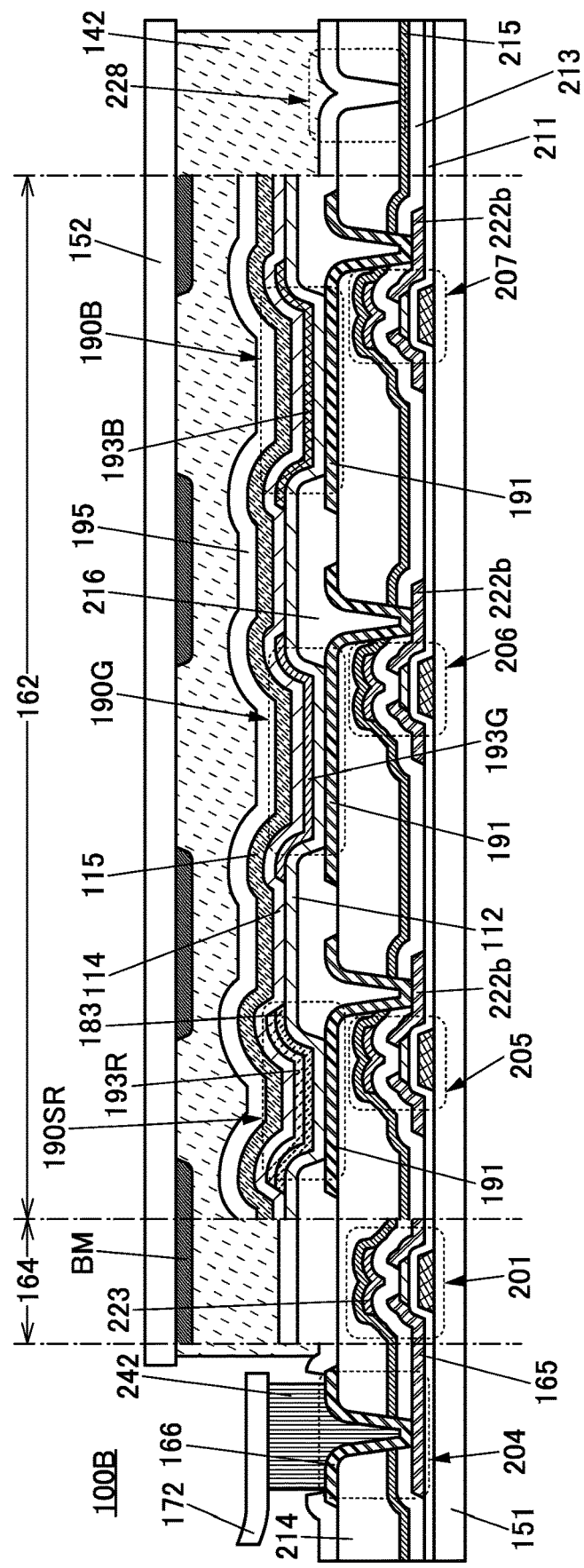
FIG. 28 is a cross-sectional view showing an example of a display device.

FIG. 26 is a perspective view of a display device 100A, and FIG. 27 is a cross-sectional view of the display device 100A.

The display device 100A has a structure in which the substrate 152 and the substrate 151 are bonded to each other. In FIG. 26, the substrate 152 is denoted by a dashed line.

The display device 100A includes a display portion 162, a circuit 164, a wiring 165, and the like. FIG. 26 illustrates an example in which the display device 100A is provided with an IC (integrated circuit) 173 and an FPC 172. Thus, the structure illustrated in FIG. 26 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 26 illustrates an example in which the IC 173 is provided over the substrate 151 by a COG (Chip On Glass) method, a COF (Chip on Film) method, or the like. An IC including a scan line driver circuit or a signal line driver circuit, for example, can be used as the IC 173. Note that the display device 100A and the display module may have a structure not including an IC. The IC may be mounted on the FPC by a COF method or the like.

FIG. 27 illustrates an example of cross sections of part of a region including the FPC 172, part of a region including the circuit 164, part of a region including the display portion 162, and part of a region including an end portion of the display device 100A illustrated in FIG. 26.

The display device 100A illustrated in FIG. 27 includes a transistor 201, a transistor 205, a transistor 206, a transistor 207, the light-emitting element 190B, the light-emitting element 190G, the light-emitting and light-receiving element 190SR, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190B, the light-emitting element 190G, and the light-emitting and light-receiving element 190SR. In FIG. 27, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap the light-emitting element 190B, the light-emitting element 190G, and the light-emitting and light-receiving element 190SR. The space 143 surrounded by the substrate 152, the adhesive layer 142, and the insulating layer 214 may be filled with a resin different from that of the adhesive layer 142.

The light-emitting element 190B has a layered structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a layered structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting element 190G.

The light-emitting and light-receiving element 190SR has a layered structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting and light-receiving element 190SR.

Light emitted from the light-emitting element 190B, the light-emitting element 190G, and the light-emitting and light-receiving element 190SR is emitted toward the substrate 152. Light enters the light-emitting and light-receiving element 190SR through the substrate 152 and the space 143.

For the substrate 152, a material that has a high transmitting property with respect to visible light is preferably used.

The pixel electrodes 191 can be formed using the same material in the same step. The common layer 112, the common layer 114, and the common electrode 115 are used in common in the light-emitting element 190B, the light-emitting element 190G, and the light-emitting and light-receiving element 190SR. The light-emitting and light-receiving element 190SR has the structure of a red-light-emitting element to which the active layer 183 is added. Moreover, the light-emitting element 190B, the light-emitting element 190G, and the light-emitting and light-receiving element 190SR can have a common structure except for the active layer 183 and the light-emitting layer 193 of each color. Thus, the display portion 162 of the display device 100A can have a light-receiving function without a significant increase in the number of manufacturing steps.

The light-blocking layer BM is provided on a surface of the substrate 152 that faces the substrate 151. The light-blocking layer BM has openings at positions overlapping the light-emitting element 190B, the light-emitting element 190G, and the light-emitting and light-receiving element 190SR. Providing the light-blocking layer BM can control the range where the light-emitting and light-receiving element 190SR senses light. Furthermore, with the light-blocking layer BM, light can be inhibited from directly entering the light-emitting and light-receiving element 190SR from the light-emitting element 190G or the light-emitting element 190B without via any object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit impurities from diffusing from the outside into the transistors and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like, which is an inorganic insulating film, can be used. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 27, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

The transistor 201, the transistor 205, the transistor 206, and the transistor 207 each include a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors; any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon and single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer. Alternatively, it is preferable to use an oxide containing indium, gallium, zinc, and tin. Alternatively, it is preferable to use an oxide containing indium and zinc.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, InM:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=10:1:3 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that is not overlapped by the substrate 152. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, or an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, and tungsten, and an alloy containing any of these metals as its main component. A film containing any of these materials can be used as a single layer or in a layered structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium is preferably used, in which case the conductivity can be increased. These materials can also be used, for example, for conductive layers such as a variety of wirings and electrodes included in a display device, or conductive layers (conductive layers functioning as a pixel electrode and a common electrode) included in a light-emitting element and a light-emitting and light-receiving element.

Examples of an insulating material that can be used for each insulating layer include a resin such as an acrylic resin or an epoxy resin, and an inorganic insulating material such as silicon oxide, silicon oxynitride, silicon nitride oxide, silicon nitride, or aluminum oxide.

[Display Device 100B]

FIG. 28A is a cross-sectional view of a display device 100B.

The display device 100B is different from the display device 100A mainly in including the protective layer 195. Detailed description of a structure similar to that of the display device 100A is omitted.

Providing the protective layer 195 that covers the light-emitting element 190B, the light-emitting element 190G, and the light-emitting and light-receiving element 190SR can inhibit entry of impurities such as water into the light-emitting element 190B, the light-emitting element 190G, and the light-emitting and light-receiving element 190SR, leading to an increase in the reliability of the light-emitting element 190B, the light-emitting element 190G, and the light-emitting and light-receiving element 190SR.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Consequently, the reliability of the display device 100B can be increased.

The protective layer 195 may have a single-layer structure or a layered structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping the light-emitting and light-receiving element 190SR. Thus, the sensitivity and accuracy of a sensor using the light-emitting and light-receiving element 190SR can be increased.

The lens preferably has a refractive index greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

In the display device 100B, the protective layer 195 and the substrate 152 are bonded to each other with the adhesive layer 142. The adhesive layer 142 is provided to overlap the light-emitting element 190B, the light-emitting element 190G, and the light-emitting and light-receiving element 190SR; that is, the display device 100B employs a solid sealing structure.

[Display Device 100C]

FIG. 29A is a cross-sectional view of a display device 100C.

The display device 100C is different from the display device 100B in transistor structures.

The display device 100C includes a transistor 208, a transistor 209, and a transistor 210 over the substrate 151.

The transistor 208, the transistor 209, and the transistor 210 each include the conductive layer 221 functioning as a gate, the insulating layer 211 functioning as a gate insulating layer, a semiconductor layer including a channel formation region 231$i$ and a pair of low-resistance regions 231$n$, the conductive layer 222$a$ connected to one of the pair of low-resistance regions 231$n$, the conductive layer 222$b$ connected to the other of the pair of low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are connected to the corresponding low-resistance regions 231$n$ through openings provided in the insulating layer 225 and the insulating layer 215. One of the conductive layer 222$a$ and the conductive layer 222$b$ serves as a source, and the other serves as a drain.

The pixel electrode 191 of the light-emitting element 190G is electrically connected to one of the pair of low-resistance regions 231$n$ of the transistor 208 through the conductive layer 222$b$.

The pixel electrode 191 of the light-emitting and light-receiving element 190SR is electrically connected to the other of the pair of low-resistance regions 231$n$ of the transistor 209 through the conductive layer 222$b$.

FIG. 29A illustrates an example in which the insulating layer 225 covers the top surface and a side surface of the semiconductor layer. Meanwhile, in a transistor 202 illustrated in FIG. 29B, the insulating layer 225 overlaps the channel formation region 231$i$ of the semiconductor layer 231 and does not overlap the low-resistance regions 231$n$. The structure illustrated in FIG. 29B can be obtained by processing the insulating layer 225 using the conductive layer 223 as a mask, for example. In FIG. 29B, the insulating layer 215 is provided to cover the insulating layer 225 and the conductive layer 223, and the conductive layer 222$a$ and the conductive layer 222$b$ are connected to the corresponding low-resistance regions 231$n$ through openings in the insulating layer 215. Furthermore, an insulating layer 218 covering the transistor may be provided.

In addition, the display device 100C is different from the display device 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display device 100C is formed in the following manner: the insulating layer 212, the transistor 208, the transistor 209, the transistor 210, the light-emitting and light-receiving element 190SR, the light-emitting element 190G, and the like are formed over a formation substrate and then transferred onto the substrate 153. The substrate 153 and the substrate 154 preferably have flexibility. Accordingly, the flexibility of the display device 100C can be increased.

The inorganic insulating film that can be used as the insulating layer 211, the insulating layer 213, and the insulating layer 215 can be used as the insulating layer 212.

In the display device of this embodiment, a subpixel exhibiting light of any of the colors includes a light-emitting and light-receiving element instead of a light-emitting element as described above. The light-emitting and light-receiving element functions as both a light-emitting element and a light-receiving element, whereby the pixel can have a light-receiving function without an increase in the number of subpixels included in the pixel. Moreover, the pixel can have a light-receiving function without a reduction in the resolution of the display device, the aperture ratio of each subpixel, or the like.

At least part of this embodiment can be implemented in combination with the other embodiments described in this specification as appropriate.

Embodiment 3

Described in this embodiment is a metal oxide (also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass is in an amorphous state. Furthermore, not a halo pattern but a spot-like pattern is observed in the diffraction pattern of the IGZO film formed at room temperature. Thus, it is suggested that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the one described above when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with an uniform lattice arrangement and another region with an uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions described above is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction described above, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions randomly exist to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. The ratio of the flow rate of the oxygen gas to the total flow rate of the film formation gas in film formation is preferably as low as possible; for example, the ratio of the flow rate of the oxygen gas to the total flow rate of the film formation gas in film formation is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

In the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon, carbon, or the like, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Accordingly, a transistor using an oxide semiconductor containing an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices of embodiments of the present invention will be described with reference to FIG. 30 to FIG. 32.

An electronic device in this embodiment includes the display device of one embodiment of the present invention. For example, the display device of one embodiment of the present invention can be used in a display portion of the electronic device. The display device of one embodiment of the present invention has a function of sensing light, and thus can perform biological authentication with the display portion or detect a touch operation (a contact or an approach), for example. Consequently, the electronic device can have improved functionality and convenience, for example.

Examples of electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 30A:
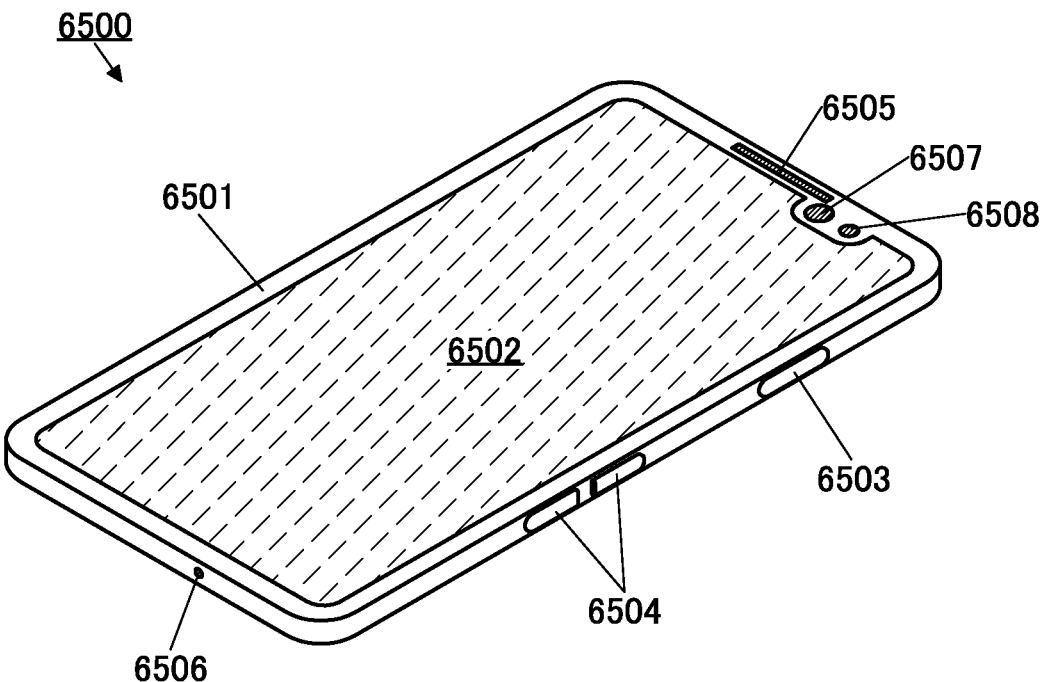
FIG. 30A and FIG. 30B are diagrams showing an example of an electronic device.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 30B:
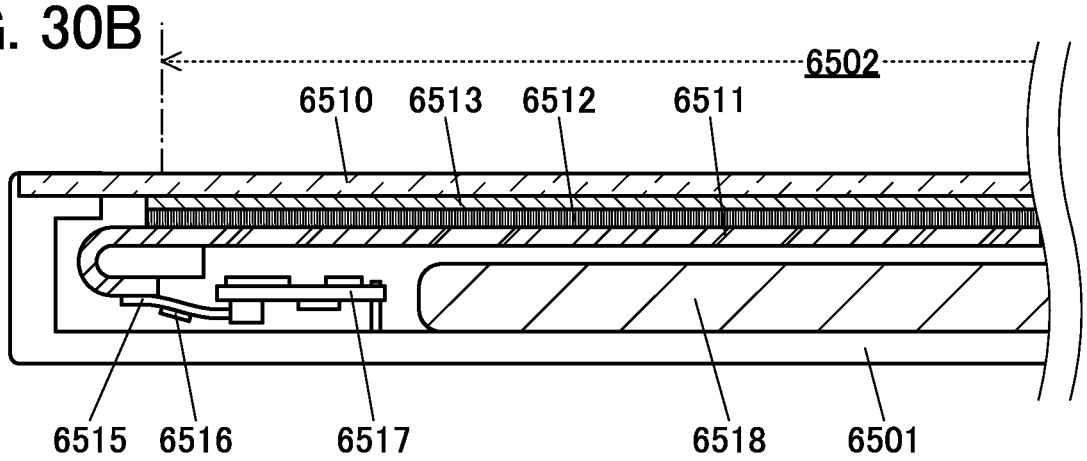

FIG. 30B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. An electronic device with a narrow frame can be achieved when part of the display panel 6511 is folded back so that the portion connected to the FPC 6515 is provided on the rear side of a pixel portion.

Using the display device of one embodiment of the present invention as the display panel 6511 allows imaging on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 31A:
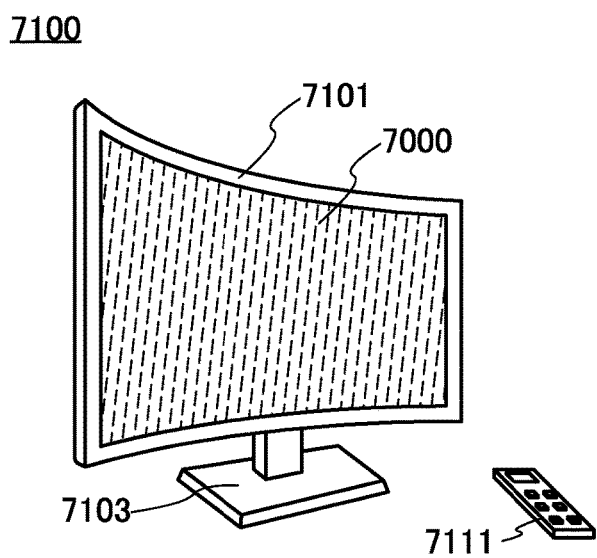
FIG. 31A to FIG. 31D are diagrams each showing an example of an electronic device.

FIG. 31A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 31A can be performed with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be controlled, and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 31B:
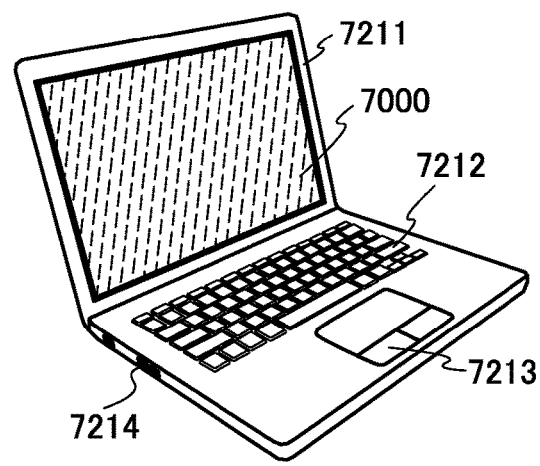

FIG. 31B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 31C:
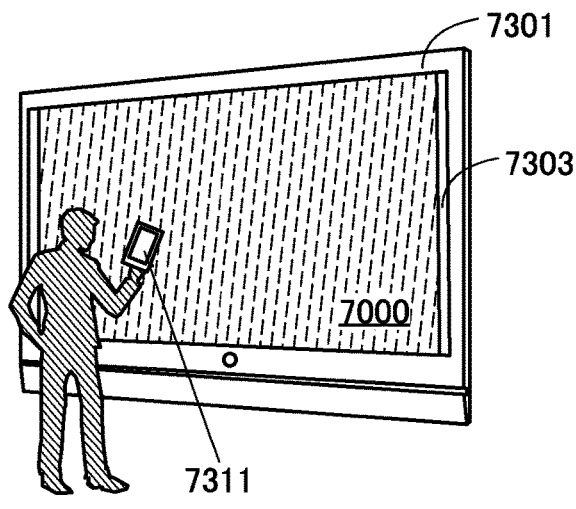
Figure 31D:
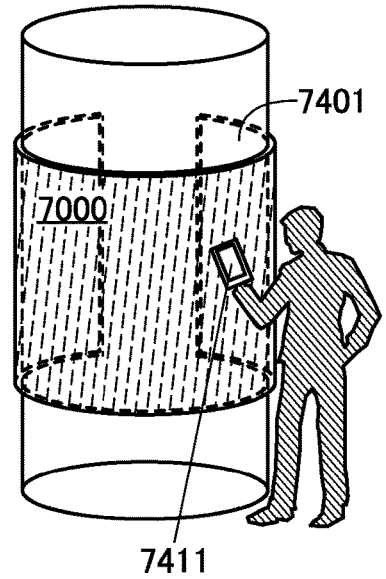

FIG. 31C and FIG. 31D illustrate examples of digital signage.

Digital signage 7300 illustrated in FIG. 31C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 31D shows digital signage 7400 attached to a cylindrical pillar 7401. The digital signage 7400 includes the display portion 7000 provided along a curved surface of the pillar 7401.

The display device of one embodiment of the present invention can be used in the display portion 7000 in FIG. 31C and FIG. 31D.

A larger area of the display portion 7000 can increase the amount of information that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 31C and FIG. 31D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 32A to FIG. 32F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 32A to FIG. 32F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image, a moving image, or the like and storing the taken image in a recording medium (an external recording medium or a recording medium incorporated in the camera), a function of displaying the taken image on the display portion, or the like.

The details of the electronic devices illustrated in FIG. 32A to FIG. 32F are described below.

Figure 32A:
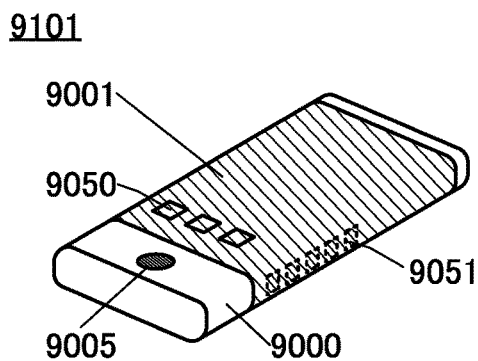
FIG. 32A to FIG. 32F are diagrams each showing an example of an electronic device.

FIG. 32A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters, image information, or the like on its plurality of surfaces. FIG. 32A shows an example where three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icons 9050 or the like may be displayed at the position where the information 9051 is displayed.

Figure 32B:
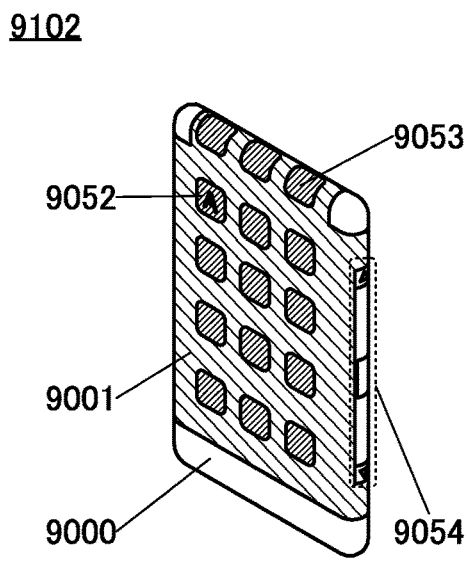

FIG. 32B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 32C:
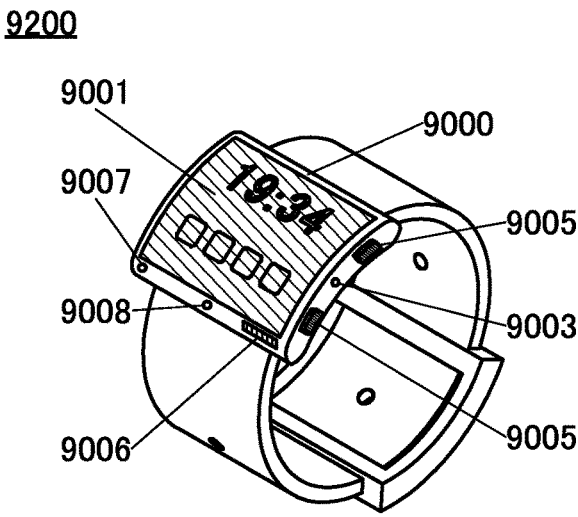

FIG. 32C is a perspective view illustrating a watch-type portable information terminal 9200. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging, for example. Note that the charging operation may be performed by wireless power feeding.

Figure 32D:
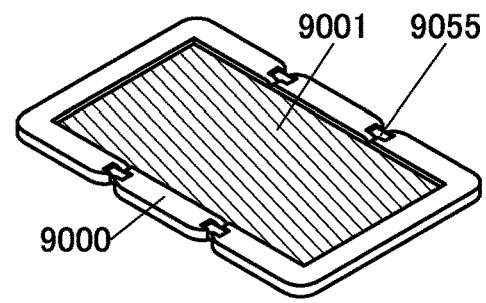
Figure 32E:
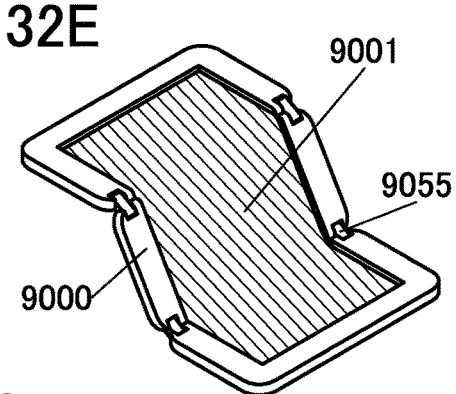
Figure 32F:
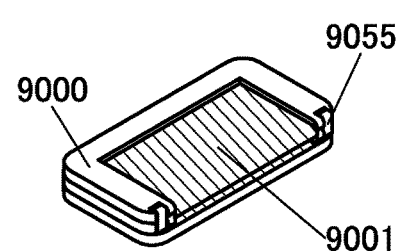

FIG. 32D to FIG. 32F are perspective views illustrating a foldable portable information terminal 9201. FIG. 32D is a perspective view of an opened state of the portable information terminal 9201, FIG. 32F is a perspective view of a folded state thereof, and FIG. 32E is a perspective view of a state in the middle of change from one of FIG. 32D and FIG. 32F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

SA: light-emitting and light-receiving element: Tr1 and Tr2: transistor: SW1 to SW4: switch: CS1 and CS2: capacitor: SL: wiring: WX: wiring: AL: wiring: CL: wiring: VCP: wiring: VPI: wiring: VL1: wiring: SR: light-emitting and light-receiving element: ELG: light-emitting element: ELB: light-emitting element: M1 to M3: transistor: M10 to M14: transistor: C1 and C2: capacitor: GL: wiring: TX: wiring: SE: wiring: RS: wiring: REN: wiring: SL1 to SL3: wiring: V0L: wiring: 10: display device: 11: display portion: 12: driving circuit portion: 13: driving circuit portion: 14: driving circuit portion: 15: circuit portion: 20B: subpixel: 20G: subpixel: 20R: subpixel: 21B: circuit: 21G: circuit: 21R: circuit: 22: circuit: 30: pixel: 30B: pixel: 30G: pixel

The invention claimed is:

1. A display device comprising:
   first to third switches, a first transistor, a second transistor, a capacitor, a first wiring, a second wiring, and a light-emitting and light-receiving element,
   wherein one electrode of the first switch is electrically connected to the first wiring, and the other electrode of the first switch is directly connected to a gate of the first transistor and one electrode of the capacitor,
   wherein one electrode of the second switch is directly connected to one of a source and a drain of the first transistor, one electrode of the light-emitting and light-receiving element, and the other electrode of the capacitor, and the other electrode of the second switch is directly connected to a gate of the second transistor and one electrode of the third switch,
   wherein the other electrode of the third switch is electrically connected to the second wiring, and
   wherein the light-emitting and light-receiving element is configured to emit light of a first color and is configured to receive light of a second color.

2. The display device according to claim 1,
   wherein, in a first period, the first switch, the second switch, and the third switch are in a conduction state, a data potential is supplied to the first wiring, and a first potential is supplied to the second wiring,
   wherein, in a second period, the second switch and the third switch are in a conduction state, and a second potential is supplied to the second wiring, and
   wherein the second potential is lower than the first potential.

3. The display device according to claim 1, further comprising a fourth switch,
   wherein one electrode of the fourth switch is electrically connected to the one electrode of the second switch, and the other electrode is electrically connected to the one electrode of the light-emitting and light-receiving element.

4. The display device according to claim 1, further comprising a fourth switch,
   wherein one electrode of the fourth switch is electrically connected to the one of the source and the drain of the first transistor, and the other electrode of the fourth switch is electrically connected to the one electrode of the light-emitting and light-receiving element.

5. The display device according to claim 1, further comprising a light-emitting element,
   wherein the light-emitting element is configured to emit light of the second color, and
   wherein the light-emitting and light-receiving element and the light-emitting element are provided on the same plane.

6. The display device according to claim 5,
   wherein the light-emitting and light-receiving element includes a first pixel electrode, a first light-emitting layer, an active layer, and a first electrode,
   wherein the light-emitting element includes a second pixel electrode, a second light-emitting layer, and the first electrode, and
   wherein the first pixel electrode and the second pixel electrode are formed by processing the same conductive film.

7. A display module comprising the display device according to claim 1, and a connector or an integrated circuit.

8. An electronic device comprising the display module according to claim 7, and at least one of an antenna, a battery, a housing, a camera, a speaker, a microphone, a touch sensor, and an operation button.

9. A display device comprising:
   first to sixth transistors, a capacitor, a light-emitting and light-receiving element, a first wiring, and a second wiring,
   wherein one of a source and a drain of the first transistor is electrically connected to one electrode of the light-emitting and light-receiving element,
   wherein one of a source and a drain of the third transistor is electrically connected to the first wiring, and the other of the source and the drain of the third transistor is electrically connected to a gate of the first transistor,
   wherein one of a source and a drain of the fourth transistor is electrically connected to a gate of the second transistor, and the other of the source and the drain of the fourth transistor is electrically connected to the second wiring, wherein one of a source and a drain of the fifth transistor is electrically connected to one of a source and a drain of the second transistor, wherein one of a source and a drain of the sixth transistor is electrically connected to the one electrode of the light-emitting and light-receiving element, and the other of the source and the drain of the sixth transistor is electrically connected to the gate of the second transistor, wherein one electrode of the capacitor is electrically connected to the gate of the first transistor, and the other electrode of the capacitor is electrically connected to the one of the source and the drain of the first transistor, and wherein the light-emitting and light-receiving element is configured to emit light of a first color and is configured to receive light of a second color.

10. The display device according to claim 9, further comprising a seventh transistor, wherein the seventh transistor is configured to control conduction between the one of the source and the drain of the first transistor and the one electrode of the light-emitting and light-receiving element.

11. The display device according to claim 9, further comprising a third wiring, wherein the other of the source and the drain of the fifth transistor is electrically connected to the third wiring.

12. The display device according to claim 9, wherein the other of the source and the drain of the fifth transistor is electrically connected to the first wiring.

13. The display device according to claim 9, wherein, in a first period, a data potential is supplied to the first wiring, and a first potential is supplied to the second wiring, wherein, in a second period, a second potential is supplied to the second wiring, and wherein the second potential is lower than the first potential.

* * * * *